US012700455B2

(12) United States Patent
Hsu

(10) Patent No.: US 12,700,455 B2
(45) Date of Patent: Aug. 4, 2026

(54) 3D CELL AND ARRAY STRUCTURES

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 181 days.

(21) Appl. No.: 18/424,700

(22) Filed: Jan. 26, 2024

(65) Prior Publication Data

US 2024/0274193 A1 Aug. 15, 2024

Related U.S. Application Data

(60) Provisional application No. 63/447,875, filed on Feb. 23, 2023, provisional application No. 63/446,570, filed on Feb. 17, 2023, provisional application No. 63/446,101, filed on Feb. 16, 2023, provisional application No. 63/445,299, filed on Feb. 14, 2023, provisional application No. 63/444,928, filed on Feb. 11, 2023.

(51) Int. Cl.
| | |
|---|---|
| *G11C 16/04* | (2006.01) |
| *G11C 5/06* | (2006.01) |
| *H10B 41/20* | (2023.01) |
| *H10B 43/20* | (2023.01) |

(52) U.S. Cl.
CPC .......... *G11C 16/0483* (2013.01); *G11C 5/063* (2013.01); *H10B 41/20* (2023.02); *H10B 43/20* (2023.02)

(58) Field of Classification Search
CPC ... G11C 16/0483; G11C 5/063; G11C 7/1006; G11C 11/54; H10B 41/20; H10B 43/20

USPC .......................................................... 365/63
See application file for complete search history.

(56) References Cited

U.S. PATENT DOCUMENTS

2003/0122181 A1* 7/2003 Wu .................... G11C 16/0491
257/315
2018/0350823 A1 12/2018 Or-Bach et al.
(Continued)

OTHER PUBLICATIONS

International Search Report, dated May 23, 2024, for corresponding International Application No. PCT/US2024/013252 (2 pages).
(Continued)

*Primary Examiner* — Fernando Hidalgo
(74) *Attorney, Agent, or Firm* — INTELLECTUAL PROPERTY LAW GROUP LLP

(57) ABSTRACT

Various 3D cells, array structures, and processes are disclosed. In an embodiment, a 3D cell structure includes a NOR-type memory cell array having rows of memory cells, and each memory cell stores data that controls a cell current for that memory cell. The structure also includes bit lines connected to the rows of memory cells, and each bit line is connected to one memory cell in each of row. The cell structure also includes source lines connected to the rows of memory cells, respectively, and each source line is connected to all the memory cells of a corresponding row of memory cells. The structure is configured so that input signals applied to the bit lines cause cell currents to flow through the memory cells, and in each row of memory cells, selected cell currents combine to form a row cell current that flows on the associated source line.

20 Claims, 54 Drawing Sheets

(56)　　　　　　References Cited

U.S. PATENT DOCUMENTS

| | | | |
|---|---|---|---|
| 2020/0026991 | A1 | 1/2020 | Lin et al. |
| 2020/0342938 | A1 | 10/2020 | Tran et al. |
| 2021/0232905 | A1 | 7/2021 | Dalgaty et al. |
| 2021/0366544 | A1 | 11/2021 | Harari |
| 2021/0375381 | A1 | 12/2021 | Wu et al. |
| 2022/0139472 | A1 | 5/2022 | Harari |
| 2023/0027837 | A1 | 1/2023 | Petti et al. |
| 2023/0138695 | A1 | 5/2023 | Kumar et al. |
| 2024/0120009 | A1 * | 4/2024 | Tran ..................... G06N 3/0442 |
| 2024/0153566 | A1 * | 5/2024 | Ezzadeen ............... H10B 41/10 |
| 2024/0242759 | A1 * | 7/2024 | Chen ................... G11C 11/4067 |
| 2024/0419955 | A1 | 12/2024 | Vrudhula et al. |
| 2025/0078881 | A1 | 3/2025 | Huang et al. |

OTHER PUBLICATIONS

Written Opinion of the International Searching Authority, dated May 23, 2024, for corresponding International Application No. PCT/US2024/013252 (7 pages).

International Search Report, dated Sep. 18, 2024, for related International Application No. PCT/US2024/032669 (2 pages).

Written Opinion of the International Searching Authority, dated Sep. 18, 2024, for related International Application No. PCT/US2024/032669 (5 pages).

* cited by examiner

FRONT
GATE
104a

105a
GDL

103

105b
GDL

104b
BACK
GATE

102
FLOATING
BODY

101
BL

3D CELL STRUCTURE

103

105b

104b

102
FLOATING
BODY

101
BL

NOR-TYPE FLASH MEMORY CELL

N- TYPE
CHANEL
152a

104a

105a

103

SL

105b

104b

152b
N- TYPE
CHANEL

102

101
BL

104a

105a

103

105b

104b

102

101

104a

105a

103

105b

104b

109
SEMI

110
INS

101
BL

104a

105a

103

105b

104b

109
SEMI

110
INS

101
BL

FLOATING
ISLAND

104a

105a

103

123
INSL 102     101

INSL
117a

104a

105a

103

105b

104b 102     101     117b
INSL

VBG2 > VBG1

| Gate 104a/b | FB Channel 102 | Gate dielectric layer 105a/b | S/D Electrodes BL101 AND SL103 |
|---|---|---|---|
| W | $SrTiO_3$ | $Sr_3O_4$ | TiN |
| Cr | $MoS_2$ | $Al_2O_3/HfO_2/Al_2O_3$ | — |
| Pt | PEDOT:PSS | $SiO_x/Nafion$ | — |
| Au/Pd | $MoS_2$ | — | — |
| — | $Cu_2S$ | $HfO_2$ | — |
| — | $IGZO/Al_2O_3/TiO_2$ | $SiO_2$ | Al |
| — | $MoS_2/Nb_2O_5$ | $Al_2O_3$ | Au |
| — | $MoS_2/Nb_2O_5$ | $SiO_2$ | $NbSe_2$ |
| — | $MoS_2/ZrO_{2-x}$ | $Al_2O_3$ | — |

3D CELL AND ARRAY STRUCTURES

CROSS-REFERENCE TO RELATED APPLICATIONS

This application claims the benefit of priority under 35 U.S.C. 119(e) based upon U.S. Provisional Patent Application having Application No. 63/444,928 filed on Feb. 11, 2023, and entitled "3D Cell and Array Structures," and U.S. Provisional Patent Application having Application No. 63/445,299 filed on Feb. 14, 2023, and entitled "3D Cell and Array Structures," and U.S. Provisional Patent Application having Application No. 63/446,101 filed on Feb. 16, 2023, and entitled "3D Cell and Array Structures," and U.S. Provisional Patent Application having Application No. 63/446,570 filed on Feb. 17, 2023, and entitled "3D Cell and Array Structures," and U.S. Provisional Patent Application having Application No. 63/447,875 filed on Feb. 23, 2023, and entitled "3D Cell and Array Structures," all of which are incorporated by reference herein in their entireties.

FIELD OF THE INVENTION

The exemplary embodiments of the present invention relate generally to the field of memory, and more specifically to memory cells and array structures and associated processes.

BACKGROUND OF THE INVENTION

With the increasing complexity and density of electronic circuits, memory size, complexity, and cost are important considerations. One approach to increase memory capacity is to use three-dimensional (3D) array structures. The 3D array structure has been successfully used in NAND flash memory today. However, for dynamic random-access memory (DRAM), due to its special one-transistor-one-capacitor (1T1C) cell structure, a cost-effective 3D array structure has not been realized.

SUMMARY

In various exemplary embodiments, three-dimensional (3D) cells, array structures, and associated processes are disclosed. Embodiments of the invention are applicable to many technologies. For example, embodiments of the invention can be applied to dynamic random-access memory (DRAM), floating-body cell (FBC) memory, NOR-type flash memory, Ferroelectric random-access memory (FRAM), resistive random-access memory (RRAM), phase change memory (PCM), magneto-resistive random-access memory (MRAM), memristor-transistor (memtransistor), and split-gate NOR flash memory. Embodiments of the invention can also be used in applications such as in-memory-computing (IMC) and artificial neural networks (ANN), and any other suitable applications not listed.

In an exemplary embodiment, a three-dimensional (3D) array structure is provided that comprises a NOR-type memory cell array comprising one or more rows of memory cells, and each memory cell is configured to store data that controls a cell current for that memory cell. The structure also comprises bit lines connected to the one or more rows of memory cells, and each bit line is connected to one memory cell in each of the one or more rows of memory cells. The structure also comprises one or more source lines connected to the one or more rows of memory cells, respectively, and each source line is connected to all the memory cells of a corresponding row of memory cells. The structure is configured so that input signals applied to the bit lines cause one or more cell currents to flow through one or more memory cells, respectively, and in each row of memory cells, selected cell currents combine to form a row cell current that flows on the source line connected to that row of memory cells.

In an exemplary embodiment, a three-dimensional (3D) array structure is provided that comprises a NOR-type memory cell array comprising one or more rows of memory cells, and each memory cell is configured to store data that controls a cell current for that memory cell. The structure also comprises bit lines connected to the one or more rows of memory cells, and each bit line is connected to one memory cell in each of the one or more rows of memory cells. The structure also comprises one or more source lines connected to the one or more rows of memory cells, respectively, and each source line is connected to all the memory cells of a corresponding row of memory cells. The structure is configured so that input signals applied to the source lines cause one or more cell currents to flow through one or more memory cells, respectively, and for each bit line, selected cell currents combine to form a bit line cell current that flows on that bit line.

In an exemplary embodiment, a three-dimensional (3D) array structure is provided that comprises a NOR-type memory cell array comprising one or more rows of memory cells, and each memory cell is configured to store data that controls a cell current for that memory cell. The structure also comprises bit lines connected to the one or more rows of memory cells, and each bit line is connected to one memory cell in each of the one or more rows of memory cells. The structure also comprises one or more word lines connected to the one or more rows of memory cells, respectively, and each word line is connected to all the memory cells of a corresponding row of memory cells. The structure is configured so that input signals applied to the word lines cause one or more cell currents to flow through one or more memory cells, respectively, and for each bit line, selected cell currents combine to form a bit line cell current that flows on that bit line.

Additional features and benefits of the exemplary embodiments of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Those of ordinary skilled in the art will realize that the following detailed description is illustrative only and is not intended to be in any way limiting. Other embodiments of the present invention will readily suggest themselves to skilled persons having the benefit of this disclosure. Reference will now be made in detail to implementations of the exemplary embodiments of the present invention as illustrated in the accompanying drawings. The same reference indicators or numbers will be used throughout the drawings and the following detailed description to refer to the same or like parts.

In various exemplary embodiments, three-dimensional (3D) cells, array structures, and associated processes are disclosed. Embodiments of the invention are applicable to many technologies. For example, embodiments of the invention can be applied to dynamic random-access memory (DRAM), floating-body cell (FBC) memory, NOR-type flash memory, Ferroelectric random-access memory (FRAM), resistive random-access memory (RRAM), phase change memory (PCM), magneto-resistive random-access memory (MRAM), memristor-transistor (memtransistor), and split-gate NOR flash memory. Embodiments of the invention can also be used in applications such as in-memory-computing (IMC) and artificial neural networks (ANN), and any other suitable applications not listed.

Figure 1A:
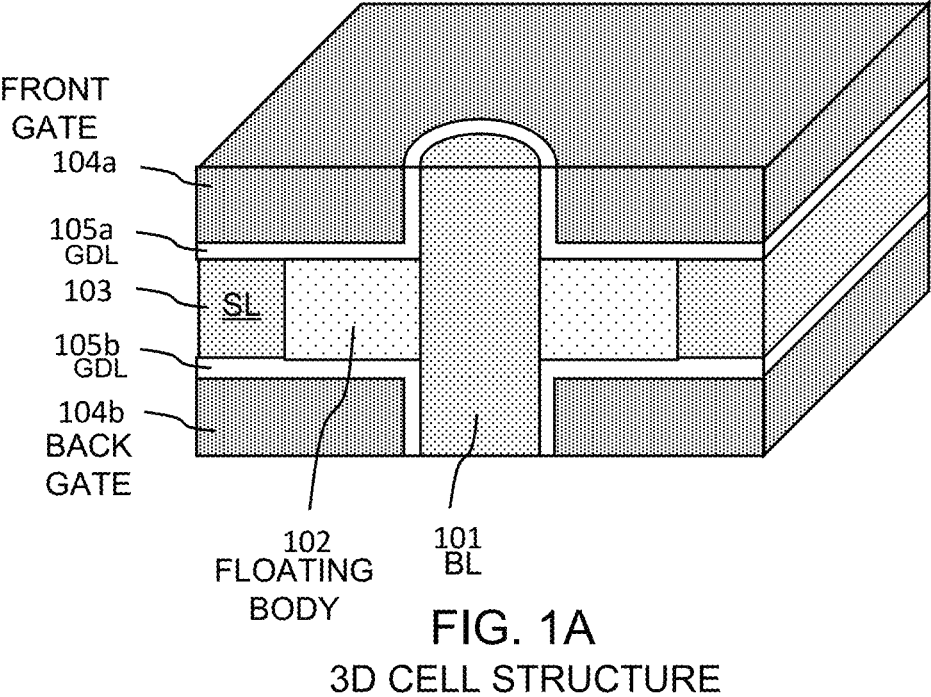
FIG. 1A show an embodiment of a three-dimensional (3D) cell structure according to the invention.

FIG. 1A show an embodiment of a three-dimensional (3D) cell structure according to the invention. In various embodiments, the cell structure is suitable for use as a memory cell or a synapse device (also called a synapse transistor) in neural network applications. The cell structure includes a bit line (BL) 101 comprising semiconductor material such as silicon or polysilicon material. The cell structure also includes a floating body 102 comprising semiconductor material such as silicon, polysilicon, silicon germanium (SiGe), indium gallium zinc oxide (IGZO), or any other suitable semiconductor materials. The cell structure also includes a source line (SL) (or layer) 103 comprising semiconductor material such as silicon or polysilicon material. The cell structure forms a dual-gate transistor that comprises a front gate (FG) 104*a* and a back gate (BG) 104*b*. The front gate 104*a* and the back gate 104*b* are formed of conductor material such as metal or polysilicon material. In one application, the front gate 104*a* and back gate 104*b* can be connected to word lines (WL) not shown.

The cell structure also includes gate dielectric layers (GDL) 105*a* and 105*b* that can be formed from many suitable materials. In various embodiments, each of the gate dielectric layers 105*a* and 105*b* are formed as a single-layer or multiple-layer structure. In one embodiment, the gate dielectric layers 105*a* and 105*b* comprise a thin oxide (SiO2) layer or high-K material, such as a hafnium oxide (HfO2) layer, to form a floating body cell that is also referred to as a capacitor-less dynamic random-access memory (DRAM) cell.

Figure 1B:
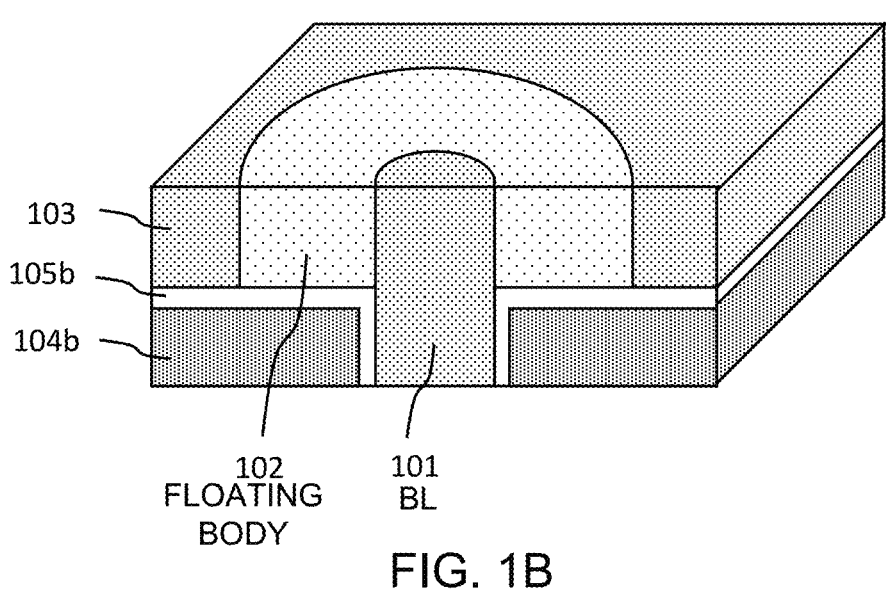
FIG. 1B shows the 3D cell structure shown in FIG. 1A with a front gate and a gate dielectric layer removed.

FIG. 1B shows the 3D cell structure shown in FIG. 1A with the front gate 104*a* and the gate dielectric layer 105*a* removed to show the inner structure of the cell. In one embodiment, the floating body 102 is formed as a donut shape as shown. Although this embodiment shows that the shapes of the bit line 101 and floating body 102 are circular, the bit line 101 and floating body 102 can be formed in other patterns or shapes, such as square, rectangular, triangular, hexagonal, etc. These variations are within the scope of the invention.

In various embodiments, the bit line 101, floating body 102, and source line 103 are formed of various materials to form different types of cells. For example, in one embodiment, the bit line 101 and source line 103 are formed of N+ type semiconductor material and the floating body 102 is formed of P– type semiconductor material. This configuration forms an N-channel junction transistor. In another embodiment, the bit line 101 and source line 103 are formed of P+ type semiconductor material and the floating body 102 is formed of N– type of semiconductor material. This configuration forms a P-channel transistor.

In another embodiment, the bit line 101 and source line 103 are formed of N+ type semiconductor material and the floating body 102 is formed of N+ or N– type semiconductor material. This configuration forms an N-channel junction-less transistor. In another embodiment, the bit line 101 and source line 103 are formed of P+ type semiconductor and the floating body 102 is formed of P+ or P– type semiconductor material. This configuration forms a P-channel junction-less transistor.

In another embodiment, the bit line 101 is formed of N+ type semiconductor material and the source line 103 is formed of P+ type semiconductor material. The floating body 102 is formed of intrinsic or lightly doped P– or N– type semiconductor material. This configuration forms a tunnel field-effect transistor (T-FET).

In another embodiment, the bit line 101 and source line 103 are formed of metal and the floating body 102 is formed of P-type or N-type semiconductor material. This configuration forms a tunnel Schottky junction transistor.

According to the invention, any suitable thickness can be used for the floating body 102. Depending on the thickness of the floating body 102, the cell forms different type of channels, as shown in FIGS. 1E-F.

Figure 1C:
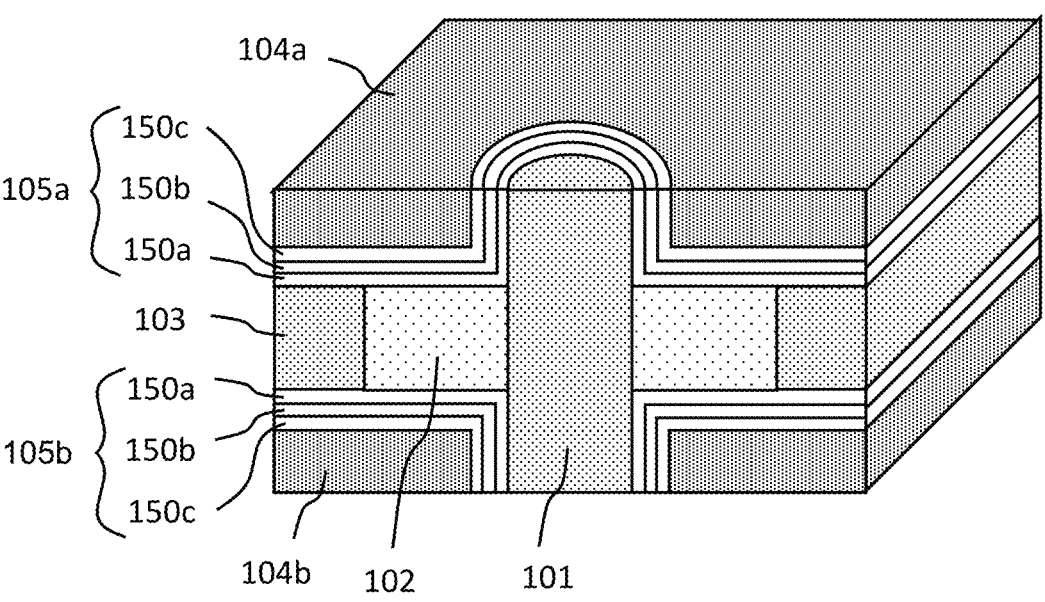
FIG. 1C shows a cell structure that is similar to the cell structure shown in FIG. 1A.

FIG. 1C shows a cell structure that is similar to the cell structure shown in FIG. 1A except that the gate dielectric layers 105*a* and 105*b* are formed by charge-trapping layers. In one embodiment, the charge-trapping layers comprise oxide-nitride-oxide (ONO) layers. The layer 150*a* is a tunnel oxide layer, which is thin enough to allow electrons to tunnel through when a high electric field is applied. The layer 150*b* is a nitride layer that traps electrons for data storage, and the layer 150*c* is a blocking oxide, which is thick enough to prevent electrons from tunneling through to gates 104*a* and 104*b*. The cell structure shown in FIG. 1C forms a non-volatile memory cell, such as a NOR-type flash memory cell.

In another embodiment, the tunnel oxide layer 150*a* shown in FIG. 1C is eliminated. Thus, the charge-trapping layers 105*a* and 105*b* will only comprise a nitride layer 150*b* and a blocking oxide layer 150*c*. This embodiment reduces the required voltage for programing and erasing the cell.

Figure 1D:
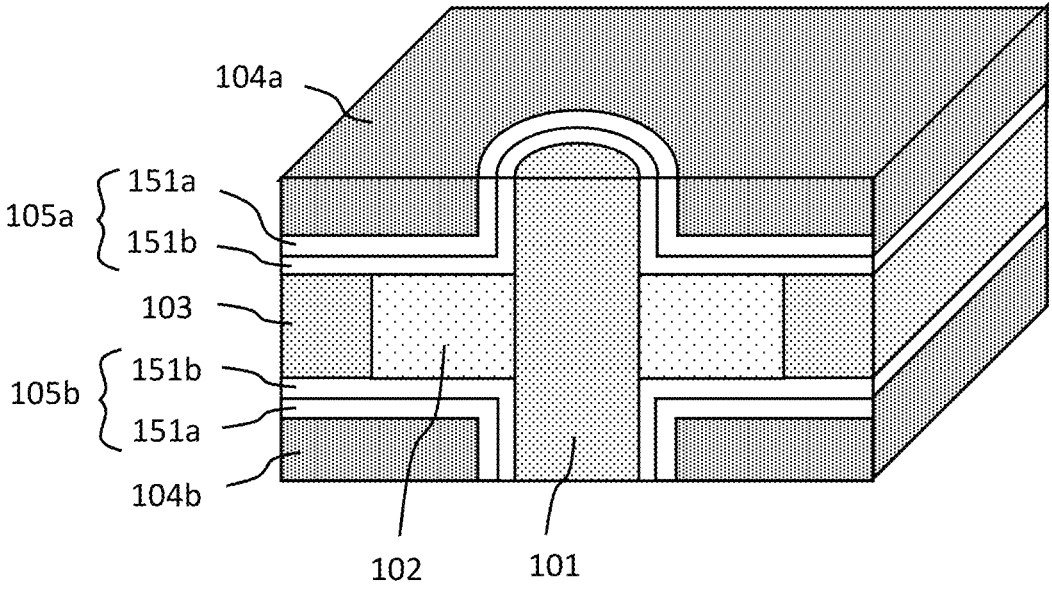
FIG. 1D shows a cell structure similar to the cell structure shown in FIG. 1A.
Figure 1E:
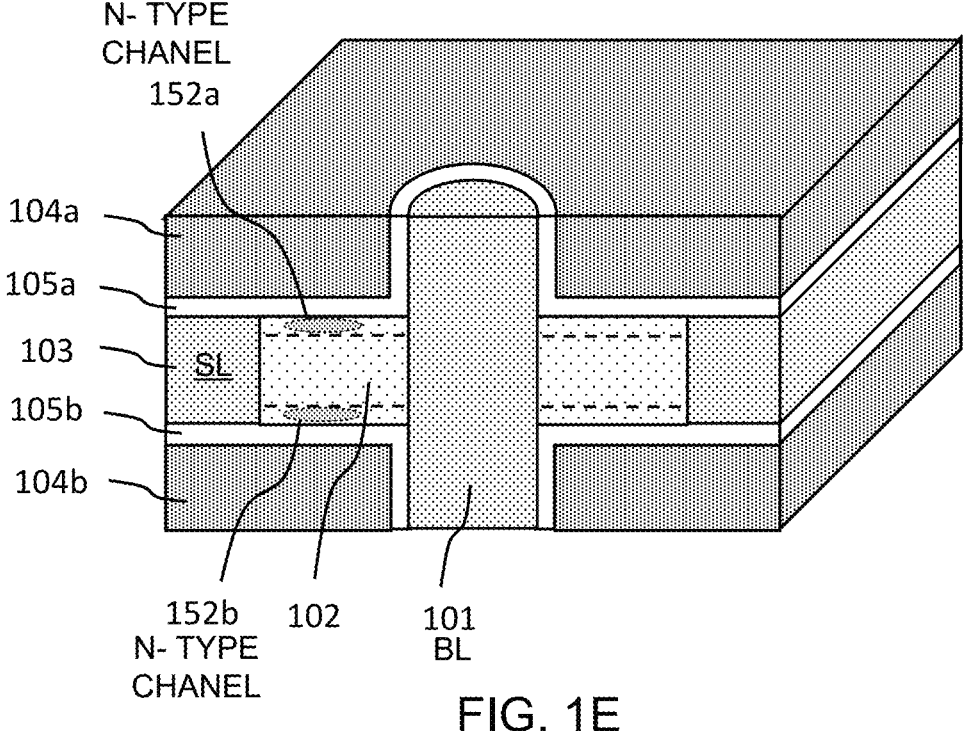
FIG. 1E shows an embodiment of a cell structure in which a floating body is thicker and lightly doped compared to previous embodiments.
Figure 1F:
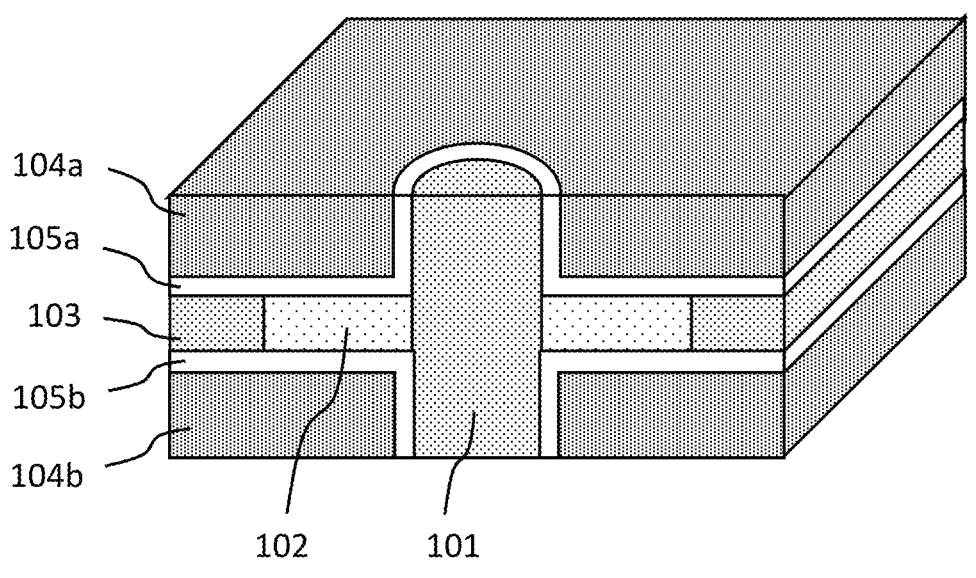
FIG. 1F shows an embodiment of a cell structure in which a floating body is thinner and heavily doped compared to previous embodiments.

FIG. 1D shows a cell structure similar to the cell structure shown in FIG. 1A except that the gate dielectric layers 105*a* and 105*b* are formed by at least one ferroelectric layer 151*a* comprising material such as lead zirconate titanate (PZT), fluorite-structured oxide such as hafnium oxide (HfO2) and zirconium oxide (ZrO2), hafnium oxide (HfO2) in ortho-rhombic crystal phase, or hafnium zirconium oxide (HfZrO2), and one dielectric layer 151*b* (or called an interfacial layer) comprising material such as SiO2, HfO2, Al2O3, SINX, SION, AION, ZrO2, and TiO2. The cell structure shown in FIG. 1D forms a ferroelectric random-access memory (FRAM) cell.

In another embodiment, the gate dielectric layers 105*a* and 105*b* comprise at least one adjustable resistive layer, such as hafnium oxide (HfOx), titanium oxide (TiOx), and tantalum oxide (TaOx) to form a resistive random-access memory (RRAM) cell. In one embodiment, the layer 151*a* is the above-mentioned adjustable resistive layer and the layer 151*b* is an insulating layer such as oxide or high-K material such as hafnium oxide (SiO2) layer.

In another embodiment, the gate dielectric layers 105*a* and 105*b* comprise at least one phase-change layer, such as Germanium Antimony Tellurium alloy or chalcogenide glass, Ge2Sb2Te5 (GST) to form a phase-change memory (PCM) cell. In one embodiment, the layer 151*a* is the above-mentioned phase-change layer and the layer 151*b* is an insulating layer such as oxide or high-K material such as hafnium oxide (SiO2) layer.

In another embodiment, the gate dielectric layers 105*a* and 105*b* comprise at least one ferromagnetic material, such as iron-nickel (NiFe) or iron-cobalt (CoFe) alloys to form a magneto-resistive random-access memory (MRAM) cell. In one embodiment, the layer 151*a* is the above-mentioned ferromagnetic layer and the layer 151*b* is an insulating layer such as oxide or high-K material such as hafnium oxide (SiO2) layer.

It should be noted that the above-described materials forming the gate dielectric layers 105*a* and 105*b* are exemplary. The use of any other suitable materials to form the gate dielectric layers 105*a* and 105*b* are within the scope of the invention.

FIG. 1E shows an embodiment of a cell structure in which the floating body 102 is thicker and lightly doped compared to the cell embodiment shown in FIG. 1F. Using an N-channel cell for example, when a positive voltage is applied to the gates 104*a* and 104*b*, the applied voltage pushes away holes and attract electrons to form N– type channels 152*a* and 152*b* in the surface of the floating body 102 as shown. The channels 152*a* and 152*b* allow electrons to flow between the bit line 101 and the source line 103 for read and write operation. During storage, the gates 104*a* and 104*b* are supplied with a negative voltage. This will attract holes in the channel regions 152*a* and 152*b* to increase data retention time.

FIG. 1F shows an embodiment of a cell structure in which the floating body 102 is thinner compared to previous embodiments. In this configuration, the thin floating body 102 itself is used as the channel, which forms a thin-film transistor. The thin body increases the controllability of the gates 104a and 104b to the channels. This enhances the cell's performance and increase the data retention time. The thin body also reduces the short-channel effect and reduce the gate-induced drain leakage (GIDL) current.

It should be noted that the thicknesses of the cell structures shown in FIGS. 1E-F depend on many factors, such as the gate voltage, doping concentration, and the materials that form the floating body, gate, and gate dielectric layer. In one application, the proper thickness of the floating body 102 can be determined by using device simulations.

Figure 1G:
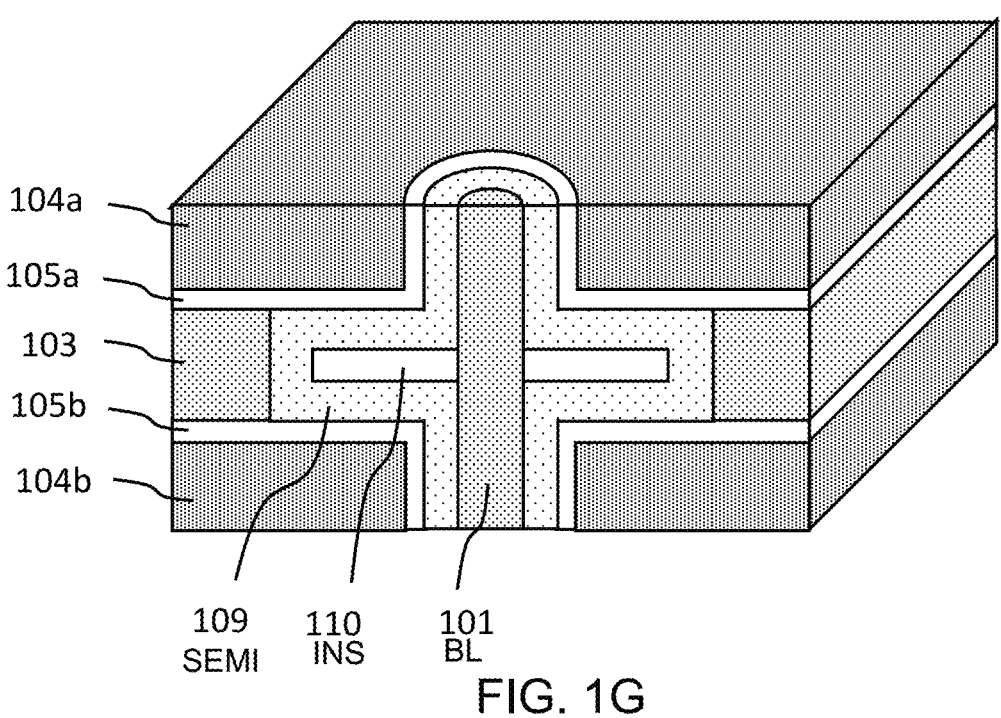
FIGS. 1G-P show embodiments of cell structures according to the invention.

FIG. 1G shows an embodiment of a cell structure according to the invention. This embodiment is similar to the embodiment shown in FIG. 1A except that the channel of the cell transistor is formed using a thin semiconductor layer (SEMI) 109 comprising material such as silicon, polysilicon, silicon germanium (SiGe), indium gallium zinc oxide (IGZO), or any other suitable semiconductor materials. Depending on the material, the semiconductor layer 109 is formed by using epitaxial growth, thin-film deposition, atomic layer deposition, or any other suitable process. The bit line 101 is formed of conductor material such as metal or heavily doped polysilicon material. The cell structure also includes an insulator (INS) 110 comprising material such as oxide or nitride material, or an air gap, or a vacuum space.

Figure 1H:
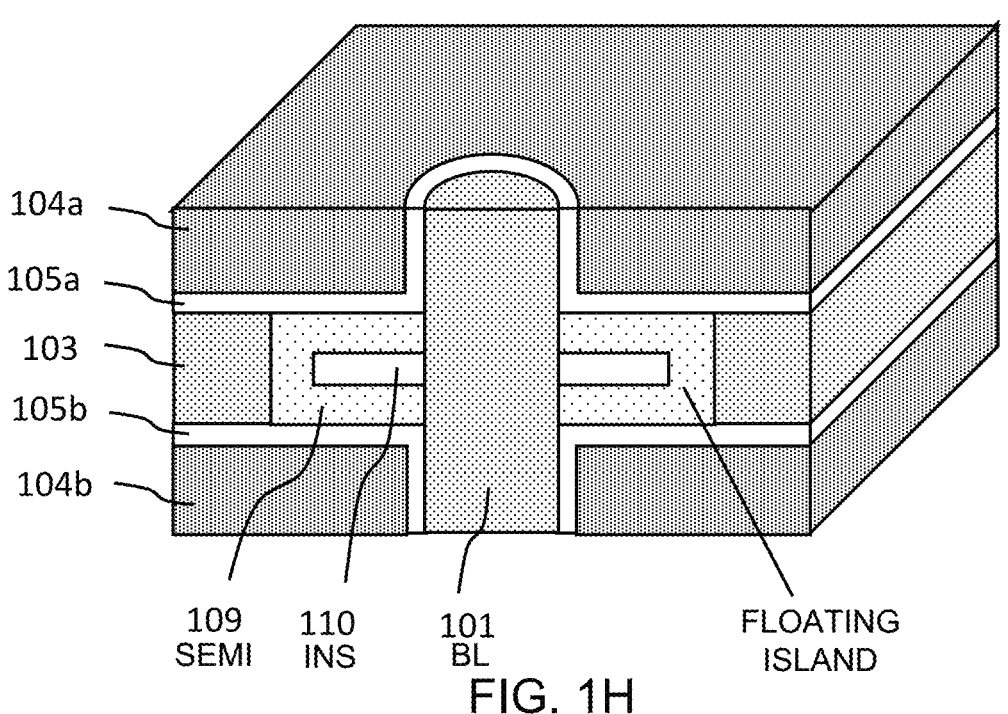

FIG. 1H shows an embodiment of a cell structure according to the invention. This embodiment is similar to the embodiment shown in FIG. 1G except that portions of the semiconductor layer 109 on the sidewall of the vertical bit line 101 are removed. Therefore, the semiconductor layer 109 forms a floating island for each cell. The portions of the semiconductor layer 109 that were located on the sidewall of the vertical bit line 101 are removed by using an anisotropic etching process, such as dry etching, before the material of the bit line 101 is deposited.

Figure 1I:
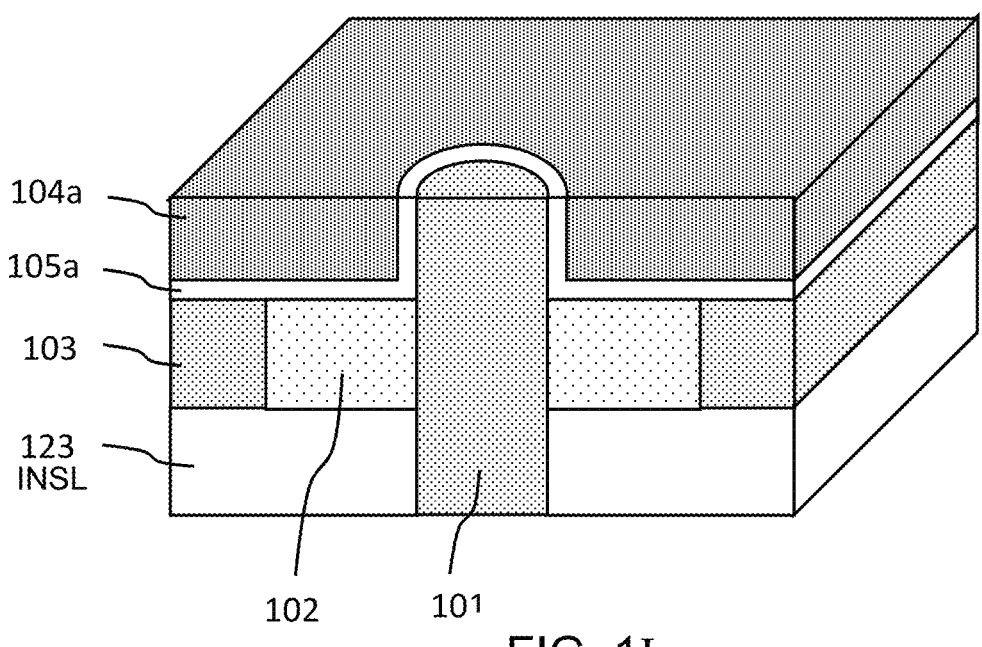

FIG. 1I shows an embodiment of a cell structure according to the invention. This embodiment is similar to the embodiment shown in FIG. 1A except that the back gate 104b shown in FIG. 1A is replaced with an insulating layer (INSL) 123 comprising material such as oxide or nitride material. As a result, this cell structure forms a single-gate transistor cell.

Figure 1J:
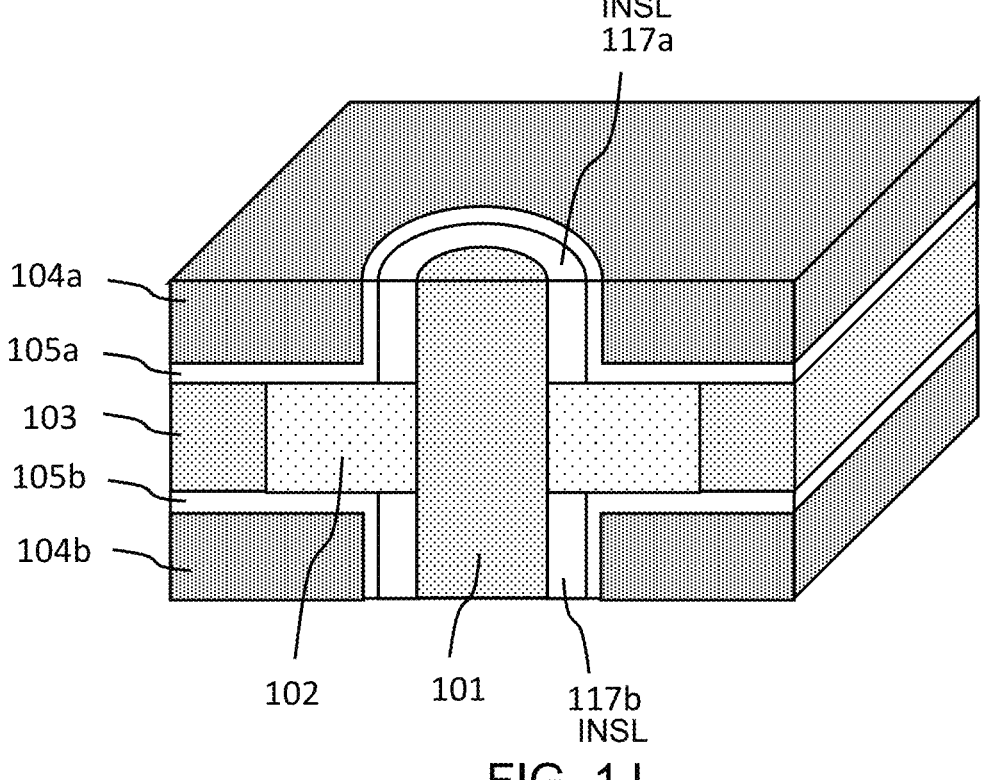

FIG. 1J shows an embodiment of a cell structure according to the invention. This embodiment is similar to the embodiment shown in FIG. 1A except that additional insulating layers 117a and 117b comprising material such as oxide or nitride material are formed on portions of the bit line 101 to reduce the parasitic capacitance of the bit line 101 and the capacitance-coupling between the bit line 101 and the gates 104a and 104b. The structures shown in FIGS. 1I-J can be applied to all the other cell embodiments shown in FIGS. 1A-7B.

Figure 1K:
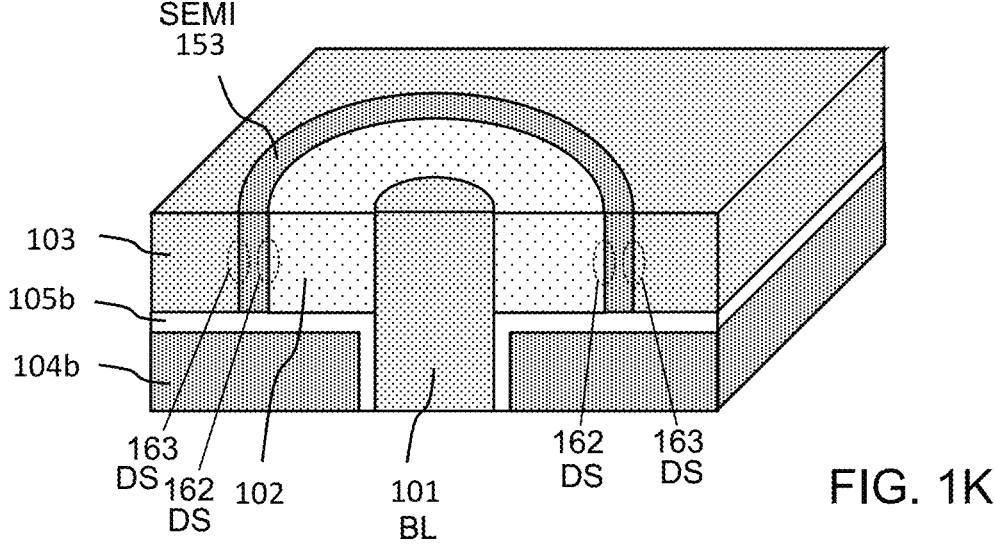

FIG. 1K shows an embodiment of a cell structure according to the invention. For case of description and clarity, the front gate 104a and the gate dielectric layer 105a are removed to show the inner structure of the cell. This embodiment is similar to the embodiment shown in FIGS. 1A-B except that a diode structure (DS) 162 is formed between the source line 103 and the floating body 102. This structure prevents the bit line 101 voltage from leaking to the source line 103 during program operations.

As an example, it will be assumed the cell structure in FIG. 1K forms an N-channel cell to describe program operations. When the gate 104b is supplied with a positive voltage, the selected bit line 101 is supplied with a low voltage for programing, and the other unselected bit lines are supplied with a high voltage to inhibit the programming. The source line 103 is supplied with a voltage equal to or higher than the unselected bit line voltage to turn off the diode structure 162. This configuration prevents current leakage between the selected bit line 101 and the unselected bit lines through the source line 103.

Referring again to FIG. 1K, in one embodiment, a semiconductor layer 153 comprising material such as silicon or polysilicon material is formed between the source line 103 and the floating body 102. The semiconductor layer 153 is formed by using a diffusion, epitaxial growth, or polysilicon deposition process. In one embodiment, the semiconductor layer 153 has the opposite type of heavy doping as the floating body 102. For example, in one embodiment, if the floating body 102 has P− type doping, the semiconductor layer 153 has N+ type doping. This forms a diode structure 162 between the floating body 102 and the semiconductor layer 153. The source line 103 is formed of conductor material such as metal or polysilicon material with the same type of heavy doping as the semiconductor layer 153.

In another embodiment, the semiconductor layer 153 has the same type of heavy doping as the floating body 102, and the source line 103 is formed of the opposite type of heavily doped semiconductor material such as polysilicon material. For example, in one embodiment, the semiconductor layer 153 is formed of P+ type of silicon or polysilicon material, and the source line 103 is formed of N+ type of polysilicon material. This configuration forms a diode structure 163 between the semiconductor layer 153 and the source line 103.

Figure 1L:
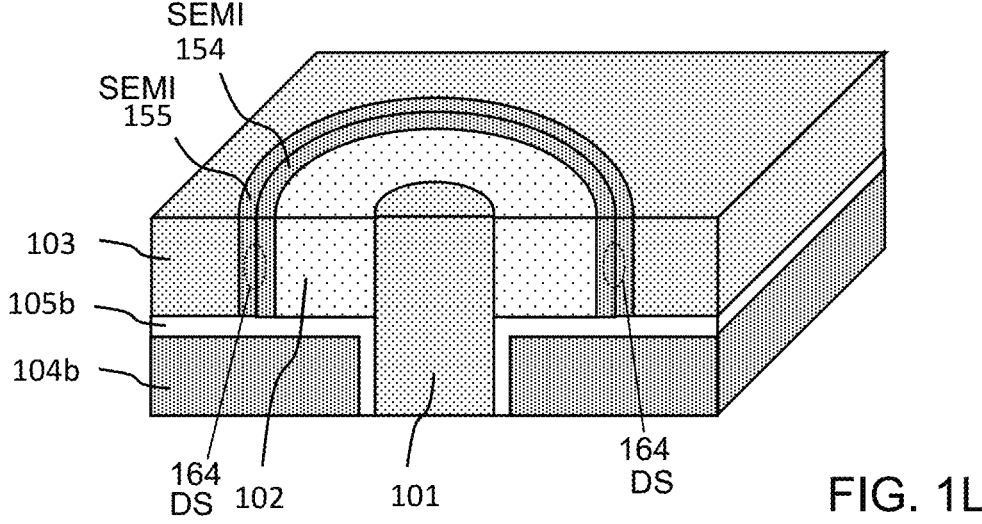

FIG. 1L shows an embodiment of a cell structure according to the invention. In this embodiment, a diode structure 164 between the source line 103 and the floating body 102 is formed by two semiconductor layers 154 and 155 comprising material such as silicon or polysilicon material.

In one embodiment, the semiconductor layer 154 has the same type of heavy doping as the floating body 102, and the semiconductor layer 155 has the opposite type of heavy doping from the floating body 102. For example, in one embodiment, the floating body 102 has P− type doping, the semiconductor layers 154 and 155 have P+ and N+ type doping, respectively. This forms a diode structure 164 shown in FIG. 1L between the semiconductor layers 154 and 155. The source line 103 is formed of conductor material such as metal or polysilicon material having the same type of heavy doping as the semiconductor layer 155.

Figure 1M:
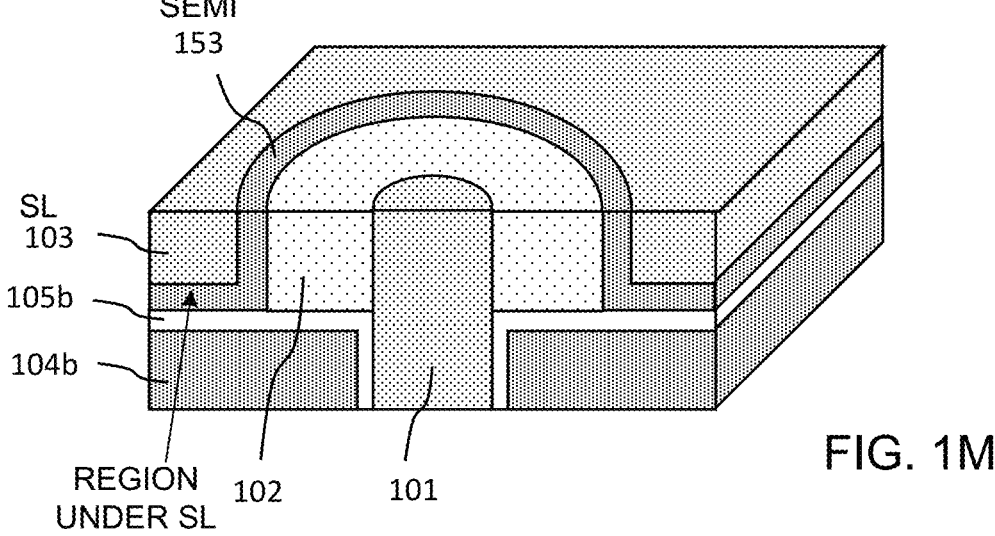

FIG. 1M shows an embodiment of a cell structure according to the invention. This embodiment is similar to the embodiment shown in FIG. 1K except that in this embodiment, the semiconductor layer 153 is formed to have the shape as shown that extends underneath the SL 103.

Figure 1N:
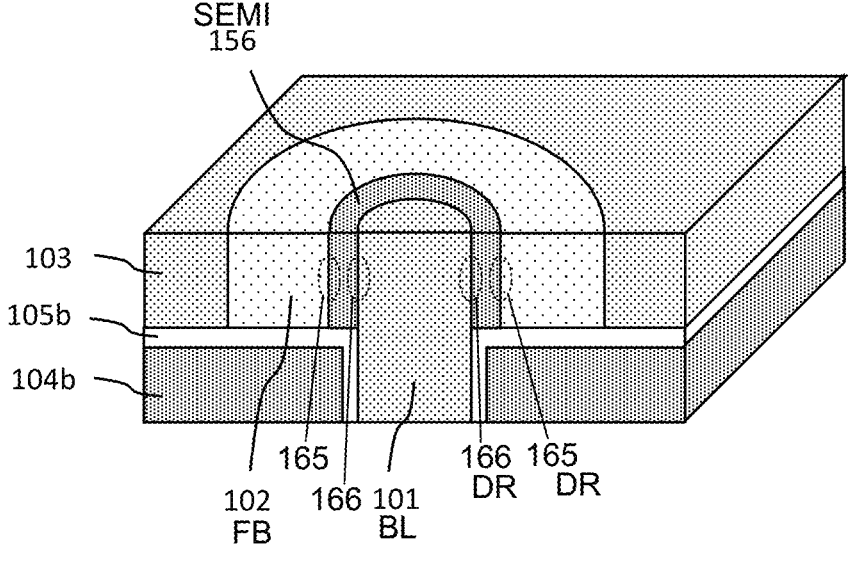
Figure 1O:
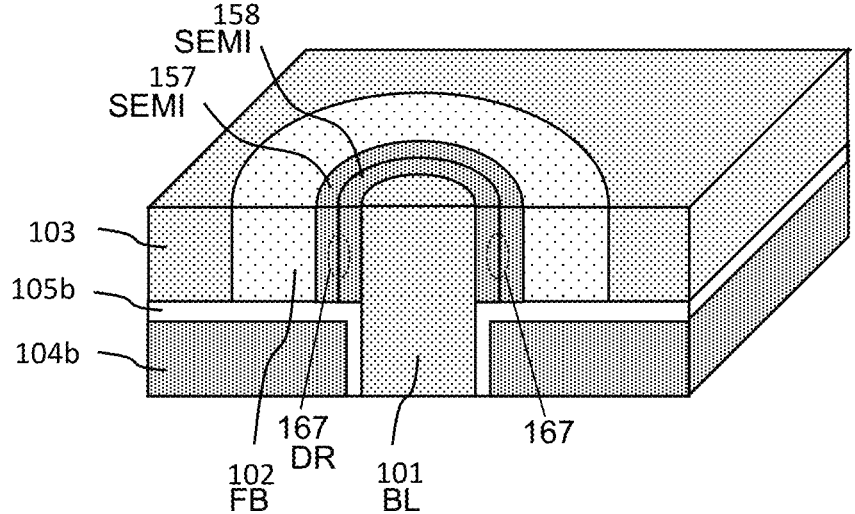
Figure 1P:
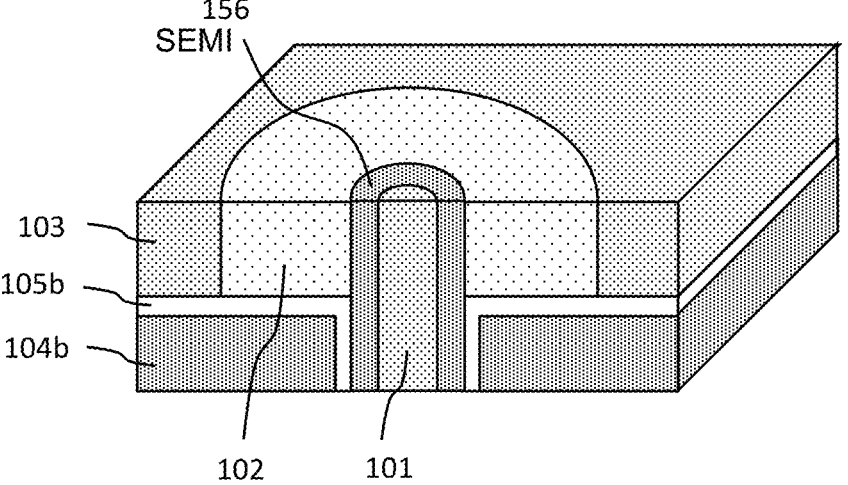

FIGS. 1N-P show embodiments of cell structures according to the invention. In these embodiments, a diode structure is formed between the bit line 101 and the floating body 102.

FIG. 1N shows an embodiment of a cell structure in which a semiconductor layer 156 comprising material such as silicon or polysilicon material is formed between the bit line 101 and the floating body (FB) 102. The semiconductor layer 156 is formed by using a diffusion, epitaxial growth, or polysilicon deposition process. In one embodiment, the semiconductor layer 156 has the opposite type of heavy doping as the floating body 102. For example, in one embodiment, if the floating body 102 has P− type doping, the semiconductor layer 156 has N+ type doping. This forms a diode structure (DS) 165 between the floating body 102 and the semiconductor layer 156. The bit line 101 is formed of conductor material such as metal or polysilicon material with the same type of heavy doping as the semiconductor layer 156.

In another embodiment, the semiconductor layer 156 has the same type of heavy doping as the floating body 102, and the bit line 101 is formed of the opposite type of heavily doped semiconductor material such as polysilicon material. For example, in one embodiment, the semiconductor layer 156 is formed of P+ type silicon or polysilicon and the bit line 101 is formed of N+ type polysilicon. This configuration forms a diode structure 166 between the semiconductor layer 153 and the bit line 101.

FIG. 1O shows an embodiment of a cell structure according to the invention. In this embodiment, a diode structure 167 between the bit line 101 and the floating body 102 is formed by two semiconductor layers 157 and 158 comprising material such as silicon or polysilicon material. In one embodiment, the semiconductor layer 157 has the same type of heavy doping as the floating body 102, and the semiconductor layer 158 has the opposite type of heavy doping as the floating body 102. For example, in one embodiment, if the floating body 102 has P− type doping, the semiconductor layers 157 and 158 have P+ and N+ type doping, respectively. This forms a diode between the semiconductor layers 157 and 158. The bit line 101 is formed of conductor material such as metal or polysilicon material with the same type of heavy doping as the semiconductor layer 158.

FIG. 1P shows an embodiment of a cell structure according to the invention. In this embodiment, the semiconductor layer 156 is formed to have the pattern or shape shown in FIG. 1P.

In another embodiment, the cell structures shown in FIG. 1A and FIG. 1I are formed as four-terminal and three-terminal memristor-transistors, respectively, also called 'memtransistor'. In this embodiment, the floating body 102 of the cell is formed of 'memristor' material. The resistance of the memristor is modulated through the formation or rupture of conductive filaments in the memristor. The conductive filaments are formed by the migration of dopants, ions, or defects. The memristor materials are sometimes called 'synapse' materials or 'phase-change' materials.

There are many memristor materials, such as MoS2, ReSe2, ZrO2, GaSe, WSe2, WO3-x, SrTiO3, TiO2, MoTe2, Ta2O5, VO2, VSiOx, Cu2S, In2Se3, C22H14 (Pentacene), indium gallium zinc oxide (IGZO), Graphene, Carbon nanotube, van der Waals (vdW) materials such as WSe2-NbSe2, Nb2O5-WSe2-NbSe2 layers, or combinations of any of these materials. The gate dielectric layers 105a and 105b are formed of SiO2, HfO2, Al2O3, TiO2, Nb2O5, VSiOx, or a combination of any of these materials. The gates 104a and 104b are formed of suitable metal material such as W, Cr, Pt, Au, Pd, and many others.

It should be noted that the materials listed above for the memristor floating body 102, the gate dielectric layers 105a and 105b, and the gates 104a and 104b are exemplary. It would be very difficult to list all possible suitable materials. However, using any other suitable memristor materials are within the scope of the invention.

Figure 2A:
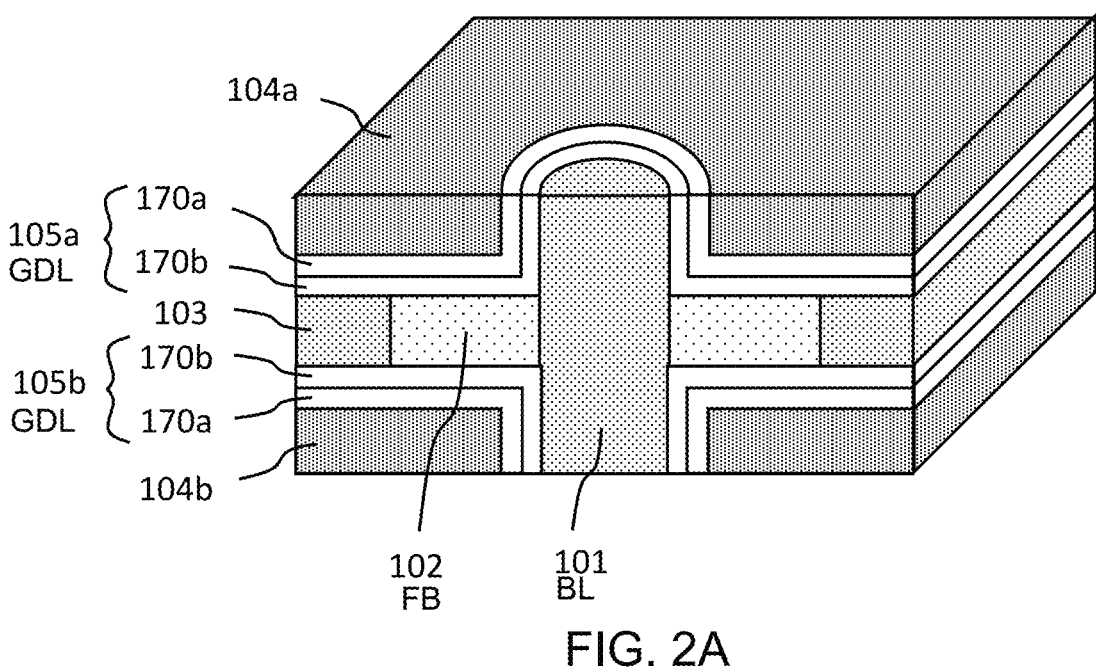
FIG. 2A shows an embodiment of a memristor-transistor cell structure according to the invention.

FIG. 2A shows an embodiment of a memristor-transistor cell structure according to the invention. This embodiment has a thin floating body 102 that is used as the channel of the cell similar to that described in FIG. 1F. The gate dielectric layers 105a and 105b comprises multiple layers such as layers 170a and 170b. In one embodiment, the thin floating body 102 is formed of WSe2, and the gate dielectric layers 170a and 170b are formed of SiO2 and Nb2O5, respectively.

In another embodiment, the thin floating body 102 is formed of MoS2, and the gate dielectric layers 170a and 170b are formed of Al2O3 and ZrO2-x, respectively. In another embodiment, the thin floating body 102 is formed of MoS2, and the gate dielectric layers 170a and 170b are formed of Al2O3 and Nb2O5, respectively. In another embodiment, the thin floating body 102 is formed of SrTiO3, and the gate dielectric layers 170a and 170b are formed of SiO2 and Si3N4, respectively.

Figure 2B:
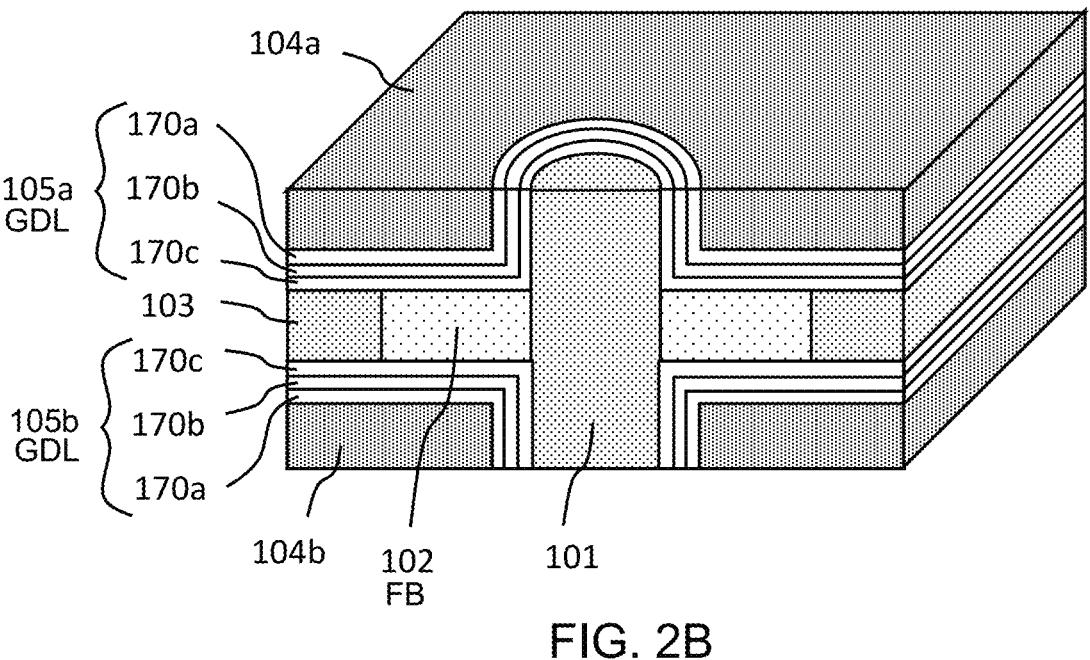
FIG. 2B shows an embodiment of a cell structure according to the invention.

FIG. 2B shows an embodiment of a cell structure according to the invention. In this embodiment, the gate dielectric layers 105a and 105b comprise three layers 170a to 170c. The thin floating body 102 is formed of indium gallium zinc oxide (IGZO), and the gate dielectric layers (170a), (170b), and (170c) are formed of SiO2, TiO2, and Al2O3, respectively.

This cell structure combines the functions of a transistor and a memristor. The transistor can have dual gates as shown in FIG. 1A or a single gate as shown in FIG. 1I. The gate(s) modulate the formation and rupture of the conductive filament in the memristor material of the floating body 102. When the conductive filament is formed, it reduces the resistance between the bit line 101 and the source line 103, thus the cell becomes an on-cell. When the conductive filament is ruptured, it increases the resistance between bit line 101 and the source line 103, thus the cell becomes an off-cell.

Depending on the switching mechanisms, the behaviors of the memristor can be bipolar, unipolar, threshold, diffusive, or complementary resistive switching.

Figure 2C:
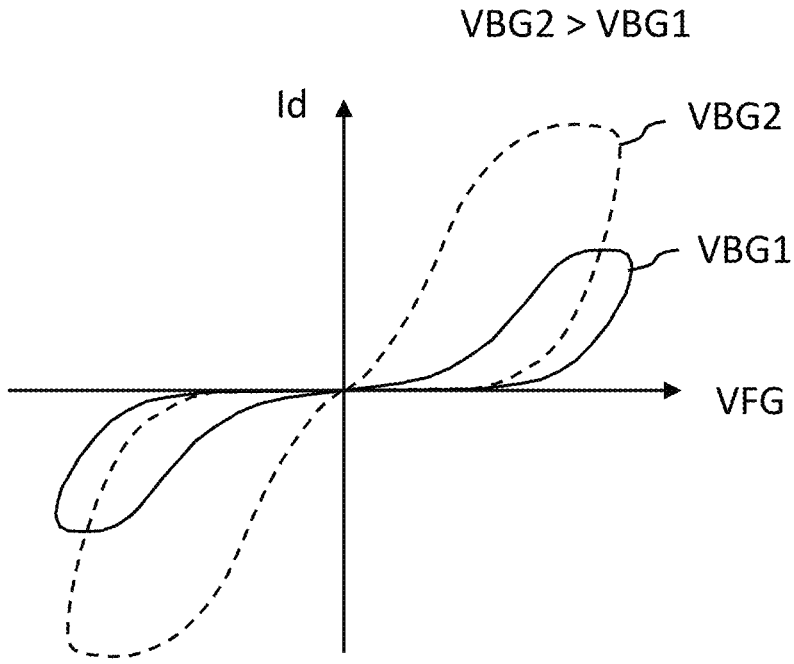
FIGS. 2C-E show examples of switching behaviors of a four-terminal memristor-transistor.
Figure 2D:
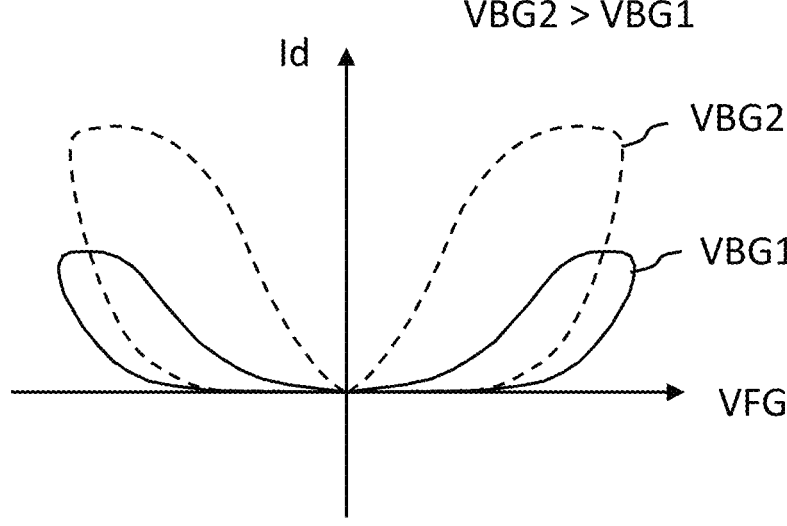
Figures 2E, 2F:
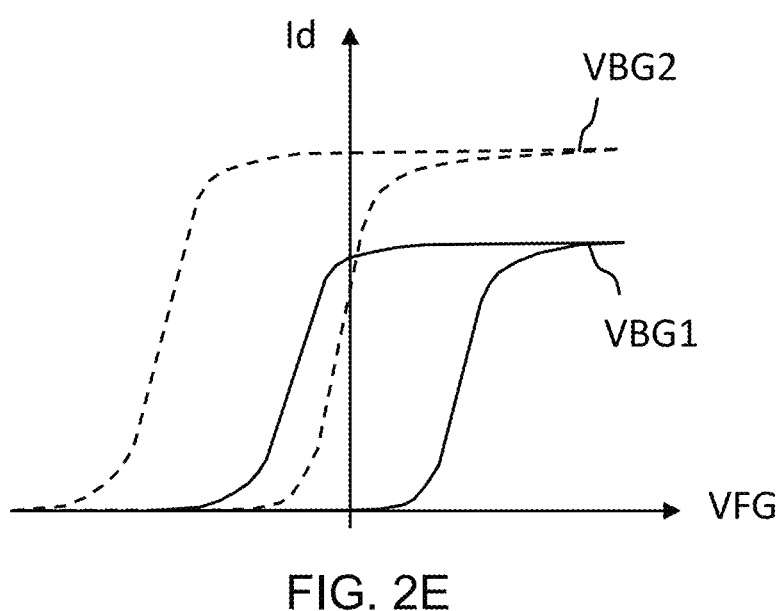
FIG. 2F shows a table that illustrates some exemplary materials for embodiments of a memristor-transistor cell according to the invention.

FIGS. 2C-E show examples of switching behaviors of a four-terminal memristor-transistor, such as the one shown in FIG. 1A. FIGS. 2C-D shows a bipolar switching mechanism. FIG. 2E shows a unipolar switching mechanism in which VFG, VBG, and Id stand for front gate voltage, back gate voltage, and drain current, respectively.

For some memristors, such as VO2 or SrTiO3 memristors, the resistance of the memristor is modulated by modifying the Schottky barriers at the contacts. For example, in one embodiment, the floating body 102 is formed of VO2 and the bit line 101 and the source line 103 are formed of TiN. When the front gate 104a is supplied with a low voltage and the bit line 101 and the source line 103 are applied with a high voltage, the floating body 102 is depleted of V2+O and causes the contacts to be Schottky. Therefore, the cell is in a high-resistance state. When the front gate 104a is supplied with a low voltage and the bit line 101 and the source line 103 are supplied with a high voltage, the floating body 102 is saturated with V2+O and causes the contacts to be ohmic.

FIG. 2F shows a table that illustrates some exemplary materials for embodiments of the memristor-transistor cell according to the invention. The table shows the materials for the gates 104a and 104b, the floating body 102, the gate dielectric layers such as layers 105a and 105b, and the source/drain electrodes such as the bit line 101 and the source line 103 shown in FIGS. 1A-B. The source and drain electrodes are the conductors used to form the source line 103 and bit line 101, respectively. It should be noted that some materials in the table are unspecified and shown by the symbol '-'. These unspecified materials comprise any suitable materials. For the gate and source/drain electrodes (e.g., BL 101 and SL 103), the suitable material may be conductor material such as metal or heavily doped polysilicon material. For the gate dielectric layer (e.g., GDL 105a/b), the suitable material may be insulator material such as oxide (SiO2) or high-K material such as silicon hafnium (HfO2). The materials described in FIG. 2F are exemplary and not limiting. It is virtually impossible to list all the possible materials. Using any other memristor materials is within the scope of the invention.

FIGS. 3A-7B show embodiments of cell structures according to the invention. In these embodiments, the gate dielectric layers 105a and 105b can be formed using any of the materials described with reference to FIGS. 1A-D. However, for simplicity, an embodiment using charge-trapping layers, such as oxide-nitride-oxide (ONO) layers, will be used as an example in the following description. It should be noted that using any other materials including but not limited to those materials described in FIGS. 1A-D is within the scope of the invention.

Figure 3A:
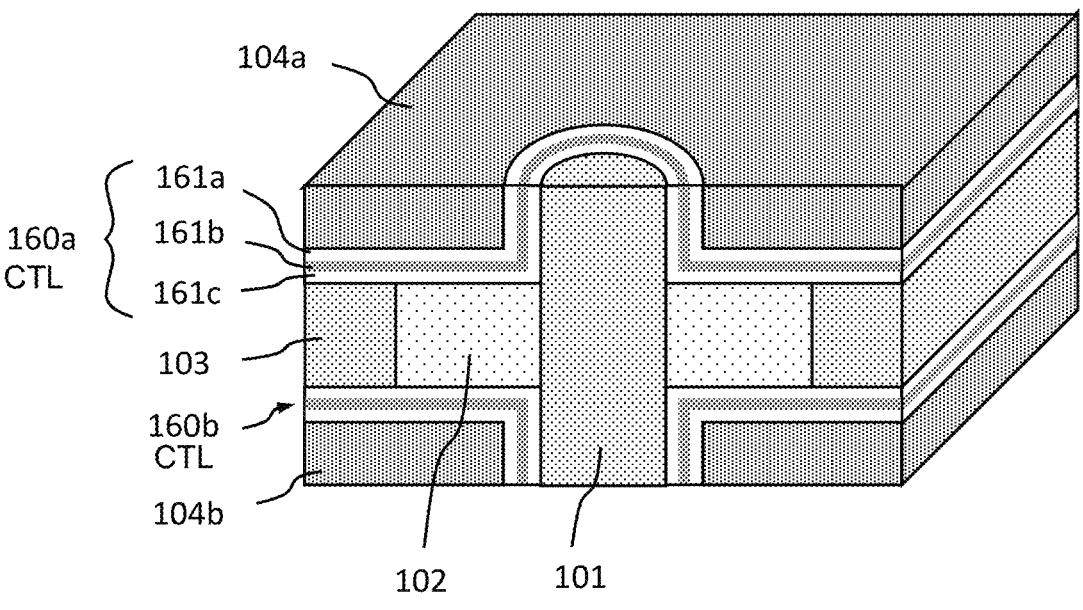
FIGS. 3A-7B show embodiments of cell structures according to the invention.

FIG. 3A shows an embodiment of a cell structure according to the invention. This embodiment is similar to the embodiment shown in FIG. 1A except that the gate dielectric layers 105a and 105b are replaced with memory material layers such as charge-trapping layers (CTL) 160a and 160b. It should be noted that for clarity and ease of description, the layers of the charge-trapping layers 160b are not shown in detail, but in various embodiments these layers are the same as the charge-trapping layers 160a.

In one embodiment, the charge-trapping layers 160a and 160b comprise multiple layers 161a to 161c such as oxide-nitride-oxide (ONO) layers. In one embodiment, the oxide layer 161a is a tunnel oxide layer, which is thin enough to allow electrons to tunnel through when a high electric field is applied. In one embodiment, the nitride layer 161b traps electrons for data storage. In one embodiment the oxide layer 161c is a blocking oxide which is thick enough to prevent electrons from tunneling through to the gates 104a and 104b. In another embodiment, the oxide layer 161c is a tunnel oxide layer and the oxide layer 161a is a blocking oxide layer. In this embodiment, during programming, electrons are injected from the selected gates 104a or 104b to the nitride layer 161b.

Although the ONO layers 161a to 161c are used as an example implementation for the charge-trapping layers 160a and 160b, in other embodiments, the charge-trapping layers 160a and 160b comprise any suitable number of oxide layers and nitride layers. For example, in another embodiment, the charge-trapping layers 160a and 160b comprise oxide-nitride-oxide-nitride-oxide (ONONO) layers. In another embodiment, the charge-trapping layers 160a and 160b comprise only one oxide layer and one nitride layer (e.g., O—N) layers. These variations are within the scope of the invention.

Figure 3B:
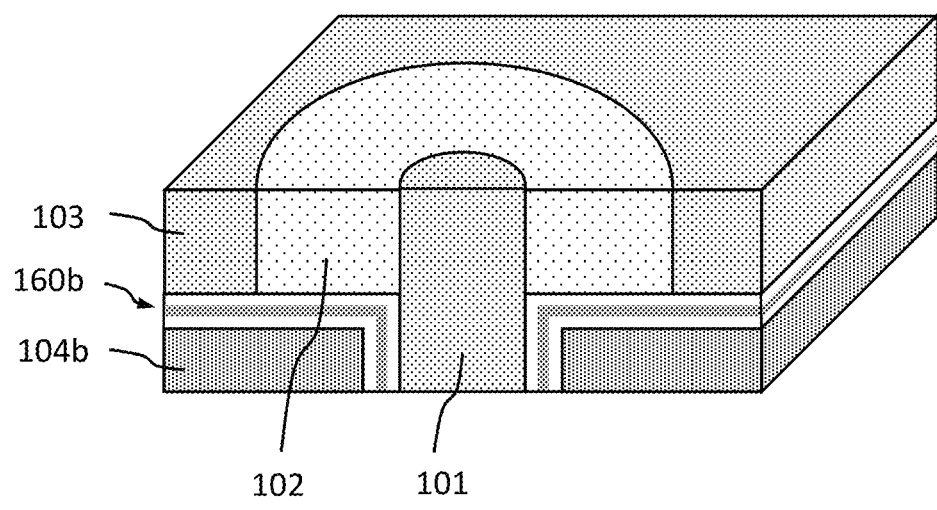

FIG. 3B shows the 3D cell structure shown in FIG. 3A with the front gate 104a and the charge-trapping layer 160a removed to show the inner structure of the cell.

Figure 4A:
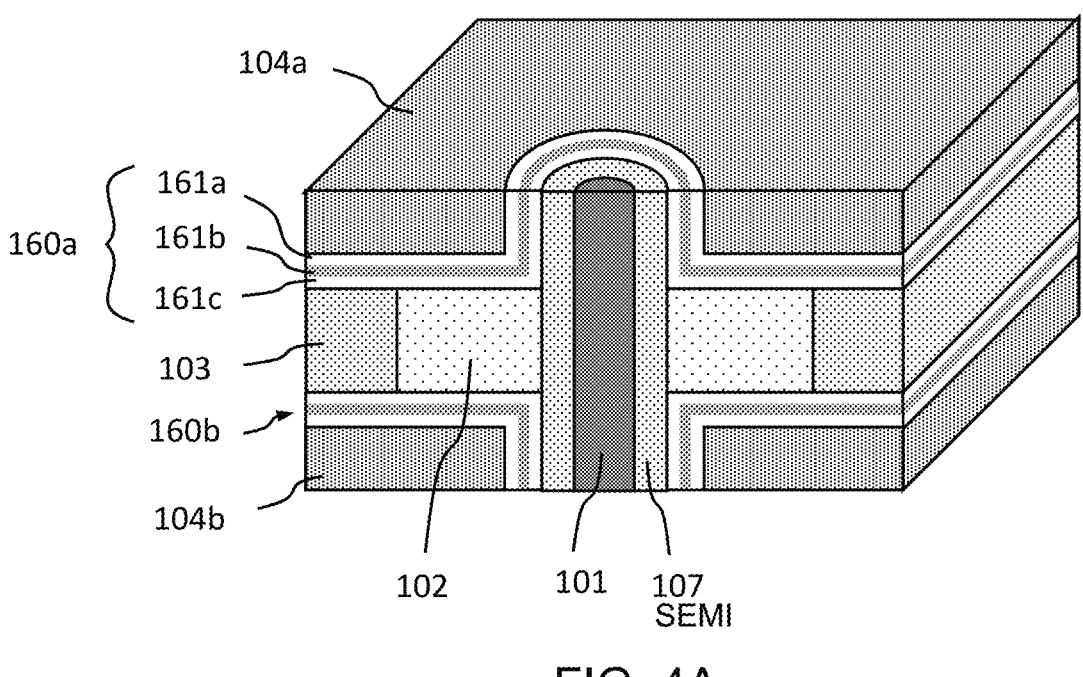

FIG. 4A shows an embodiment of a cell structure according to the invention. This embodiment is similar to the embodiment shown in FIG. 1A except that the bit line 101 is formed of metal to reduce the bit line resistance. A semiconductor layer 107 comprising material such as silicon or polysilicon material forms a drain region of the cell.

The semiconductor layer 107 that forms the drain region is formed by using an epitaxial growth process or a thin-film deposition process. In one embodiment, the semiconductor layer 107 is doped with the opposite type of heavy doping as the floating body 102 by using an in-situ doping process. The previously described process to form and dope the semiconductor layer 107 is exemplary and not limiting. Forming and doping the semiconductor layer 107 with other processes is within the scope of the invention. The metal bit line 101 and semiconductor layer 107 structure shown in this embodiment can be implemented in all the other embodiments of cell structures disclosed herein according to the invention.

Figure 4B:
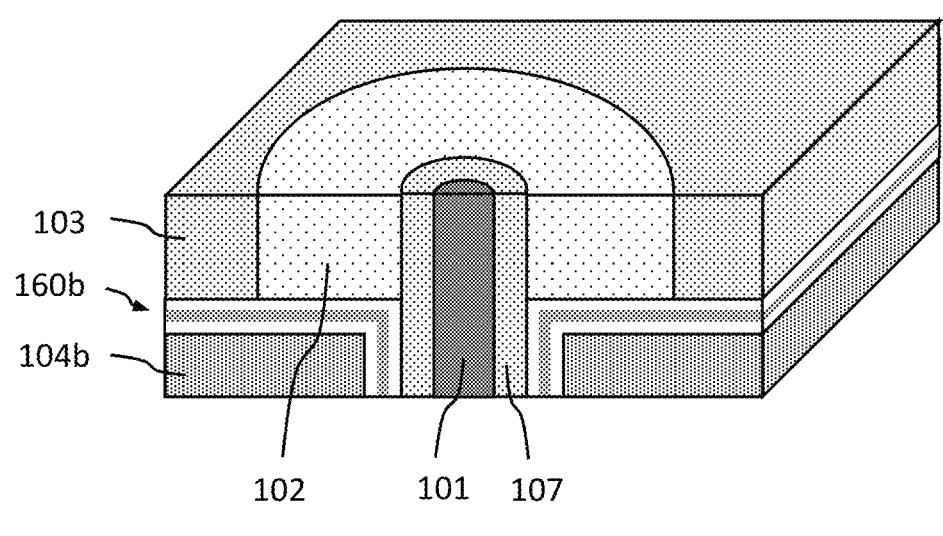

FIG. 4B shows the cell structure shown in FIG. 4A with the front gate 104a and charge-trapping layer 160a removed to show the inner structure of the cell.

Figure 4C:
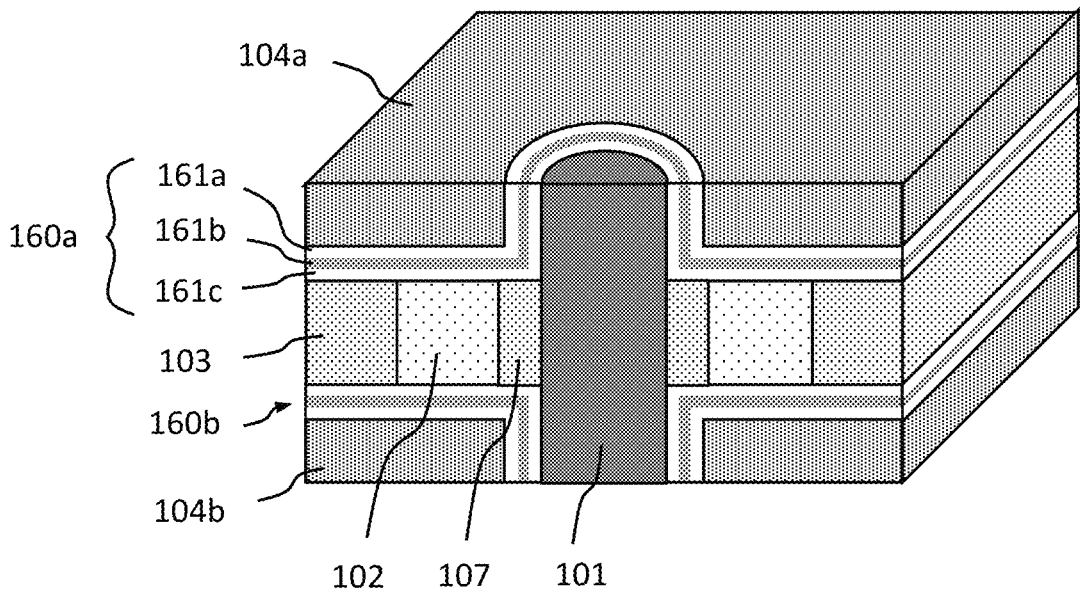

FIG. 4C shows an embodiment of a cell structure according to the invention. This embodiment is similar to the embodiment shown in FIG. 4A except that the semiconductor layer 107 is formed as a donut-shape island as shown. In one embodiment, the semiconductor layer 107 is formed by using a diffusion or plasma doping process to implant the opposite type of heavy dopants as used in the floating body 102. For example, assuming the floating body 102 has P– or N– type of doping, the semiconductor layer 107 is formed by implanting N type of dopants, such as phosphorous, or P type of dopants, such as boron, to form an N+ or P+ type of region, respectively.

In another embodiment, the semiconductor layer 107 is formed by using an isotropic etching process, such as wet etching, to form a recess in the floating body 102, and then filling the recess with a semiconductor material that has the opposite type of doping as the floating body 102 by using epitaxial growth or polysilicon deposition to form the semiconductor layer 107. The bit line 101 is formed of metal to reduce the bit line resistance. The previously described process to form and dope the semiconductor layer 107 are only examples. Forming and doping the semiconductor layer 107 using other processes are within the scope of the invention. The metal bit line 101 and semiconductor layer 107 structure shown in this embodiment can be applied to all the other disclosed embodiments of cell structures according to the invention.

Figure 4D:
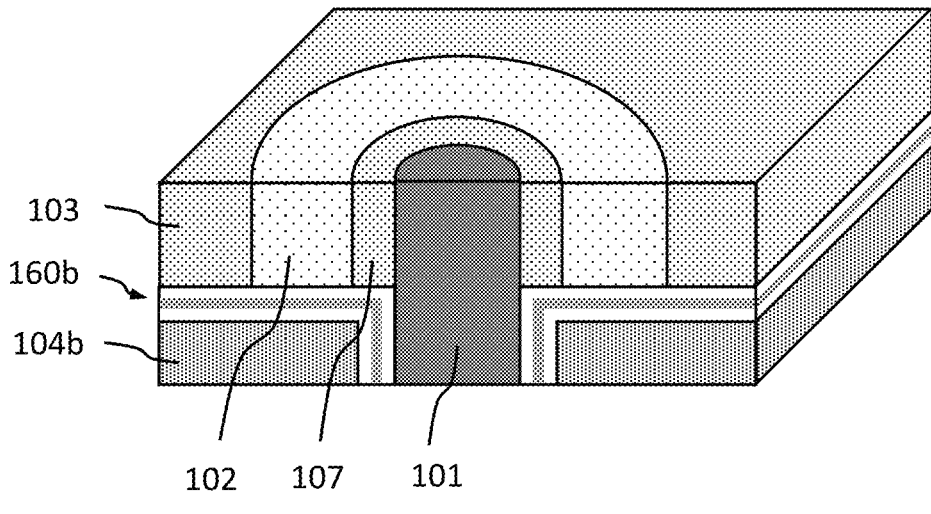

FIG. 4D shows the cell structure shown in FIG. 4C with the front gate 104a and charge-trapping layer 160a removed to show the inner structure of the cell.

Figure 5A:
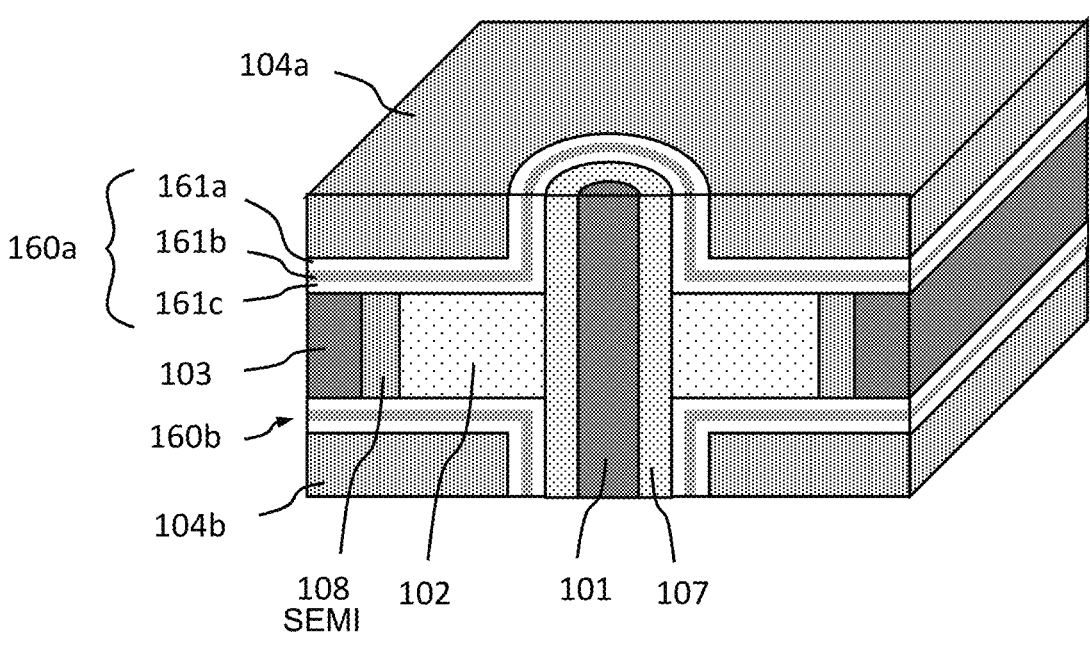

FIG. 5A shows an embodiment of a cell structure according to the invention. This embodiment is similar to the embodiment shown in FIG. 4A except that the source line 103 is formed of metal to reduce the source line resistance. A semiconductor layer 108 comprising material such as silicon or polysilicon material is formed between the source line 103 and the floating body 102 to form a source region.

The semiconductor layer 108 is formed by using a diffusion process or lateral ion implantation process to implant dopants into the floating body 102 through the space occupied by the source line 103 before the source line 103 is formed. In one embodiment, the semiconductor layer 108 is doped with the opposite type of heavy doping as the floating body 102 by using a diffusion process. The previously described processes to form and dope the semiconductor layer 108 are exemplary and not limiting. Forming and doping the semiconductor layer 108 using other processes are within the scope of the invention.

Figure 5B:
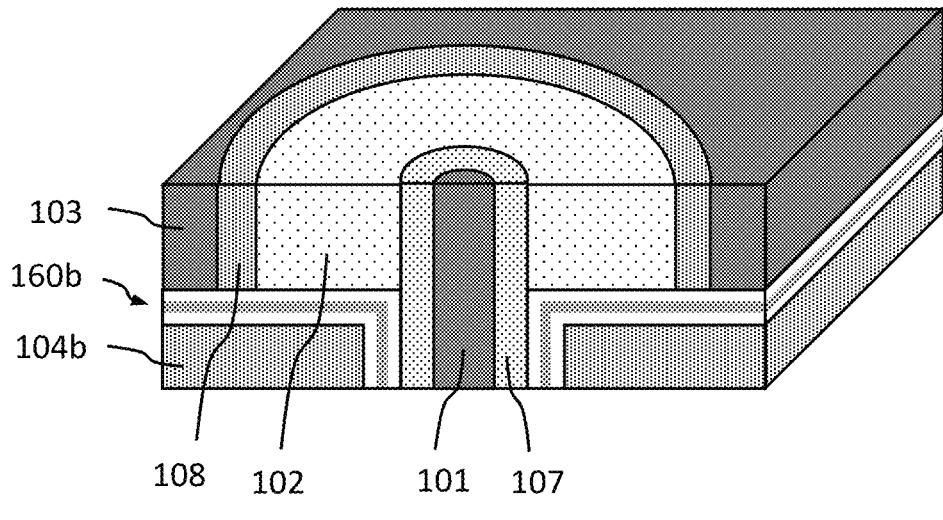

FIG. 5B shows the cell structure shown in FIG. 5A with the front gate 104a and the charge-trapping layer 160a removed to show the inner structure of the cell.

Figure 6A:
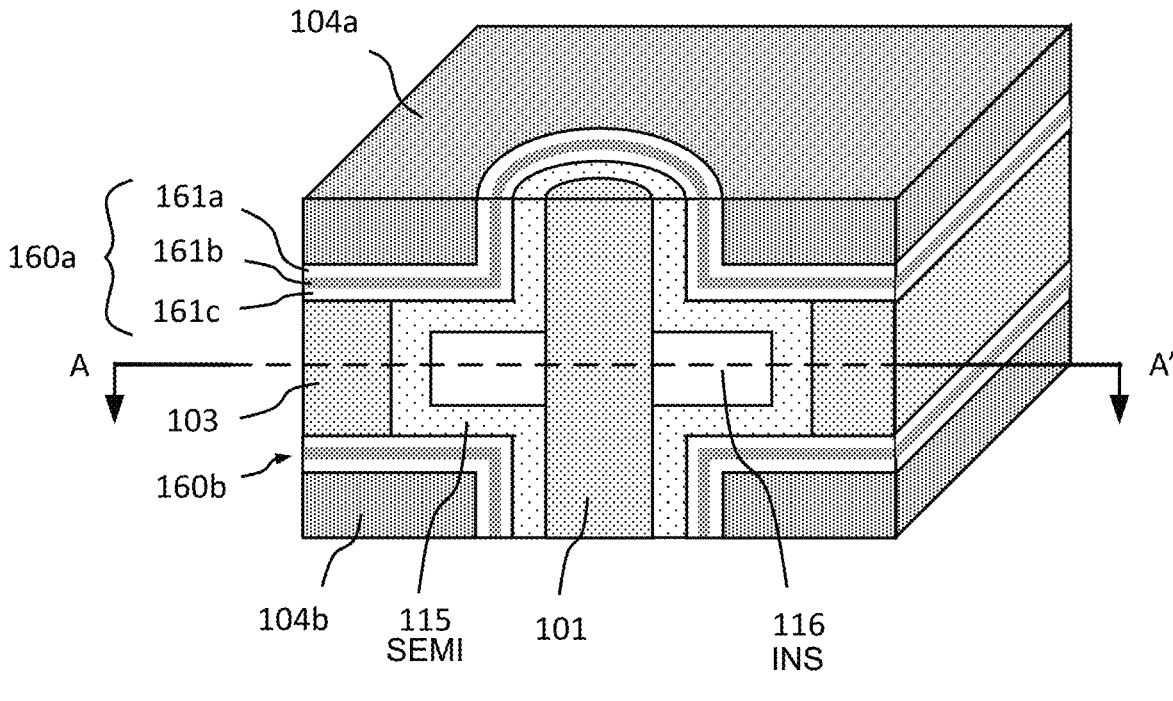

FIG. 6A shows an embodiment of a cell structure according to the invention. This embodiment is similar to the embodiment shown in FIG. 1A except that the cell shown in FIG. 6A is formed as a thin-film transistor instead of a junction transistor. A semiconductor layer 115 is formed comprising material such as silicon, polysilicon, silicon germanium (SiGe), indium gallium zinc oxide (IGZO), tungsten-doped indium oxide semiconductor, or any other suitable semiconductor materials. Also shown is an insulator 116 comprising material such as oxide or nitride material. The semiconductor layer 115 forms the channel of the cell transistor.

Figure 6B:
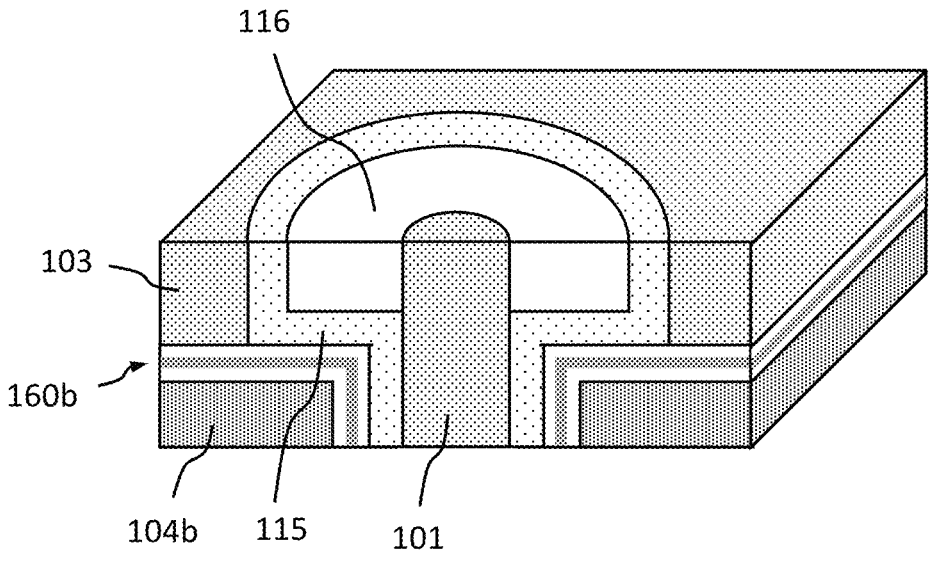

FIG. 6B shows a cross-section view of the cell structure shown in FIG. 6A taken along line A-A'.

Figure 7A:
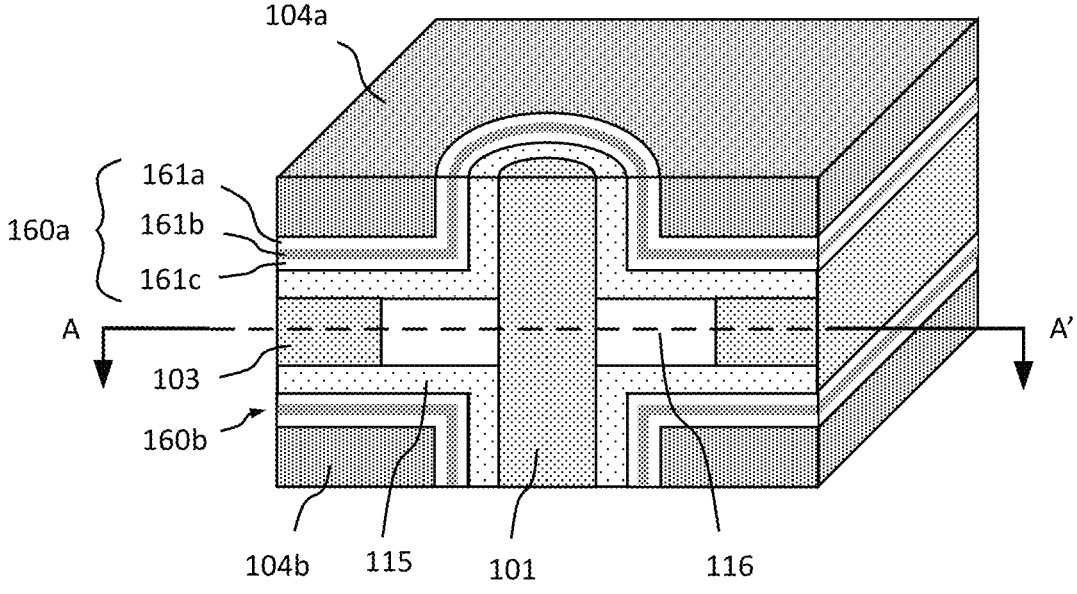

FIG. 7A shows an embodiment of a cell structure according to the invention. This embodiment is similar to the embodiment shown in FIG. 6A except that the semiconductor layer 115 is formed to have a different pattern or shape.

Figure 7B:
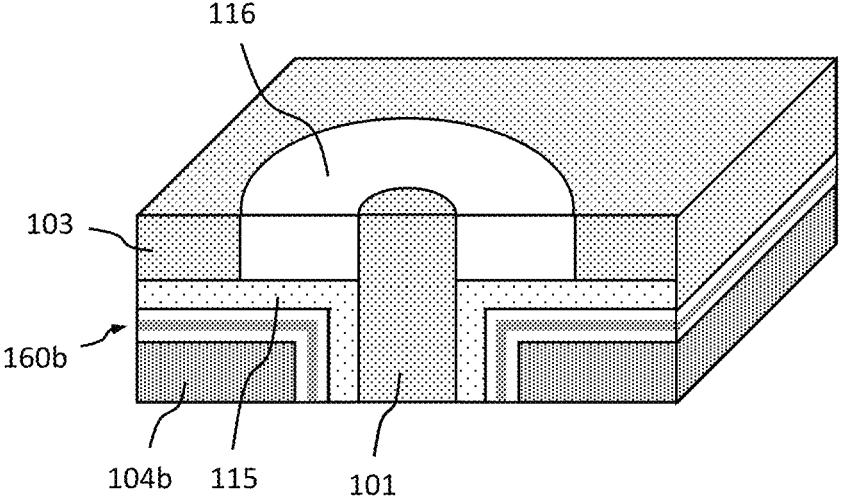

FIG. 7B shows a cross-section view of the cell structure shown in FIG. 7A taken along line A-A'.

FIGS. 8A-E show embodiments of 3D array structures according to the invention. In these embodiments, the cell structure shown in FIG. 1A is used to form an array structure as an example, however, all the embodiments of the 3D array structures shown in FIGS. 8A-E are applicable to and can be formed using any of the cell structures shown in FIG. 1A to FIG. 7B.

Figure 8A:
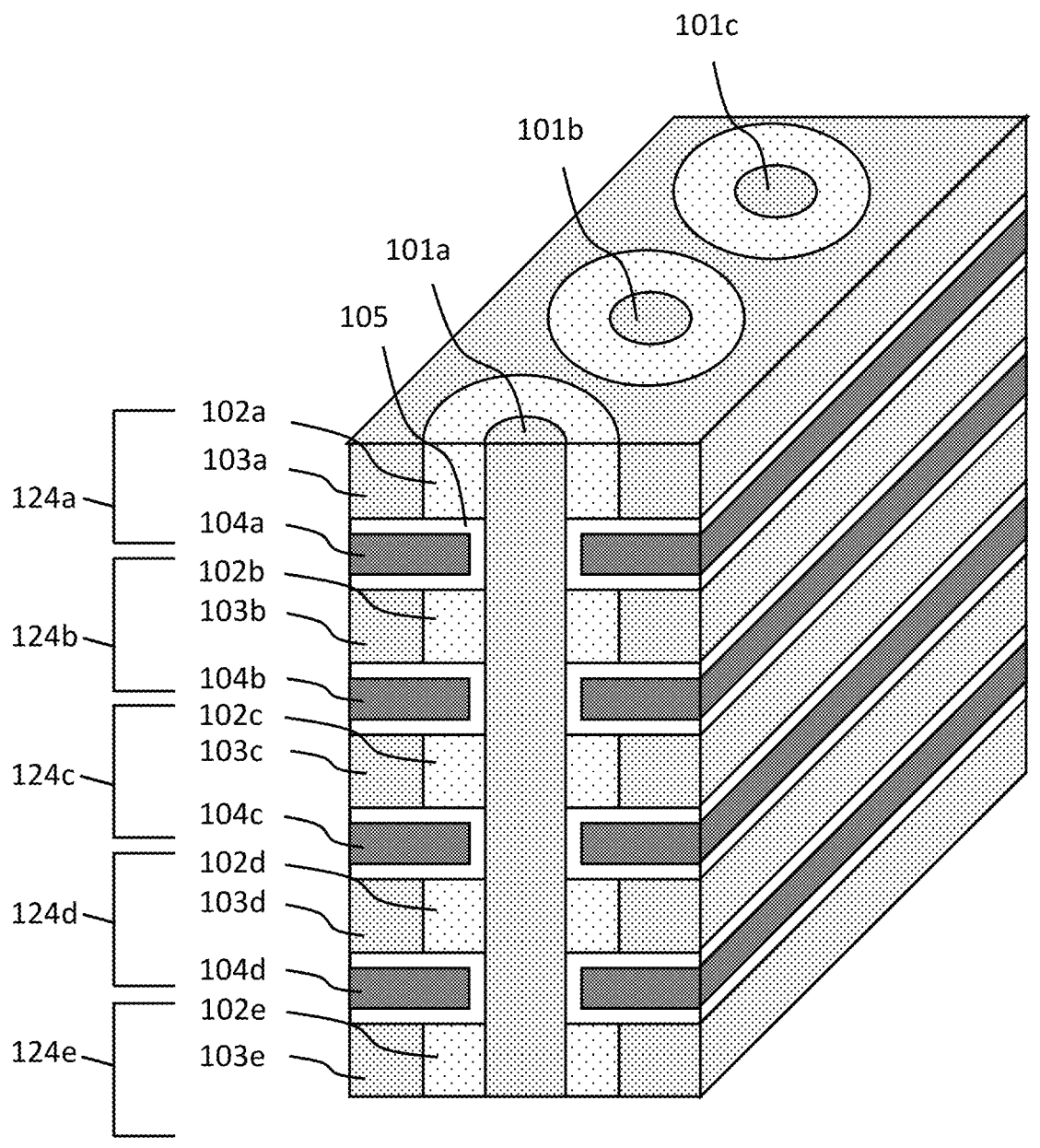
FIGS. 8A-E show embodiments of 3D array structures according to the invention.

FIG. 8A shows an embodiment of a 3D array structure formed using the cell structure shown in FIG. 1A. In this embodiment, five layers of cells 124a to 124e are shown as an example. The array structure also comprises vertical bit lines 101a to 101c, floating bodies 102a to 102e, and source lines 103a to 103e. The gates 104a to 104d form the word lines (WLs). Also shown are dielectric layers 105. In this embodiment, the cells are formed as dual-gate transistors. Each cell, such as cell 124b, is coupled to two gates 104a and 104b. Each gate, such as gate 104a, is shared by two adjacent cells, such as cells 124a and 124b.

Figure 8B:
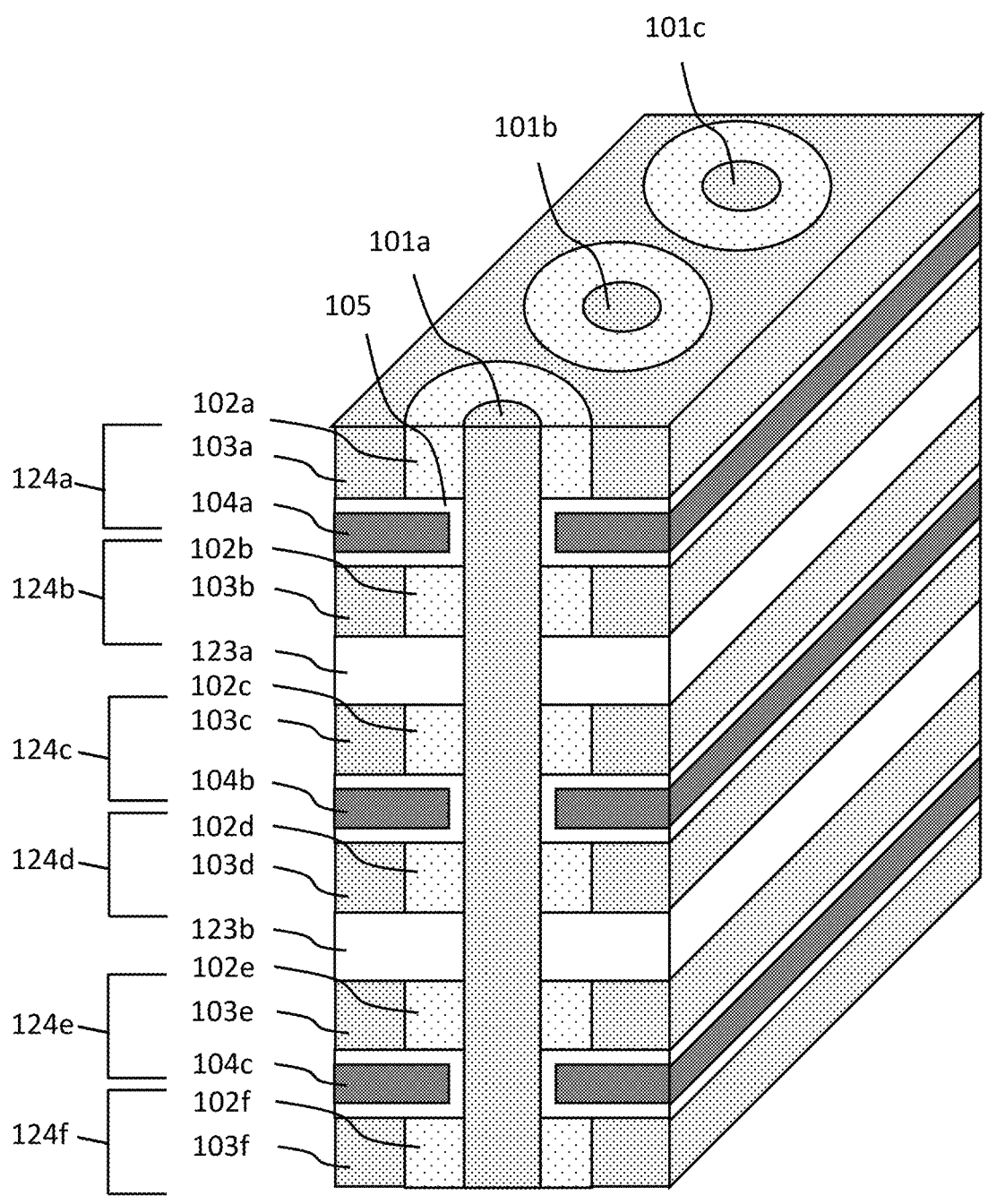

FIG. 8B shows an embodiment of a 3D array structure according to the invention. This embodiment includes six layers of cells 124a to 124f as an example. This embodiment is similar to the embodiment shown in FIG. 8A except that the cells are formed as single-gate transistors. Each cell, such as cell 124b, is coupled to only one gate, such as gate 104a. Also shown are insulating layers 123a and 123b comprising material such as oxide material to separate the cells. In this embodiment, each gate, such as gate 104a, is shared by two adjacent cells, such as cells 124a and 124b.

Figure 8C:
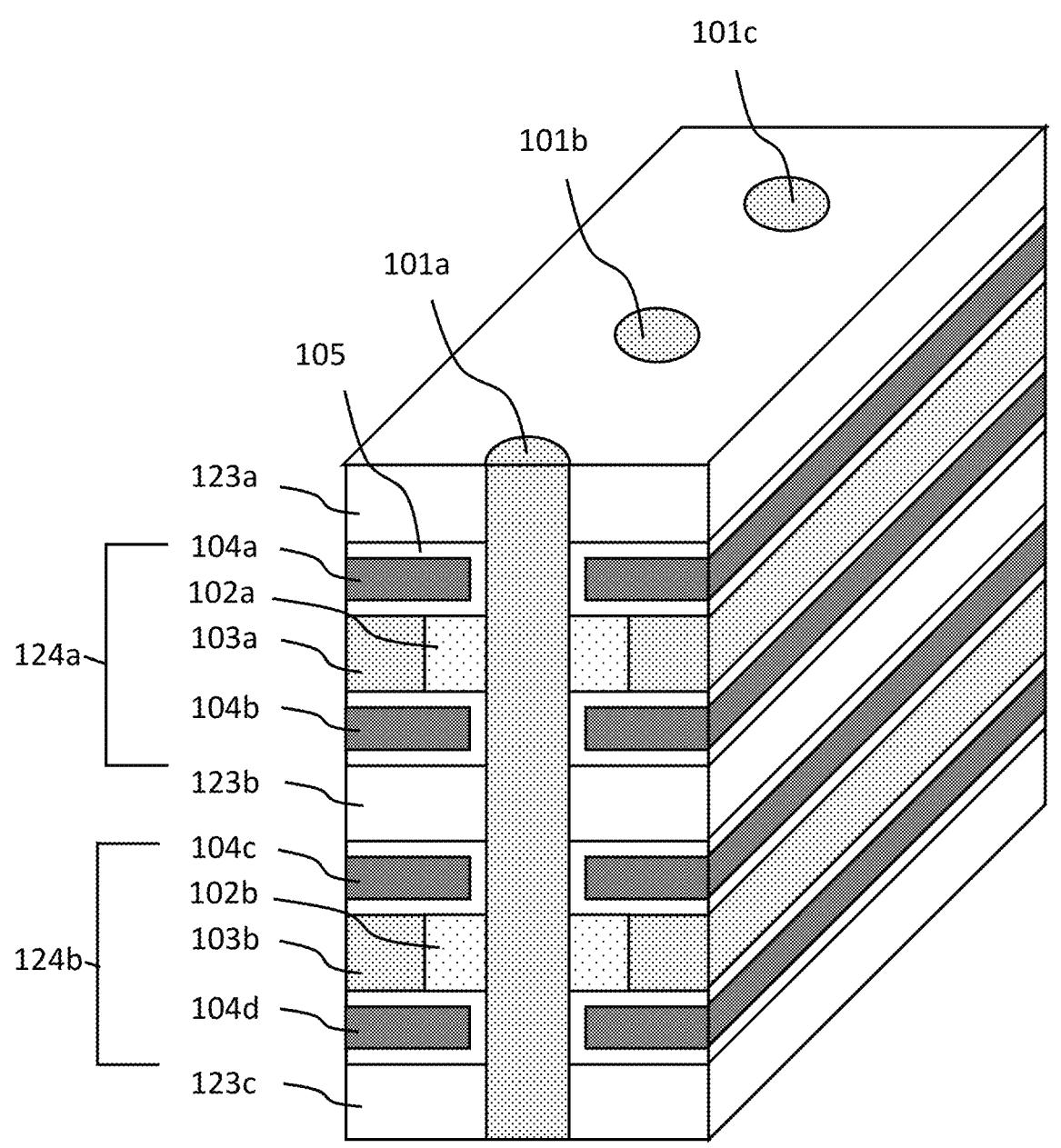

FIG. 8C shows an embodiment of a 3D array structure according to the invention. This embodiment includes two layers of cells 124a and 124b as an example. Insulating layers 123a to 123c comprising material such as oxide material are provided to separate the cells. This embodiment is similar to the embodiment shown in FIG. 8A except that the gates 104a to 104d are not shared. Each cell, such as cell 124a, is coupled to two gates, such as gates 104a and 104b. In one embodiment, the two gates coupled to a cell are separated to form a dual-gate transistor. In another embodiment, the two gates coupled to a cell are connected to form a single-gate transistor.

Figure 8D:
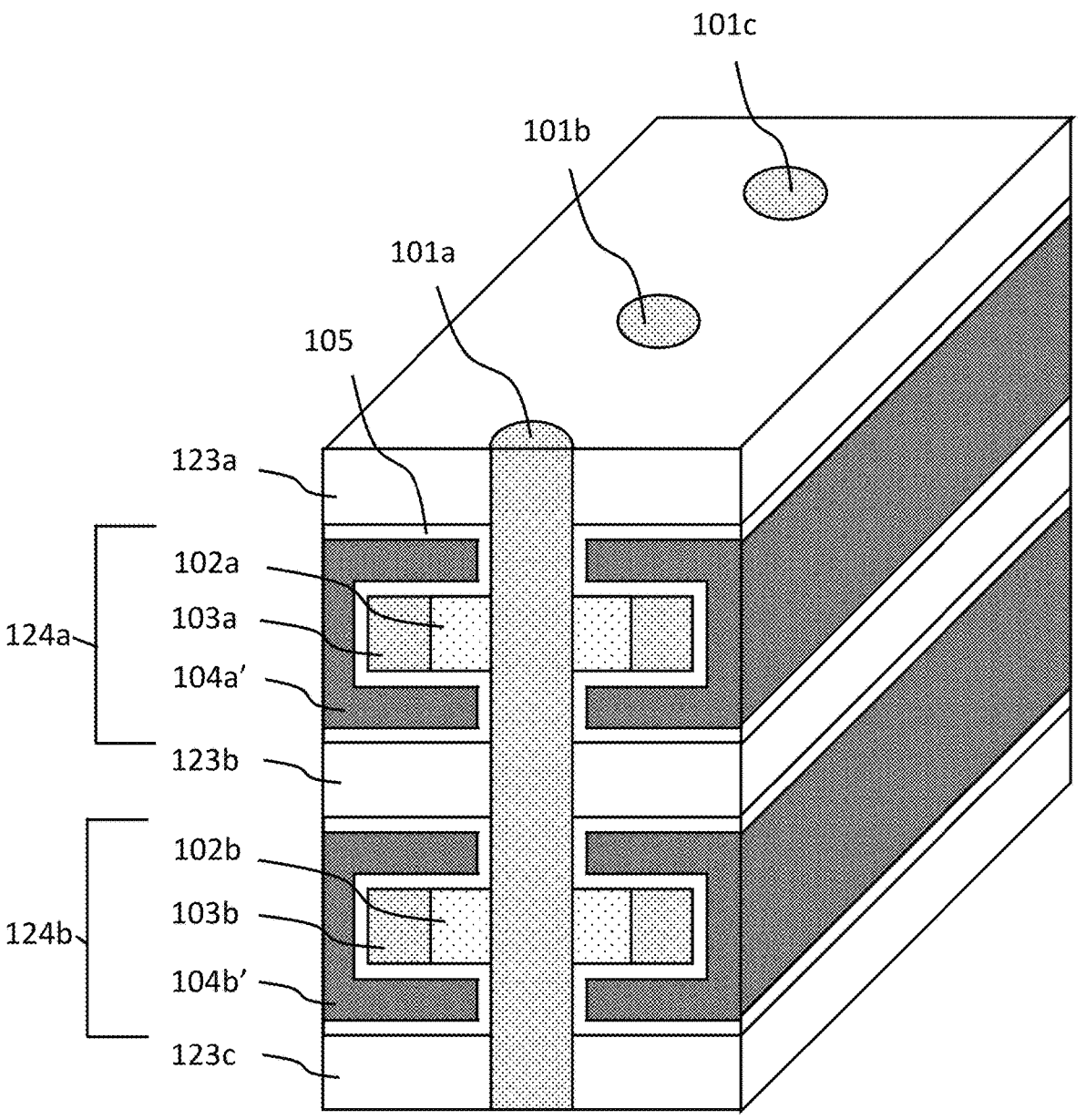

FIG. 8D shows an embodiment of a 3D array structure according to the invention. In this embodiment, two layers of cells 124a and 124b are shown as an example. Insulating layers 123a to 123c comprising material such as oxide material are provided to separate the cells. This embodiment is similar to the embodiment shown in FIG. 8C except that the two gates coupled to a cell, such as cell 104a and 104b, shown in FIG. 8C are connected to form a gate, such as gate 104a' and 104b' shown in FIG. 8D. This configuration forms a single-gate transistor.

Figure 8E:
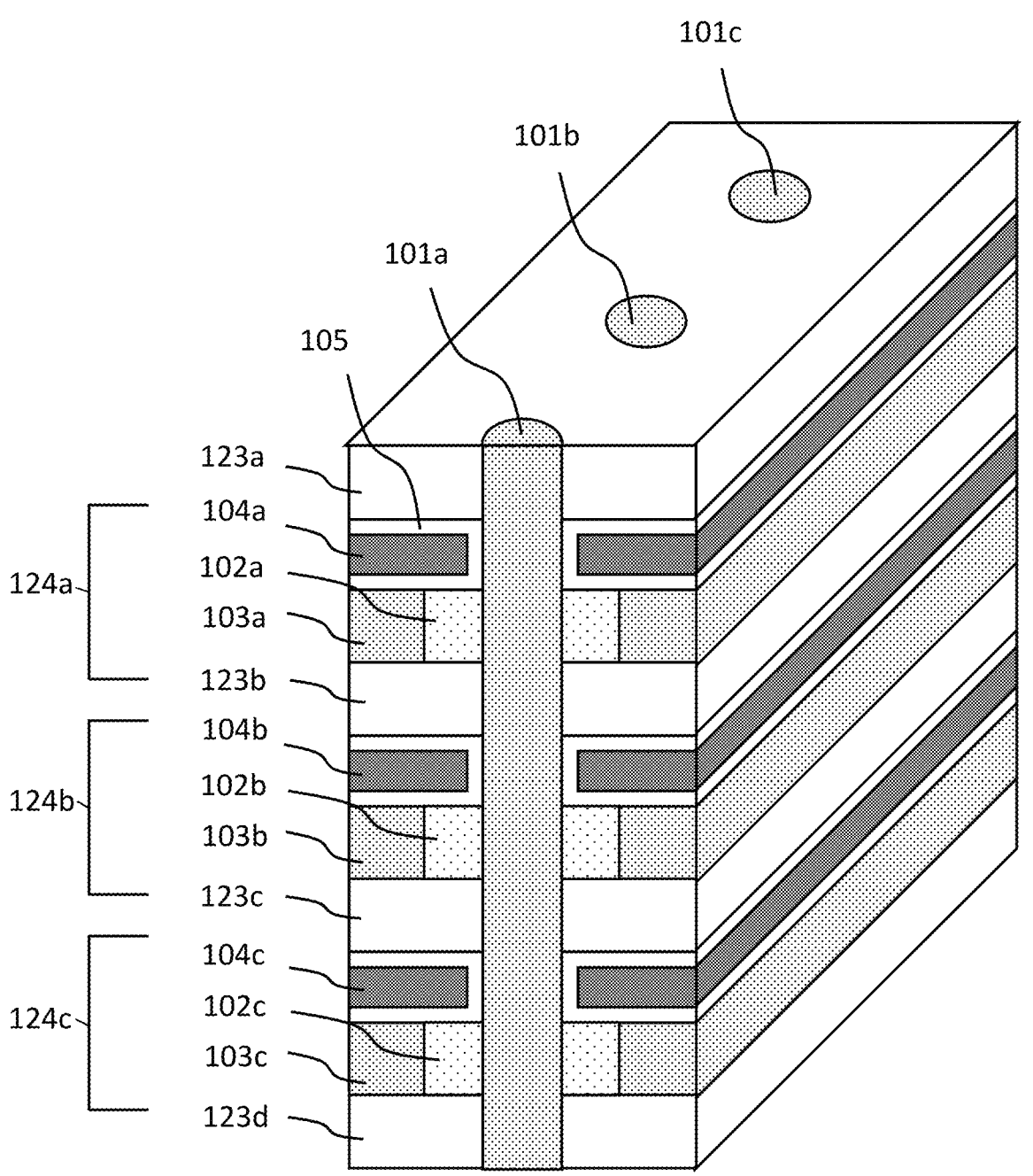

FIG. 8E shows an embodiment of a 3D array structure according to the invention. Three layers of cells 124a to 124c are shown as an example. Insulating layers 123a to 123d comprising material such as oxide material are provided to separate the cells. This embodiment is similar to the embodiment shown in FIG. 8C except that each cell, such as cell 124a, is only coupled to one gate, such as gate 104a. This configuration forms an array of single-gate transistors.

Figure 9A:
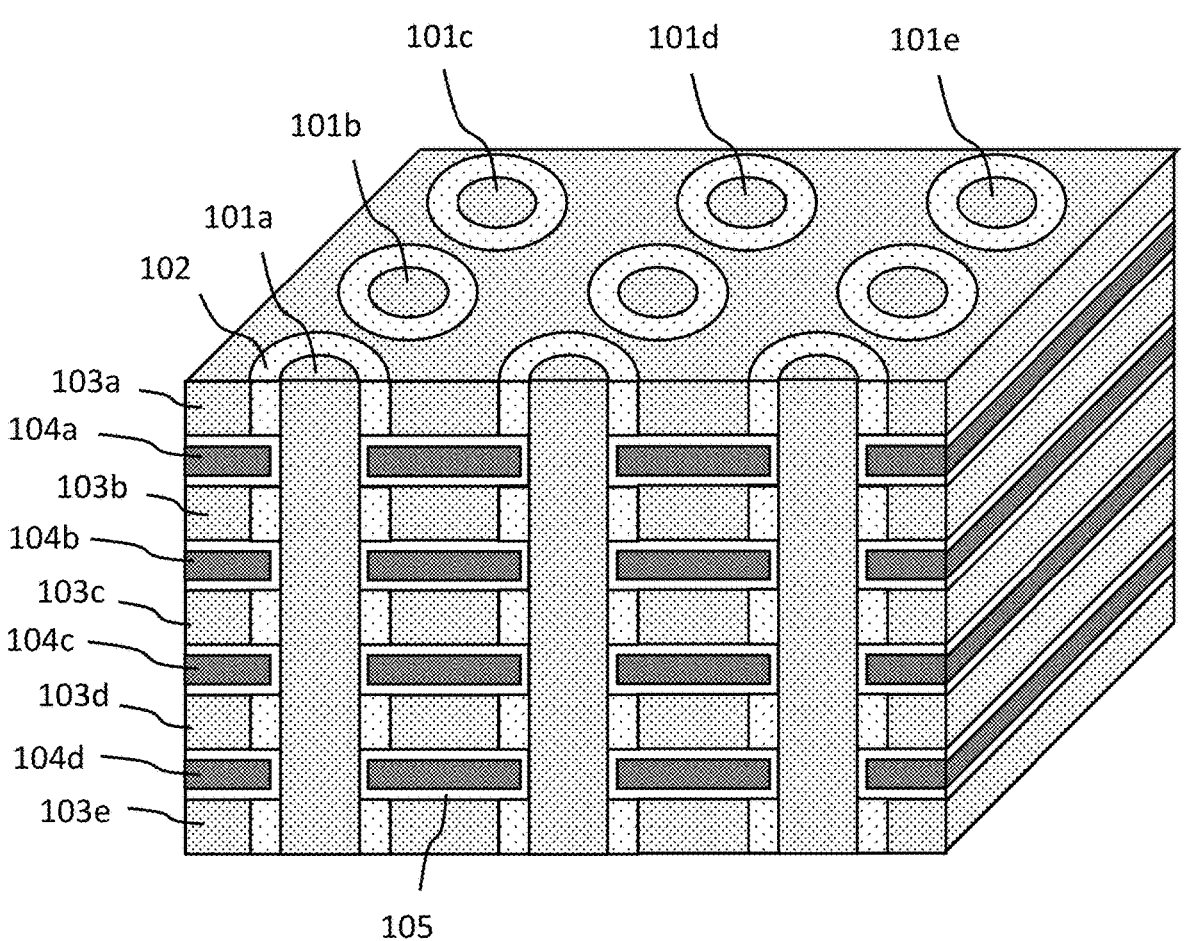
FIGS. 9A-C shows embodiments of 3D array structures according to the invention.
Figure 9B:
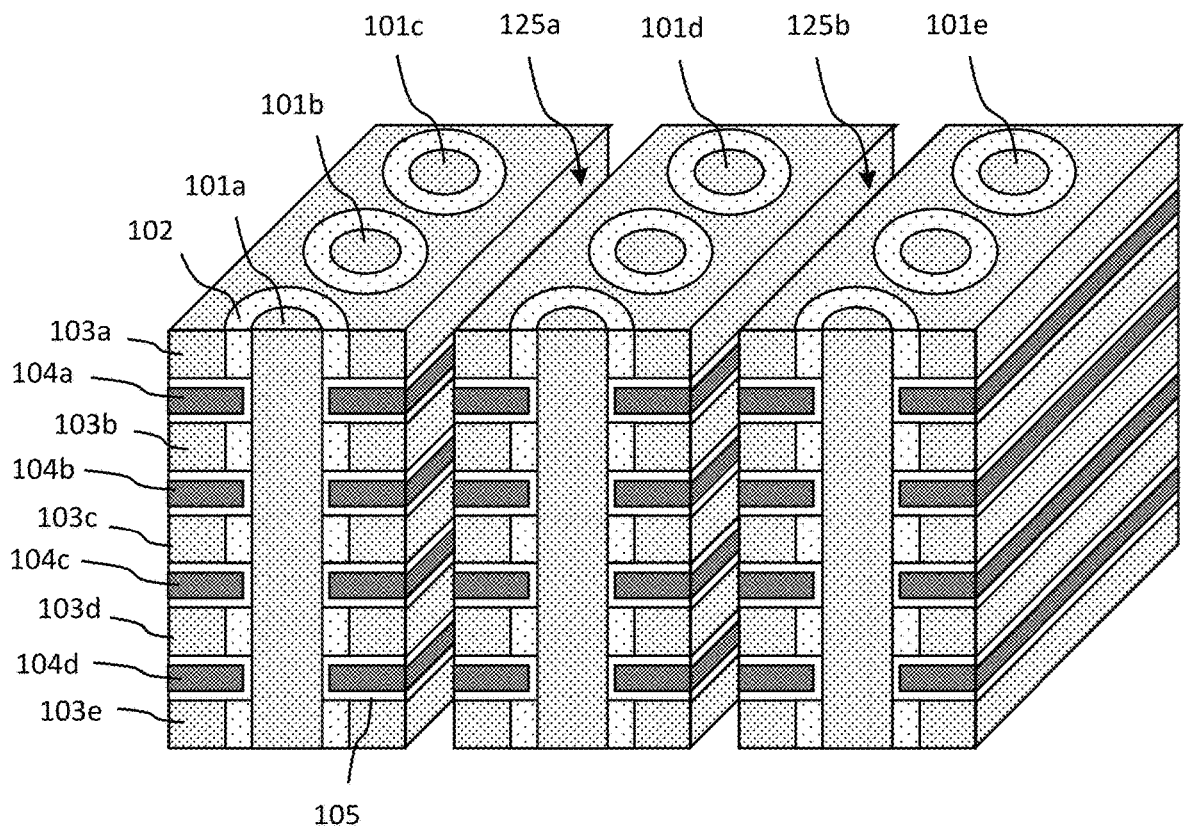
Figure 9C:
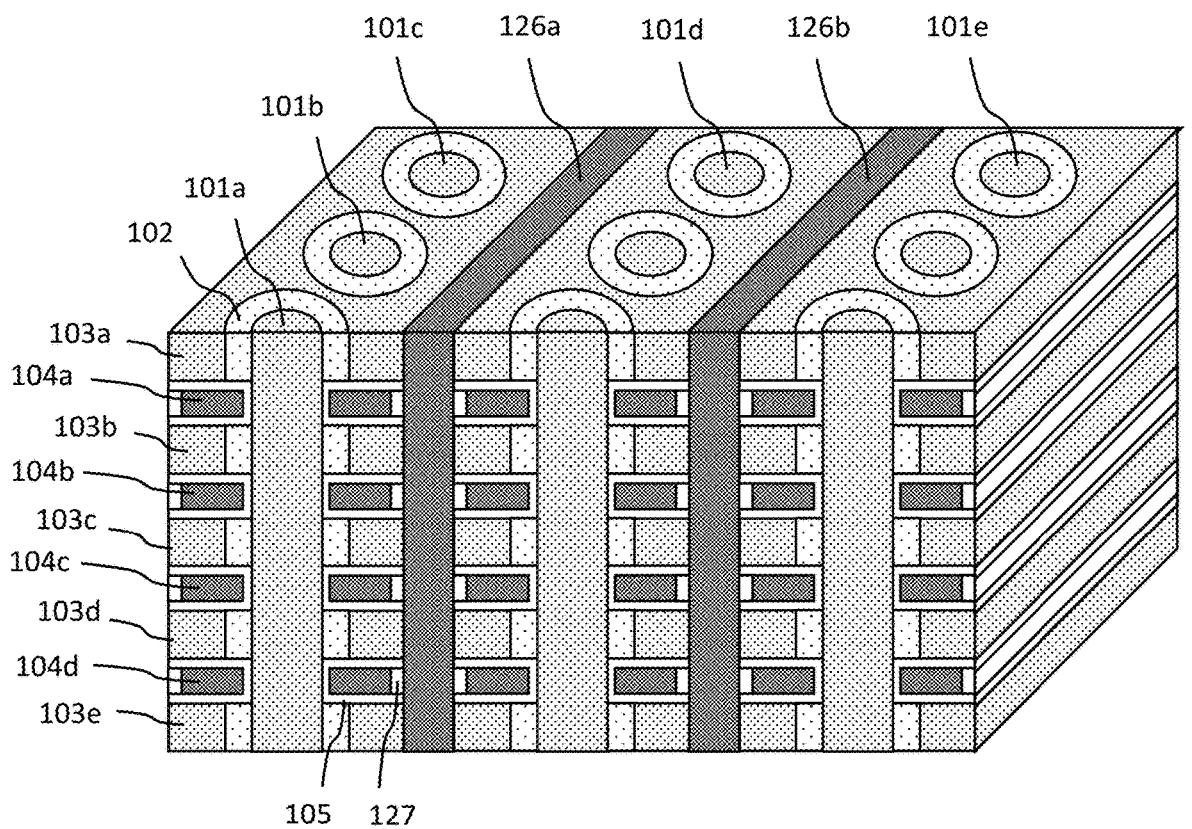

FIGS. 9A-C shows embodiments of 3D array structures according to the invention. As an example, the cell structure shown in FIG. 1A is used to form the array structure, however, all the embodiments of the 3D array structures shown in FIGS. 9A-C can be formed using any of the cell structures shown in FIG. 1A to FIG. 7B.

FIG. 9A shows an embodiment of a 3D array structure based on the cell structure shown in FIG. 1A as an example. This array structure includes vertical bit lines 101a to 101e, word line layers 104a to 104d, and source lines 103a to 103e. Also shown are the floating body 102 and gate dielectric layer 105.

FIG. 9B shows an embodiment of a 3D array structure formed using the cell structure shown in FIG. 1A as an example. This embodiment is similar to the embodiment shown in FIG. 9A except that the array is separated into multiple stacks by vertical slits, such as slits 125a and 125b. The word lines 104a to 104d in each stack can be connected to different word line decoder signals. In one embodiment, the slits 125a and 125b are filled with insulator material, such as oxide material.

FIG. 9C shows an embodiment of a 3D array structure formed using the cell structure shown in FIG. 1A as an example. This embodiment is similar to the embodiment shown in FIG. 9B except that the vertical slits 125a and 125b are filled with conductor material such as metal or polysilicon material to form vertical source line layers 126a and 126b. The vertical source line layers 126a and 126b are connected to the source lines, such as source lines 103a to 103e. The vertical source line layers 126a and 126b can be connected to a common source line voltage such as 0V, for example. Insulating layers, such as insulating layer 127, are formed on the sidewall of the word lines to prevent the word lines from shorting to the vertical source line layers 126a and 126b.

Figure 10A:
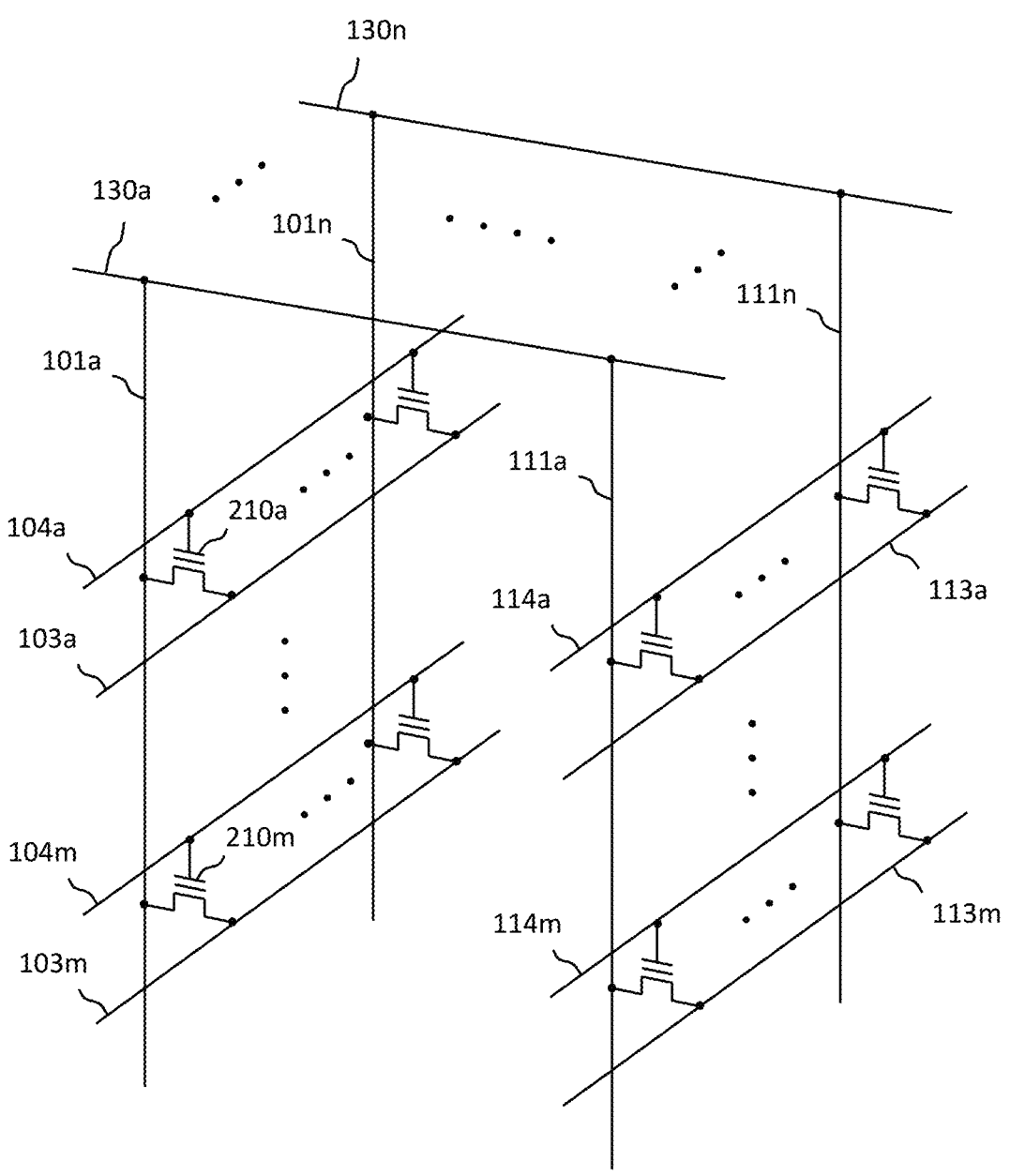
FIG. 10A-B show embodiments of equivalent circuits of a 3D NOR-type array architecture according to the invention.

FIG. 10A shows an embodiment of an equivalent circuit of a 3D NOR-type array architecture according to the invention. The equivalent circuit includes memory cells 210a to 210m that comprise any of the embodiments of memory cells shown in FIGS. 1A-7B. For illustration, this embodiment uses NOR-type flash memory cells as an example. However, the embodiments can use any other type of memory cells, such as FRAM, RRAM, MRAM, PCM, and memristor-transistor (memtransistor) cells, all of which are within the scope of the invention.

The circuit shown in FIG. 10A also includes vertical bit lines 101a-n and 111a-n, word lines 104a-m and 114a-m, and source lines 103a-m and 113a-m. The vertical bit lines 101a-n and 111a-n are connected to horizontal bit lines 130a-n as shown. The horizontal bit lines 130a-n can be located at the bottom or on the top of the array. In this embodiment, because the bit lines 101a-n and 111a-n are connected to the same horizontal bit lines 130a-n, the word lines 104a-m and 114a-m cannot be connected. Instead, each of the word lines 104a-m and 114a-m are connected to a word line decoder. The source lines 103a-m and 113a-m are connected to individual source line decoders (not shown) or to a common source line voltage source.

Figure 10B:
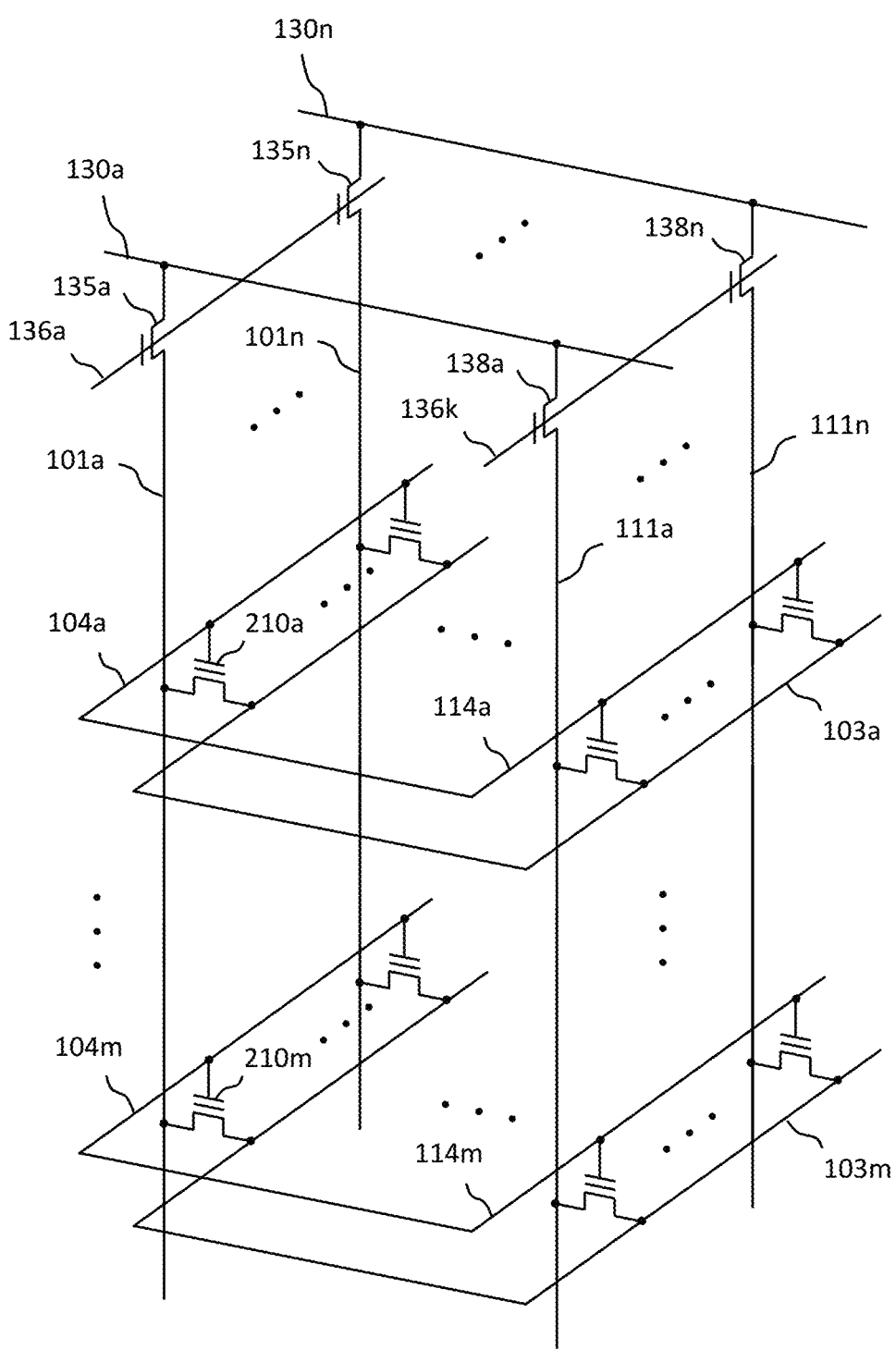

FIG. 10B shows an embodiment of an equivalent circuit of a 3D NOR-type array architecture according to the invention. This embodiment is similar to the embodiment shown in FIG. 10A except that additional select gates 135a-n and 138a-n are added. The vertical bit lines 101a-n and 111a-n are connected to the horizontal bit lines 130a-n through the select gates 135a-n and 138a-n, respectively.

The select gate signals 136a-k are connected to gates terminals of the select gates 135a-n and 138a-n, respectively. The select gate signals 136a-k select which set of vertical bit lines are to be coupled to the horizontal bit lines 130a-n. The horizontal bit lines 130a-n and the select gates 135a-n and 138a-n are located on the top or at the bottom of the array. Adding the select gates 135a-n and 138a-n enables the multiples word lines in the same layer, such as word lines 104a and 114a and word lines 104m and 114m to be connected. This greatly reduces the number of word line decoders needed. The source lines 103a to 103m are connected to individual source line decoders (not shown) or a common source line voltage source.

Figure 11A:
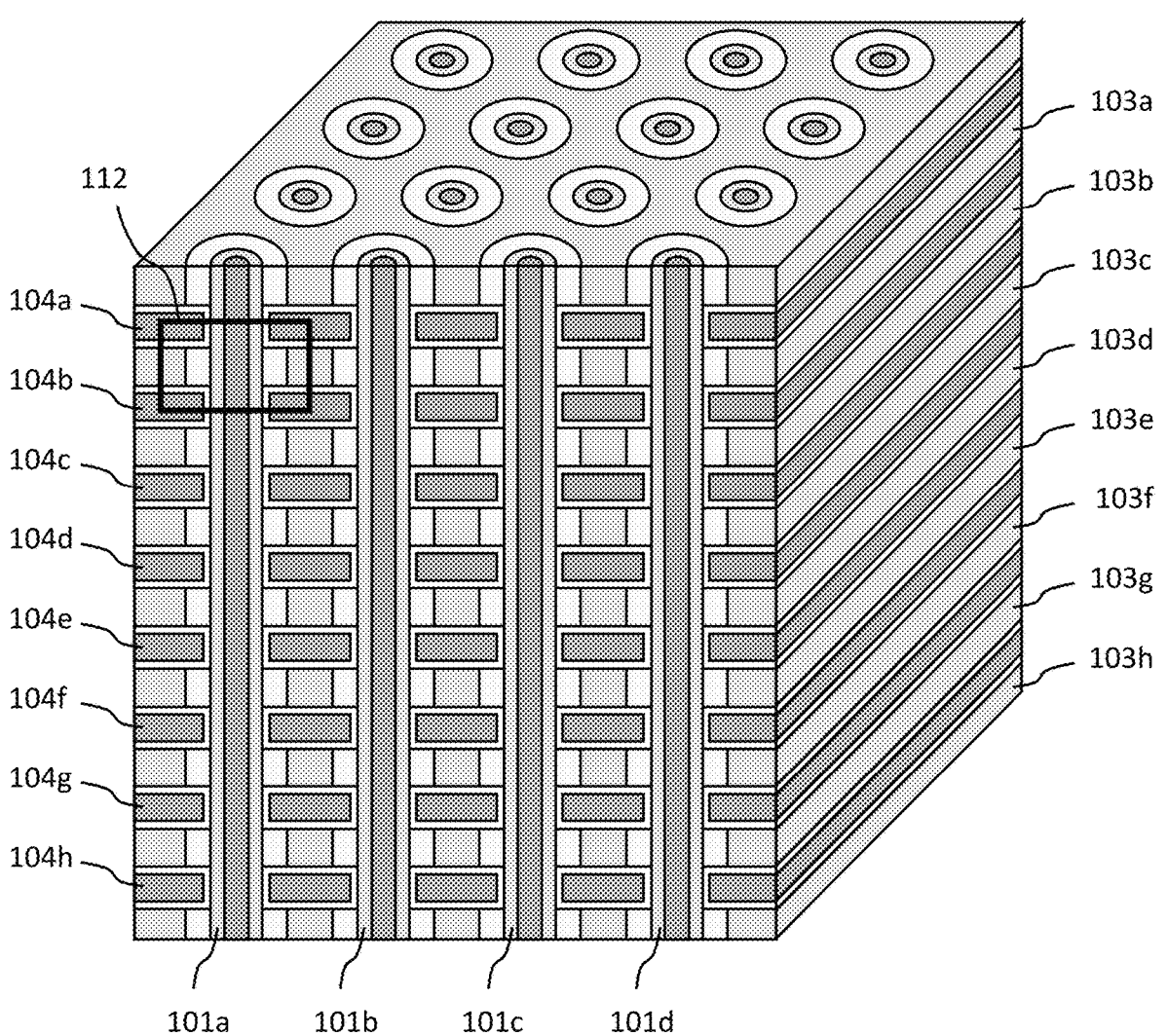
FIGS. 11A-B show embodiments of 3D array structures according to the invention.
Figure 11B:
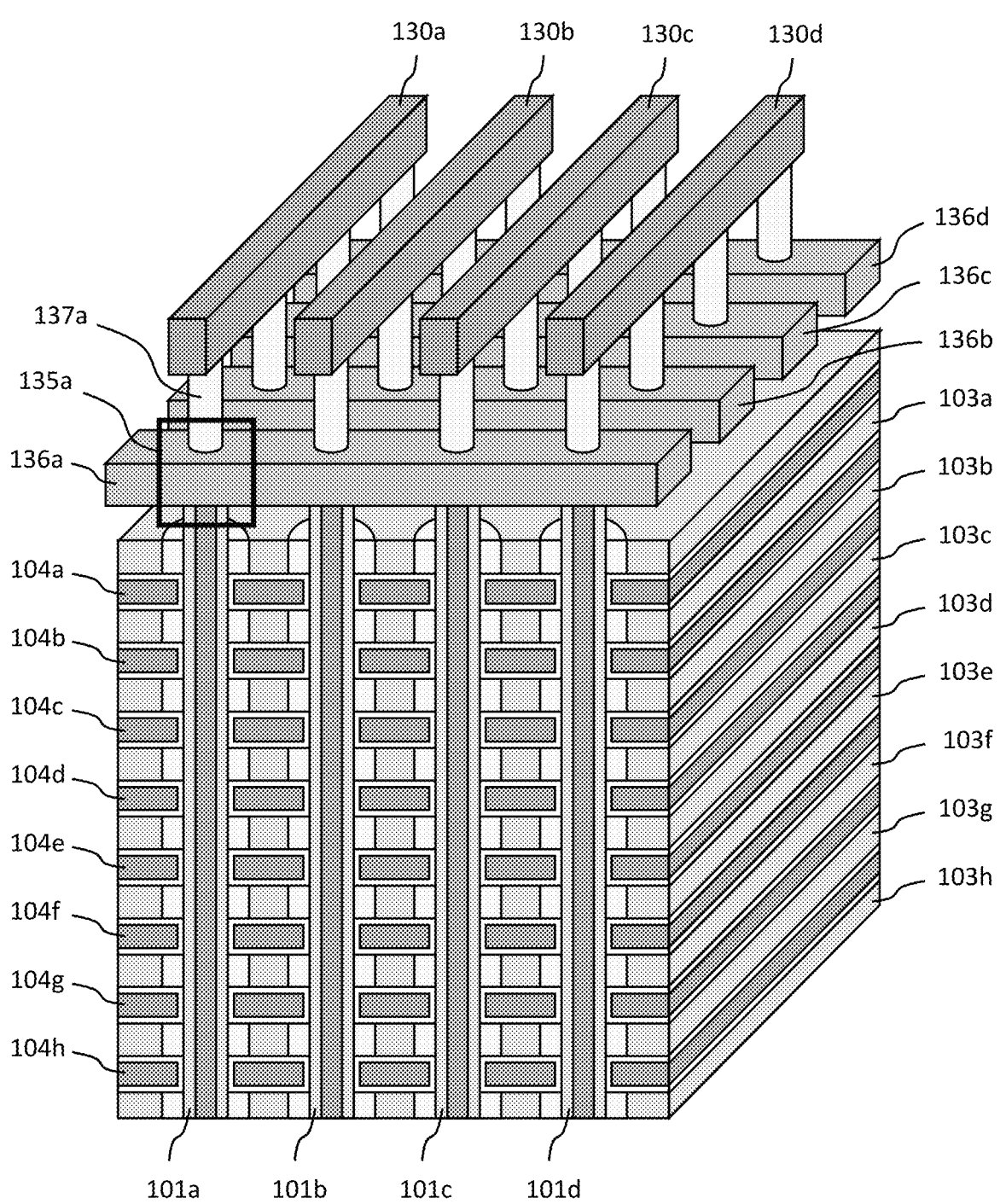

FIGS. 11A-B show embodiments of 3D array structures according to the invention.

FIG. 11A shows an embodiment of a 3D array formed using the cell structure shown in FIG. 4A as an example. In other embodiments, the 3D array structure can be formed using any of the other cell structures shown in FIGS. 1A-7B. The 3D array structure comprises multiple word line layers 104a-h, multiple source line layers 103a-h, and multiple vertical bit lines such as 101a-d. Each intersection of the bit lines 101a-d and source lines 103a-h forms a cell, such as cell 112.

FIG. 11B shows an embodiment of bit line connections of a 3D array structure according to the invention. In one embodiment, the vertical bit lines 101a-d are connected to horizontal bit lines 130a-d through select gates, such as select gate 135a, and contacts, such as contact 137a. The horizontal bit lines 130a-d are formed of conductor material, such as metal or heavily doped polysilicon material. The select gates, such as select gate 135a, are formed of vertical-channel transistors. In one embodiment, select gate lines 136a-d are connected to the control gates of the vertical-channel select gates, such as gate 135a.

In one embodiment, the word line layers 104a-h and source line layers 103a-h are connected to word line decoders not shown and source line voltage generators not shown, respectively, by forming staircase structures for the word lines and the source lines at the edge of the array similar to a conventional 3D NAND flash memory.

Figure 12A:
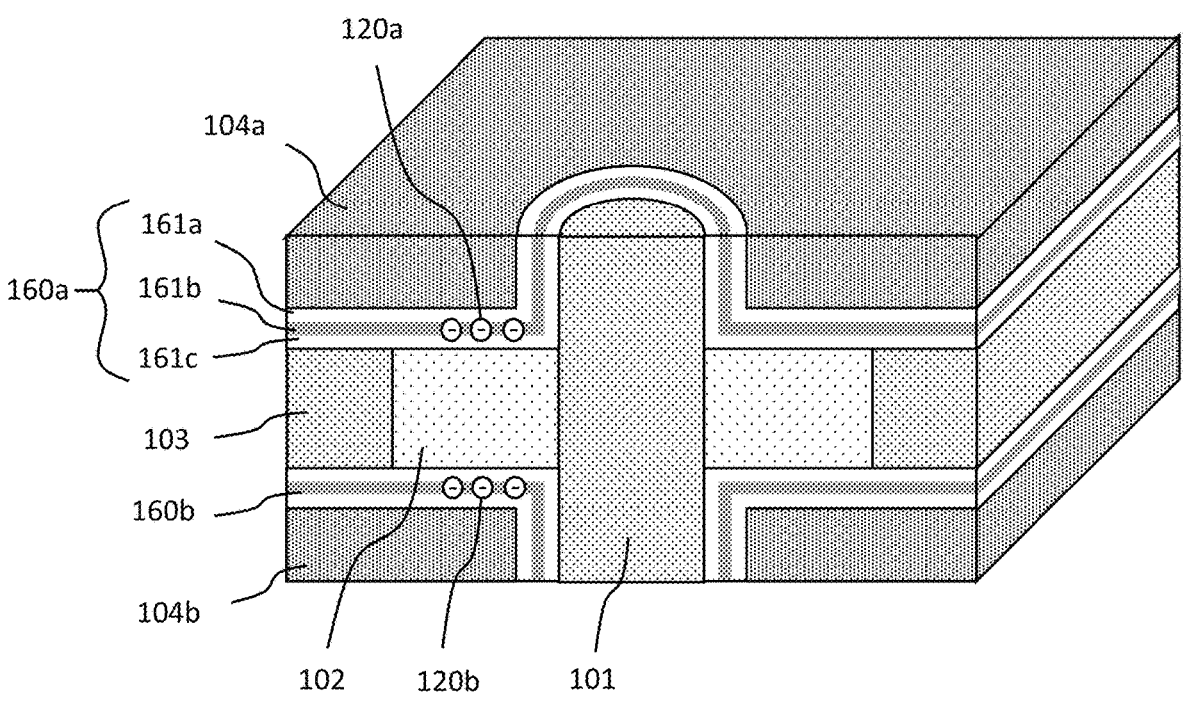
FIG. 12A shows an embodiment of a cell structure for NOR-type flash memory as shown in FIG. 3A according to the invention.

FIG. 12A shows an embodiment of a cell structure for NOR-type flash memory as shown in FIG. 3A according to the invention. The reader is referred to FIG. 3A for a detailed description of the cell structure.

Figure 12B:
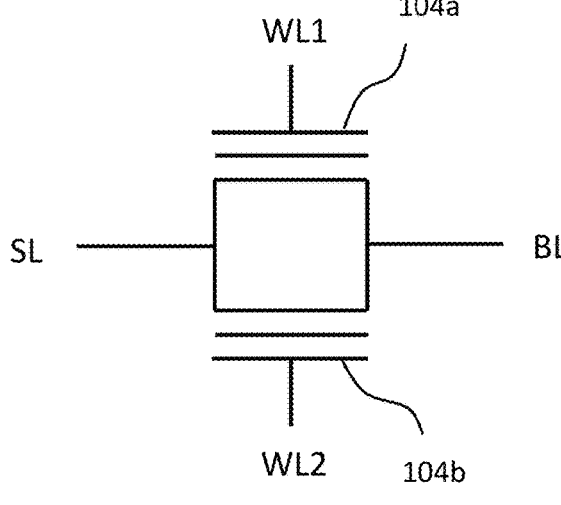
FIG. 12B shows a symbolic representation of a NOR-type flash memory cell.

FIG. 12B shows a symbolic representation of a NOR-type flash memory cell.

The cell comprises two gates 104a and 104b that can be connected to two different word lines (WL1 and WL2).

Referring to FIG. 12A, in one embodiment, the charge-trapping layers 160a and 160b comprise multiple layers 161a to 161c, such as oxide-nitride-oxide ONO layers. The data is stored in term of electrons 120a and 120b trapped in the nitride layer 161b of the charge-trapping layers 160a and 160b by using a programming operation. Because of the programming operation, the electrons 120a and 120b can be independently controlled by the gates 104a and 104b, respectively. The cell stores two data bits to increase the storage capacity. In another embodiment, the cell programs electrons (either 120a or 120b) in only one side (either 160a or 160b) to perform single-data storage.

For N-channel cells, the electrons trapped in the charge-trapping layers 160a and 160b increase the threshold voltage (Vt) of the cell. For P-channel cells, the electrons trapped in the charge-trapping layers 160a and 160b decrease the threshold voltage (Vt) of the cell. When the gates 104a and 104b are supplied with a read voltage, the cell current is determined by the threshold voltage of the cell. A cell having a higher threshold voltage will have higher impedance and conduct lower cell current. A cell having a lower threshold voltage will have lower impedance and conduct higher cell current. The impedance of the cell represents the 'weight' of a synapse in the artificial neural network array.

The embodiment shown in FIG. 12A can be programmed and erased by using conventional program and erase mechanisms, such as channel hot-electron (CHE) injection, Fowler-Nordheim (FN) tunneling, channel hot-hole injection, band-to-band tunneling (BTBT), gate-induced-drain-leakage (GIDL) assisted injection, or any other suitable programming mechanisms.

Figure 12C:
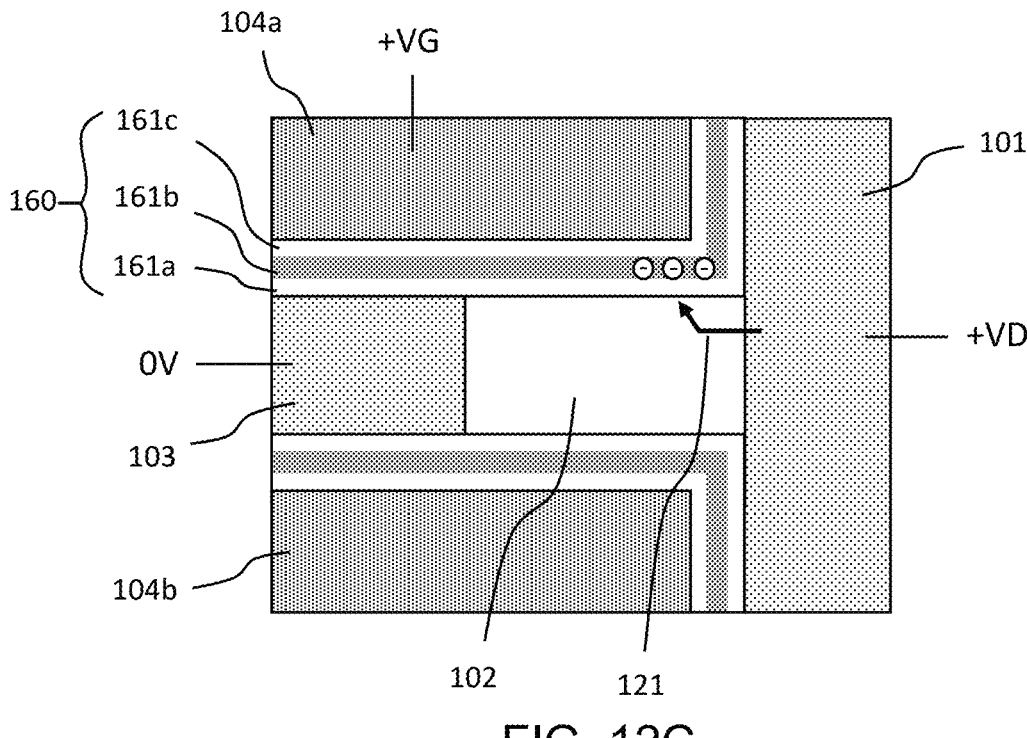
FIGS. 12C-E show embodiments of preferred program and erase operations according to the invention.
Figure 12D:
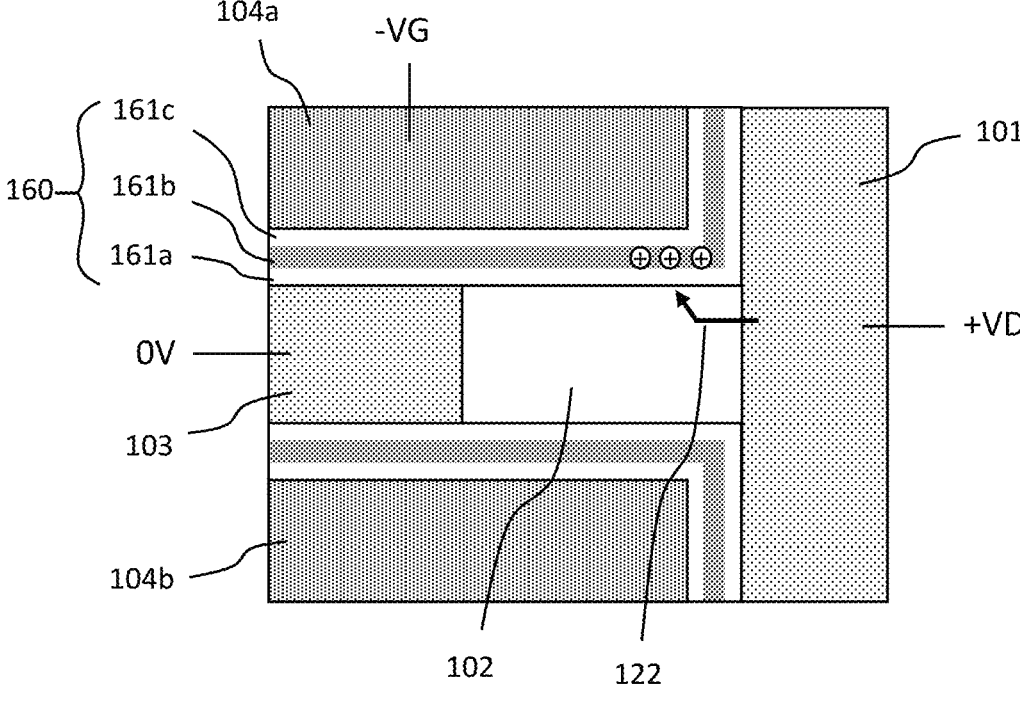
Figure 12E:
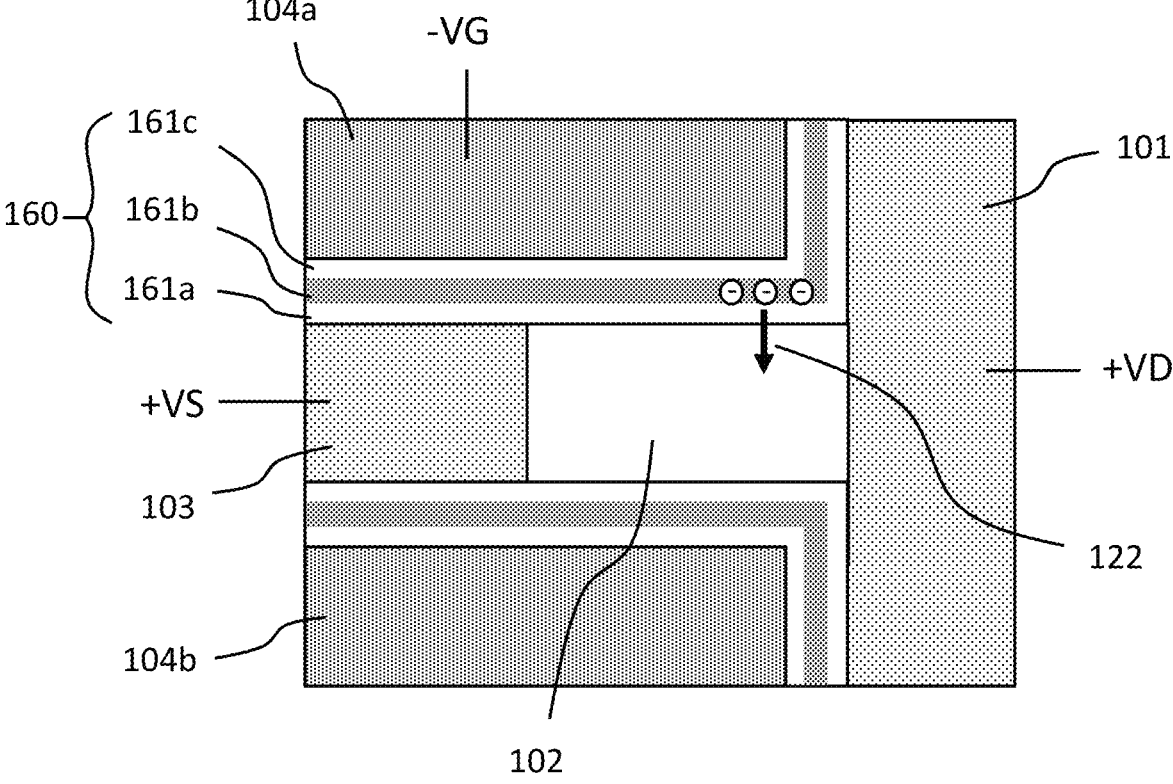

FIGS. 12C-E show embodiments of preferred program and erase operations according to the invention. However, other program and erase mechanisms can be used with the cell structures disclosed herein within the scope of the invention.

FIG. 12C shows an embodiment of a cell structure that illustrates programming operations using channel hot electron (CHE) injection. The word line 104a and bit line 101 are supplied with positive voltage +VG and +VD, such as 10V and 5V, respectively. The source line 103 is supplied with a low voltage, such as 0V. This configuration will cause current to flow through the channel and cause electrons to be injected into the charge-trapping layer 160 due to the high electric field applied to the word line 104a, as shown by the arrow 121. The electrons are trapped in the nitride layer 161b near the bit line 101 side to increase the threshold voltage of the cell.

FIG. 12D shows an embodiment of a cell structure that illustrates erase operations using hot-hole injection (HHI). The word line 104a and bit line 101 are supplied with a negative voltage (−VG), such as −5V and a positive voltage (+VD), such as +5V, respectively. The source line 103 is supplied with a low voltage such as 0V. This configuration will turn off the channel and cause band-to-band tunneling (BTBT) to occur in the drain side and cause holes to be injected to the charge-trapping layer 160 due to the high electric field applied to the word line 104a, as shown by the arrow 122. The holes neutralize the electrons trapped in nitride layer 161b near the bit line 101 side to decrease the threshold voltage of the cell.

Because the program and erase operations shown in FIGS. 12C-D both occurred on the bit line 101 side, the threshold voltage of the channel near the source line 103 side remains positive (Vt>0V), which is also known as an 'enhancement channel'. The enhancement channel will prevent the cell's Vt from being erased to below 0V which causes channel leakage current, known as the 'over-erase' problem. Therefore, the known 'over-erase' problem of the conventional NOR flash memory is eliminated by the enhancement channel.

FIG. 12E shows an embodiment of a cell structure that illustrates an erase operation using Fowler-Nordheim (FN) tunneling. In this embodiment, the word line, such as word line 104a is supplied with 0V or a negative voltage −VG, such as −5V to −10V. The bit line 101 and the source line 103 are supplied with the same positive high voltages +VD and +VS, such as +10V to +20V, respectively. The high voltage applied to the bit line 101 and source line 103a punches through the channel and passes the voltage to the floating body 102a. This creates a high electric field to cause the electrons stored in the nitride layer 160b to tunnel through the tunnel oxide layer 160a to the floating body 102a, as shown by the arrow 122. This configuration reduces the cell's threshold voltage.

In another embodiment, a positive high voltage, such as +10V to +20V is supplied to only one of the bit line 101 or source line 103. The other line is left floating. The high voltage punches through the channel to reach the floating line. Since the line is floating, there is no current flowing after the floating line is fully charged. The high voltage punched through to the floating body 102 causes FN tunneling to occur to erase the cell as described above.

In another embodiment, the cell structure shown in FIG. 12A is used in dual-mode application for both volatile and non-volatile data storage. For volatile data storage, the input data is stored in the floating bodies 102*a* and 102*b*. This increases the programming speed. Next, the data is programmed to the charge-trapping layer 160 for non-volatile data storage.

In accordance with embodiments of the invention, the 3D cell and array structures shown in the previous embodiments are used to implement a 3D neural network array for artificial intelligence (AI) applications.

Figure 13A:
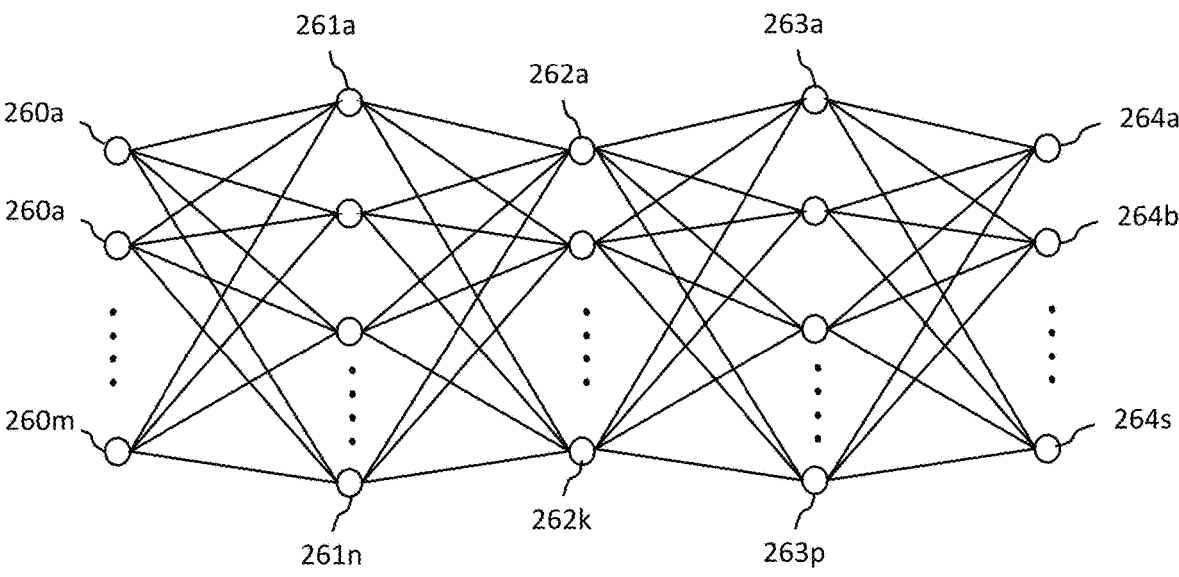
FIG. 13A shows an exemplary architecture for a neural network.

FIG. 13A shows an exemplary architecture for a neural network. The neural network comprises multiple layers of neurons 260*a-m* that form an input layer. The neural network also comprises neurons 264*a-s* that form an output layer. In one embodiment, multiple layers of neurons, such as neurons 261*a-n*, 262*a-k*, and 263*a-p* are provided as hidden layers between the input layer and the output layer. Each layer may have various numbers of neurons.

Figure 13B:
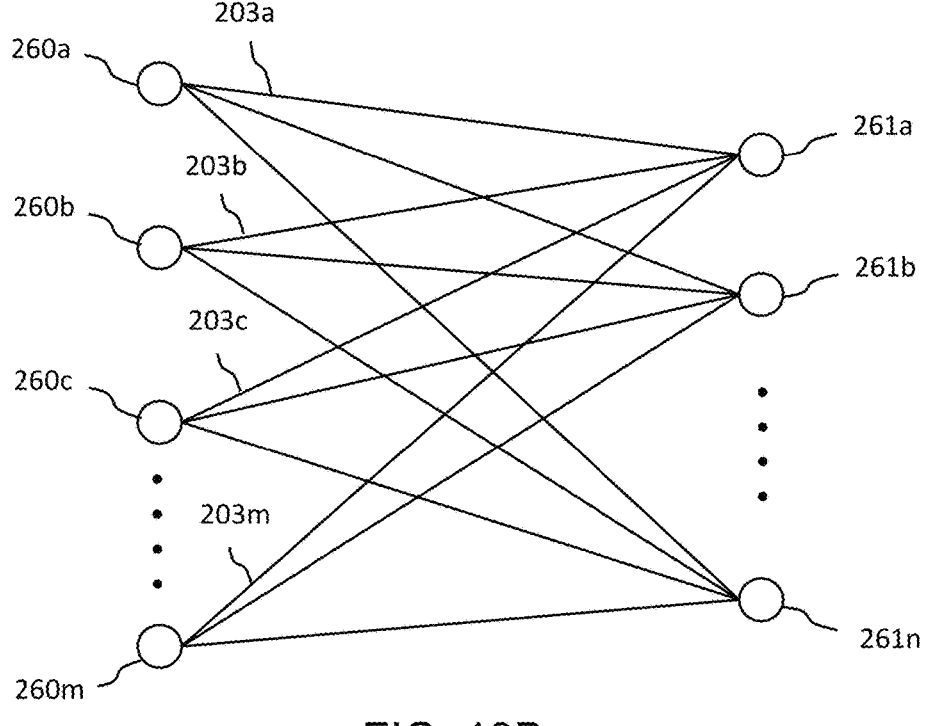
FIG. 13B shows one layer of a neural network that comprises input neurons and output neurons.

FIG. 13B shows one layer of a neural network that comprises input neurons 260*a-m* and output neurons 261*a-n*. Each of the output neurons 261*a-n* is connected to all the input neurons 260*a-m* through synapses 203*a-m*. Each synapse represents a value called a 'weight'. The weight determines effects on the signal from the input neuron to the output neuron. The value of the weight may be positive called a 'positive weight' or negative called a 'negative weight'.

An artificial neural network array comprises multiple neuron layers. The outputs of each layer are fed into the inputs of the next layer. The neural network can be trained to learn special tasks by changing the weights of each synapse through a training process.

Figures 13C, 13D:
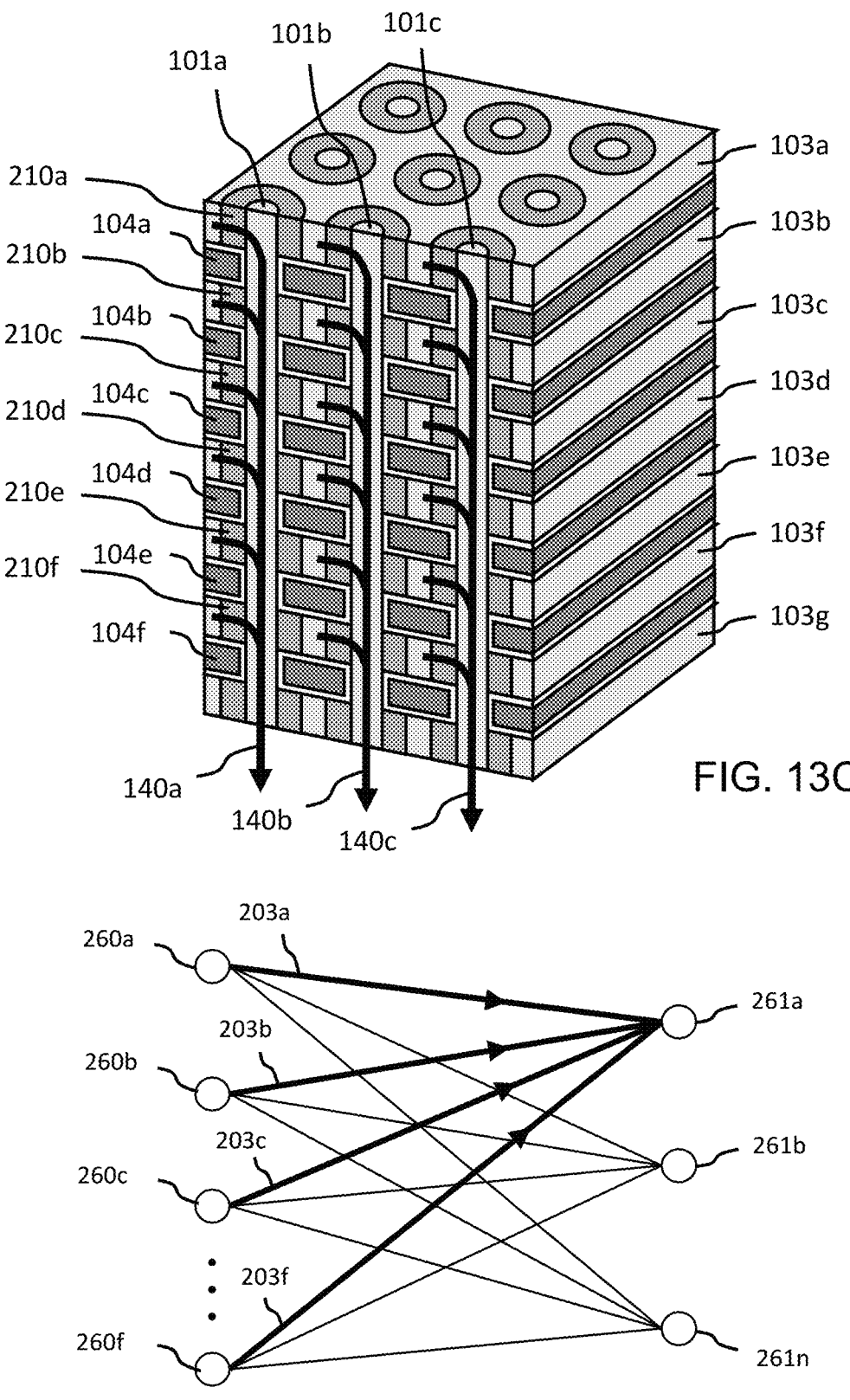
FIGS. 13C-D shows embodiments that demonstrate how a 3D cell array shown in FIG. 13C emulates the neural network shown in FIG. 13D.

FIGS. 13C-D shows embodiments that demonstrate how the 3D NOR-type cell array shown in FIG. 13C emulates the neural network shown in FIG. 13D.

As illustrated in FIG. 13C, the word lines 104*a* to 104*f* represent the input neurons 260*a* to 260*f* shown in FIG. 13D. The vertical bit lines 101*a* to 101*c* represent the output neurons 261*a* to 261*c*. The cells 210*a* to 210*f* represent the synapses 203*a* to 203*f*. The data stored in the cells 210*a* to 210*f* represent the 'weights' of the synapses 203*a* to 203*f*.

When the 3D array receives the input data, the word lines 104*a* to 104*f* are supplied with voltages according to the input data. For example, data 1 will supply a high voltage to turn on cells 210*a* to 210*f*, and data 0 will supply a low voltage to turn off cells 210*a* to 210. The data stored in cells 210*a* to 210*f* will determine the cell currents. For example, if the data is 1, the cell will conduct high current. If the data is 0, the cell will conduct low current.

The cell currents are summed in vertical bit line 101*a*, as illustrated by the arrow 140*a* shown in FIG. 13C. This emulates the summation function of output neuron 261*a*, as illustrated by the arrows shown in FIG. 13D.

Similarly, the cell currents summed in the vertical bit lines 101*b* and 101*c*, as illustrated by the arrows 140*b* and 140*c*, emulate the summation function of output neurons 261*b* and

261*c*. As a result, the function of the neural network shown in FIG. 13D are emulated by the 3D cell array shown in FIG. 13C.

Figure 14A:
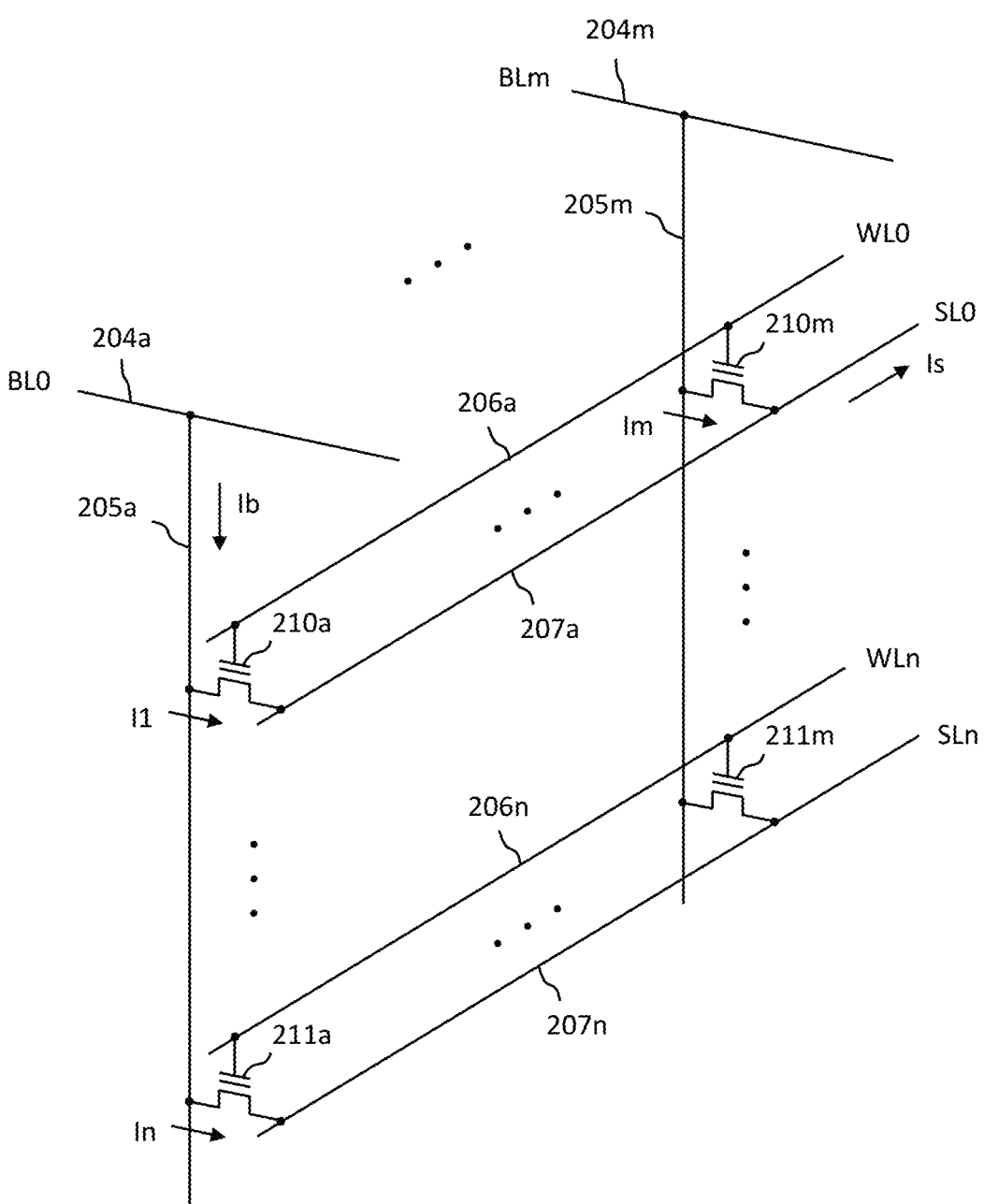
FIG. 14A shows an embodiment of a neural network array that is formed using the 3D array structure shown in FIG. 10A.

FIG. 14A shows an embodiment of a neural network array that is formed using the 3D NOR-type array structure shown in FIG. 10A. In one embodiment, horizontal bit lines 204*a-m* are connected to input neuron circuits (not shown). The input neuron circuits apply various voltages to the horizontal bit lines 204*a-m* according to the input data. The horizontal bit lines 204*a-m* are connected to multiple vertical bit lines 205*a-m*. The vertical bit lines 205*a-m* are connected to the source line 207*a* through multiple cells 210*a-m*. The word lines 206*a-n* are supplied with a constant read voltage to turn on the cells 210*a-m*. The source lines 207*a-n* are connected to output neuron circuits (not shown). The cells 210*a-m* represent the synapse. The threshold voltages of the cells 210*a-m* represent the weights of the synapses.

It will be assumed that the input data is applied to the bit lines 204*a-m* and that the word line 206*a* is selected. Electric current will flow from the bit lines 204*a-m* through the cells 210*a-m* to the source line 207*a*. The current flowing through the cells 210*a-n* depends on the threshold voltage of the cells. When the threshold voltage of the cells 210*a-n* is higher (or lower), the current flowing through the cells 210*a-n* is lower (or higher), respectively.

It will be assumed that the current flowing through the cells 210*a-m* is 'I1' to 'Im', respectively. The current flowing to the source line 207*a* is 'Is'. The source line current 'Is' will be equal to the sum of 'I1' to 'Im'. This configuration performs a summation function for in-memory-computing and neural network applications. By using this function, the array performs the calculations for in-memory-computing or forms an artificial neural network as shown in FIG. 13B. The horizontal bit lines 204*a-m* represent the input neurons 260*a-m* shown in FIG. 13B. The cells 210*a-m* represent the synapses 203*a-n* shown in FIG. 13B. The source lines 207*a-n* represent the output neurons 261*a-n* shown in FIG. 13B.

In another embodiment, the inputs are applied to the word lines 206*a-m* instead of the horizontal bit lines 204*a-m*. In this embodiment, the source lines 207*a-n* are supplied with a constant voltage, such as VDD or 0V. The word lines 206*a-b* are supplied with various voltages according to the input data. The word line voltages turn on the cells 210*a-a* to conduct cell current 'I1' to 'In', respectively. Assuming the current flow to or from the bit line 205*a* is 'Ib', the bit line current 'Ib' will equal to the sum of the cell currents 'I1' to 'In'. This performs a summation function for in-memory-computing and neural network application. By using this function, the array may be used to perform the calculations for in-memory-computing or for forming an artificial neural network as shown in FIG. 13B. In this embodiment, the word lines 206*a-n* represent the input neurons, and the horizontal bit lines 204*a-b* represents the output neurons.

In another embodiment, the inputs are applied to the source lines 207*a-n*. In this embodiment, the word lines 206*a-n* are supplied with a constant read voltage. The source lines 207*a-b* are supplied with various voltages according to the input data. The word line voltage turns on the cells 210*a-a* to conduct cell current 'I1' to 'In', respectively. It will be assumed that current flow to or from the bit line 205*a* is 'Ib'. The bit line current 'Ib' will equal to the sum of the cell currents 'I1' to 'In'. This configuration performs a summation function for in-memory-computing and neural network applications. By using this function, the array performs calculations for in-memory-computing or forms an artificial neural network as shown in FIG. 13B. In this embodiment, the source lines 207a-n represent the input neurons, and the horizontal bit lines 204a-b represent the output neurons.

Figure 14B:
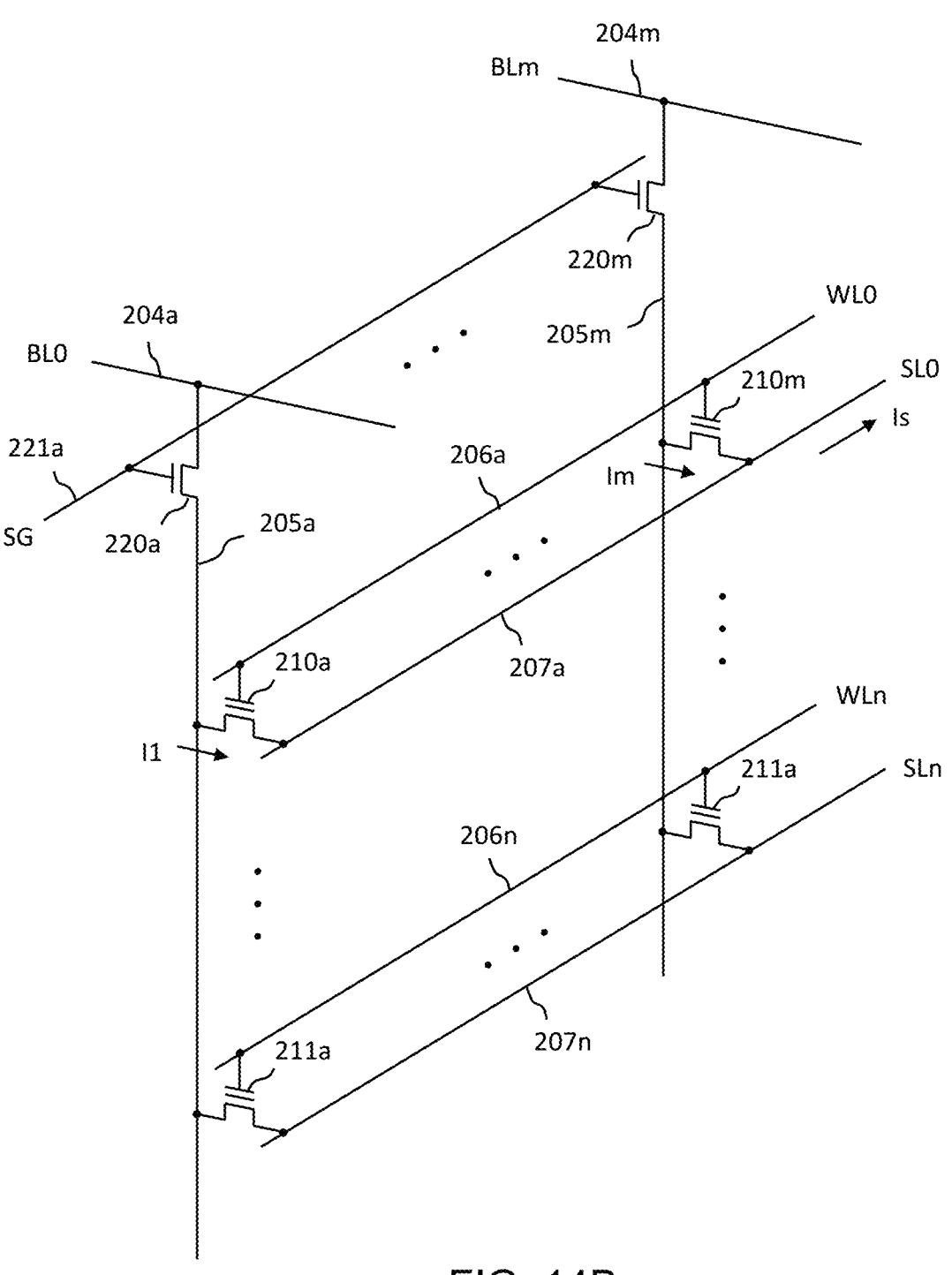
FIG. 14B shows an embodiment of a neural network array using the 3D array structure shown in FIG. 10B.

FIG. 14B shows an embodiment of a neural network array using the 3D array structure shown in FIG. 10B. This embodiment is similar to the embodiment shown in FIG. 14A except that the horizontal bit lines 204a-m are connected to the vertical bit lines 205a-m through the select gates 220a-m. This embodiment allows the word lines in the same layer to be connected as described in FIG. 10B. This greatly reduces the number of the word line decoders.

In another embodiment, the inputs are applied to the select gate signals 136a-k as shown in FIG. 10B. The select gate signals 136a-k are supplied with various voltages according to the input data. The horizontal bit lines 130a-n are connected to a constant voltage, such as VDD or 0V. The word lines 104a-m are supplied with a constant read voltage. Referring to FIG. 14B, the voltage of the select line 221a controls the current flowing through the select gates 220a-m. Then, current flows through the cells 210a-m to the source line 207a. The current flowing through the cells 210a-n depends on the threshold voltage (Vt) of the cells. When the threshold voltage of the cells 210a-n is higher (or lower), the current flowing through the cells 210a-n is lower (or higher), respectively.

Assuming the current flowing through the cells 210a-m is 'I1' to 'Im', respectively. The current flowing to the source line 207a is 'Is'. The source line current 'Is' will equal to the sum of 'I1' to 'Im'. This performs a summation function for in-memory-computing and neural network applications. By using this function, the array performs the calculations for in-memory-computing or forms an artificial neural network as shown in FIG. 13B. In this embodiment, the select lines, such as select line 221a represent the input neurons, and the source lines 207a-n represents the output neurons.

Figure 15A:
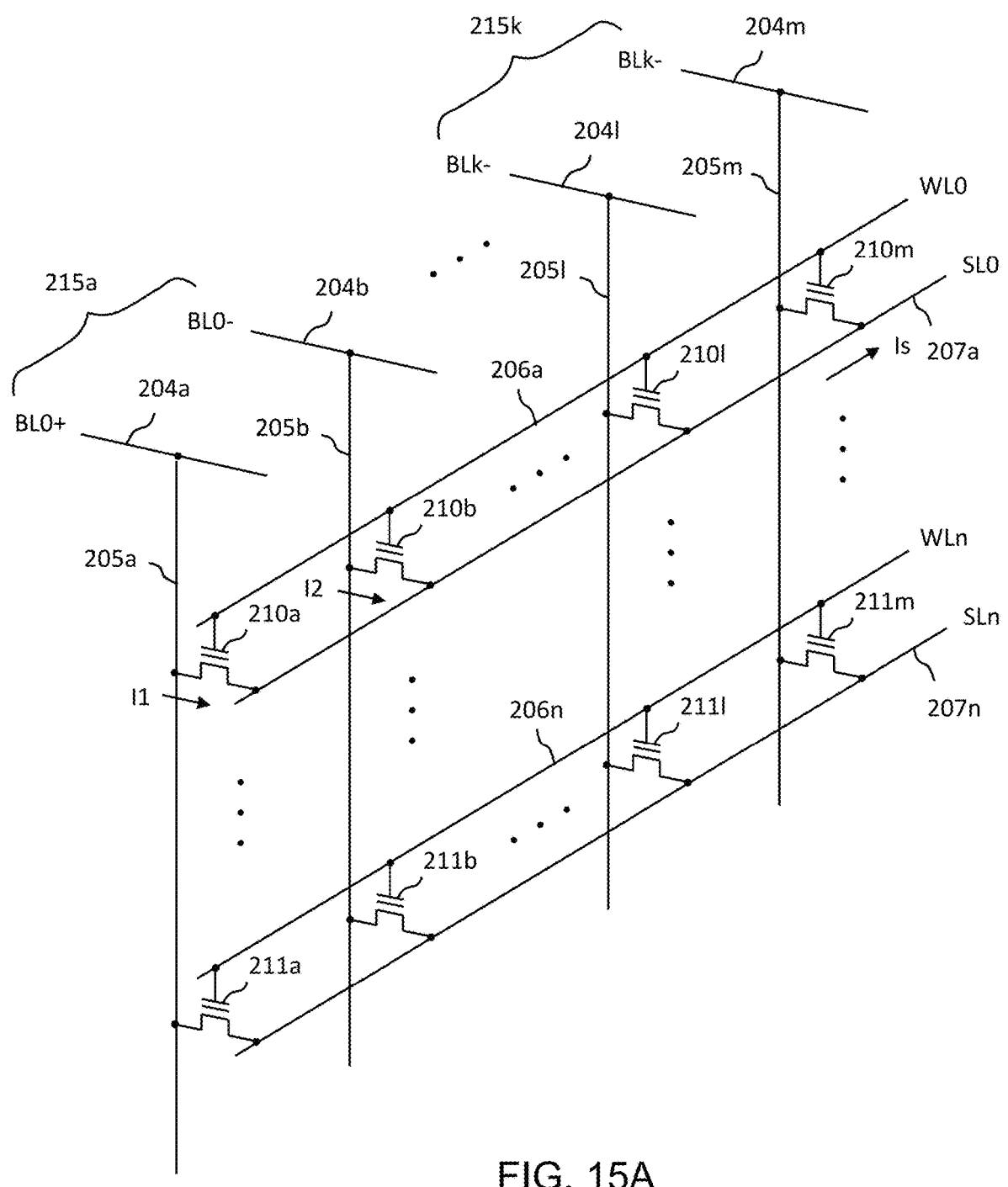
FIG. 15A shows an embodiment of a neural network array that provides 'negative' weights for the synapses of the neural network.

FIG. 15A shows an embodiment of a neural network array that provides 'negative' weights for the synapses of the neural network. The embodiment uses the 3D NOR-type array structure shown in FIG. 14A as an example. Aspects of this embodiment can be applied to the array structure shown in FIG. 14B as well.

As illustrated in FIG. 15A, the horizontal bit lines 204a-m are divided into multiple pairs 215a-k. Each pair of the bit lines are connected to an input neuron circuit (not shown) to apply complementary input voltages BL0+ and BL0− according to the input data to the bit line pair, such as bit line pair 204a and 204b, respectively. For example, assuming the input data is 1, the voltages applied to the bit lines 204a and 204b is VDD and 0V, respectively. Assuming the input data is 0, the voltages applied to the bit lines 204a and 204b is 0V and VDD, respectively.

The selected word line, such as word line 206a, is supplied with a read voltage to turn on the cells 210a and 210b to cause current to flow from the bit line pair 204a and 204b through the cells 210a and 210b to the source line 207a. Because the bit lines 204a and 204b are supplied with complementary voltages BL0+ and BL0−, the cells 210a and 210b represent a 'positive weight' and a 'negative weight' for the synapse, respectively.

For example, assuming that the current flowing through the cells 210a and 210b are 'I1' and 'I2', respectively. It will also be assumed that the bit lines 204a and 204b are supplied with VDD and 0V, respectively. When 'I1' is higher, the voltage of the source line 207a becomes higher. Therefore, the cell 210a represents a positive weight. On contrary, when 'I2' is higher, the voltage of the source line 207a becomes lower. Therefore, the cell 210b represents a negative weight.

As described in FIG. 14A, the current 'Is' flowing to the source line 207a equals to the sum of the currents flowing through the cells 210a-m. This configuration performs a summation function for in-memory-computing and neural network applications. The source lines 207a-n can be connected to output circuits (not shown) to perform in-memory-computing or to provide an output to output neuron circuits (not shown) to perform neural network functions.

Please notice, in another embodiment, the input and output direction are reversed. The source lines 207a-n are connected to the input neuron circuits to apply various voltages to the source lines 207a-n according to the input data. The bit lines 204a-m are connected to the output neuron circuits. The bit line pairs such as 204a and 204b are connected to the positive and negative inputs of the neuron circuit shown in FIG. 16B, respectively. In this way, the even cells, such as cells 210a and 2101 represent positive weights and the odd cells, such as cells 211b to 210m represent the negative weights.

Figure 15B:
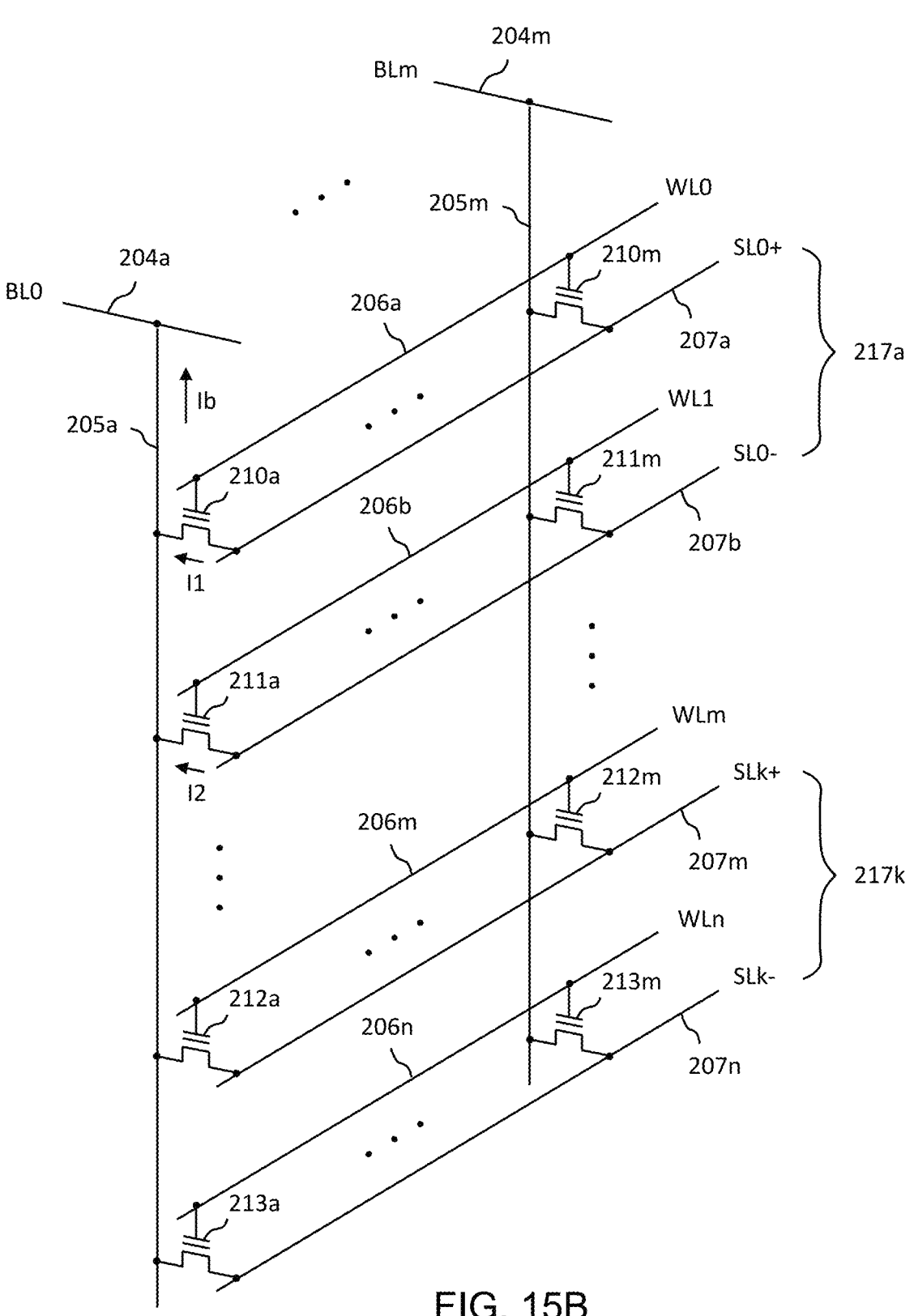
FIG. 15B shows an embodiment of a neural network array that provides 'negative' weights for the synapses of the neural network.

FIG. 15B shows an embodiment of a neural network array that provides 'negative' weights for the synapses of the neural network. The embodiment uses the 3D array structure shown in FIG. 14A as an example. Aspects of this embodiment are also applicable to the array structure shown in FIG. 14B as well.

In this embodiment, the source lines 207a-n are divided into multiple pairs 217a-k. Each pair of the source lines are connected to an input neuron circuit not shown to apply complementary input voltages SL0+ and SL0− according to the input data to the source line pair, such as source line pair 207a and 207b, respectively. For example, assuming the input data is 1, the voltages applied to the source lines 207a and 207b are VDD and 0V, respectively. Assuming the input data is 0, the voltages applied to the source lines 207a and 207b are 0V and VDD, respectively.

The word lines 206a and 206b are supplied with a read voltage to turn on the cells 210a and 211a to cause current to flow from the source line pair 207a and 207b through the cells 210a and 211a to the bit line 204a. Because the source lines 207a and 207b are supplied with complementary voltages SL0+ and SL0−, the cells 210a-m and 211a-m represent 'positive weights' and 'negative weights', respectively.

For example, assuming the current flowing through the cells 210a and 211a are 'I1' and 'I2', respectively. Also assume that the source lines 207a and 207b are supplied with VDD and 0V, respectively. When 'I1' is higher, the voltage of the bit line 204a becomes higher. Therefore, the cell 210a represents a positive weight. Alternatively, when 'I2' is higher, the voltage of the bit line 204a becomes lower. Therefore, the cell 211a represents a negative weight.

The current 'Ib' flowing to the bit line 204a equals to the sum of the current flowing through the cells 210a, 211a, . . ., 212a, to 213a. This configuration performs a summation function for in-memory-computing and neural network applications. The bit lines 204a-m can be connected to output circuits not shown to perform in-memory-computing or to output neuron circuits not shown to perform neural network functions.

In another embodiment, the input and output direction are reversed. The bit lines 204a-m are connected to the input neuron circuits to apply various voltages to the bit lines 204a-m according to the input data. The source lines 207a-n are connected to the output neuron circuits. The source line pairs, such as source line pairs 207a and 207b are connected to the positive and negative inputs of the neuron circuit shown in FIG. 16B, respectively. In this way, the cells 210a-m represent positive weights and the cells 211a-m represent negative weights.

Figure 15C:
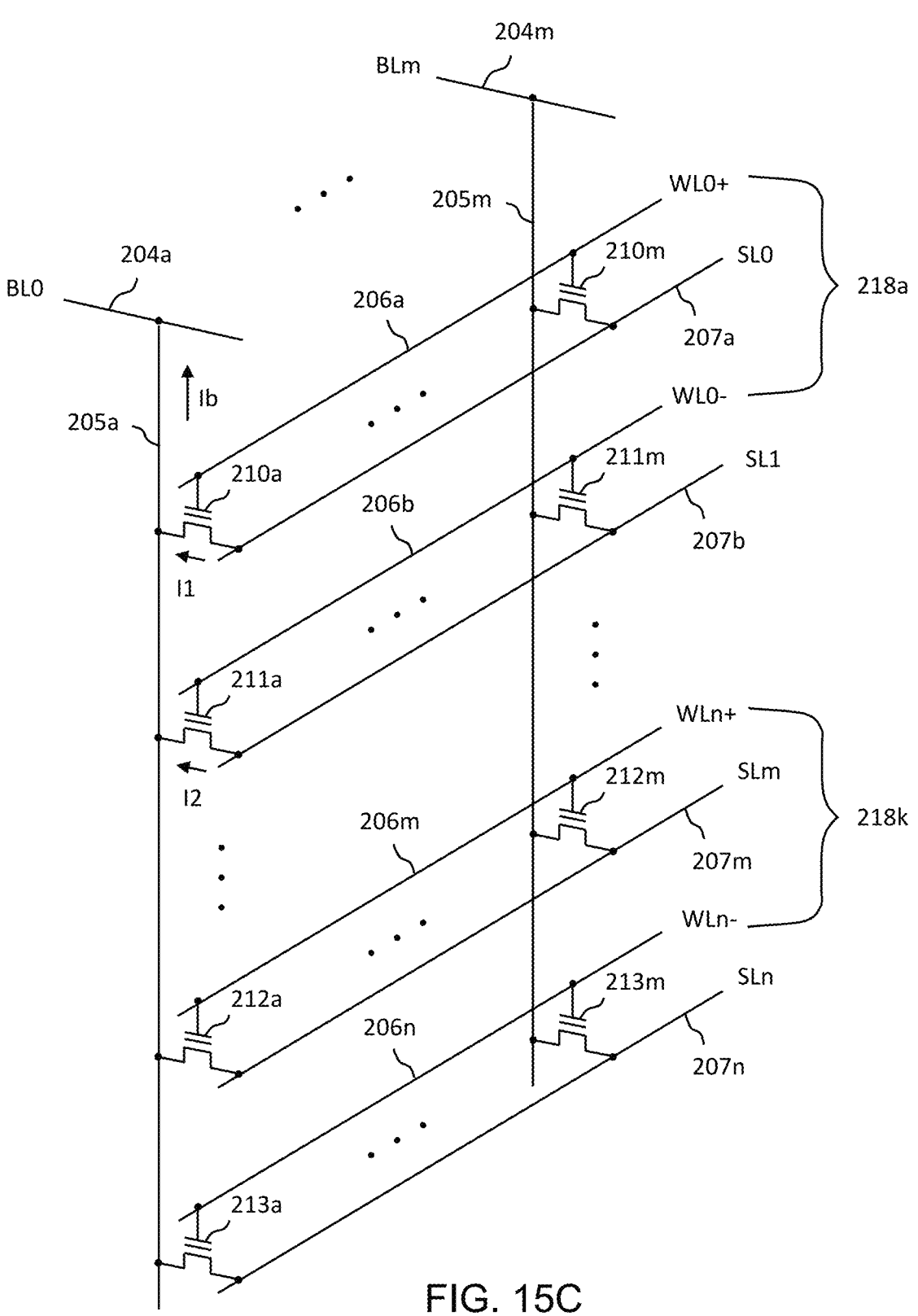
FIG. 15C shows an embodiment of a neural network array that provides 'negative' weights for the synapses of the neural network.

FIG. 15C shows an embodiment of a neural network array that provides 'negative' weights for the synapses of the neural network. This embodiment uses the 3D array structure shown in FIG. 14A as an example. Aspects of this embodiment are applicable to the array structure shown in FIG. 14B as well.

In this embodiment, the word lines 206a-n are divided into multiple pairs 218a-k. Each pair of the word lines are connected to an input neuron circuit not shown to supply complementary input voltages WL0+ and WL0− according to the input data to the word line pair, such as word line pair 206a and 206b, respectively. For example, assuming the input data is 1, the voltages supplied to the word lines 206a and 206b are VDD and 0V, respectively. Assuming the input data is 0, the voltages supplied to the word lines 206a and 206b are 0V and VDD, respectively.

For example, assuming the current flowing through the cells 210a and 211b are 'I1' and 'I2', respectively. The word lines 206a and 206b are supplied with voltages WL0+ and WL0− according to the input data, respectively. When the input data is higher, the cell current 'I1' becomes higher, and the voltage of the bit line 204a becomes higher. Therefore, the cell 210a represents a positive weight. Alternatively, when the input data is higher, the cell current 'I2' becomes lower, the voltage of the bit line 204a becomes lower. Therefore, the cell 211a represents a negative weight.

The current 'Ib' flowing to the bit line 204a is equal to the sum of the current flowing through the cells 210a to 213a. This configuration performs a summation function for in-memory-computing and neural network applications. The bit lines 204a-m can be connected to output circuits not shown to perform in-memory-computing or to output neuron circuits not shown to perform neural network functions.

In another embodiment, the input and output directions are reversed. The bit lines 204a-m are connected to the input neuron circuits to apply various voltages to the bit lines 204a-m according to the input data. The source lines 207a-n are connected to the output neuron circuits. In this configuration, the cells 210a-m represent positive weights and the cells 211a-m represent negative weights.

FIGS. 16A-D show embodiments of output circuits for in-memory-computing or for forming an output neuron circuit of a neural network.

Figure 16A:
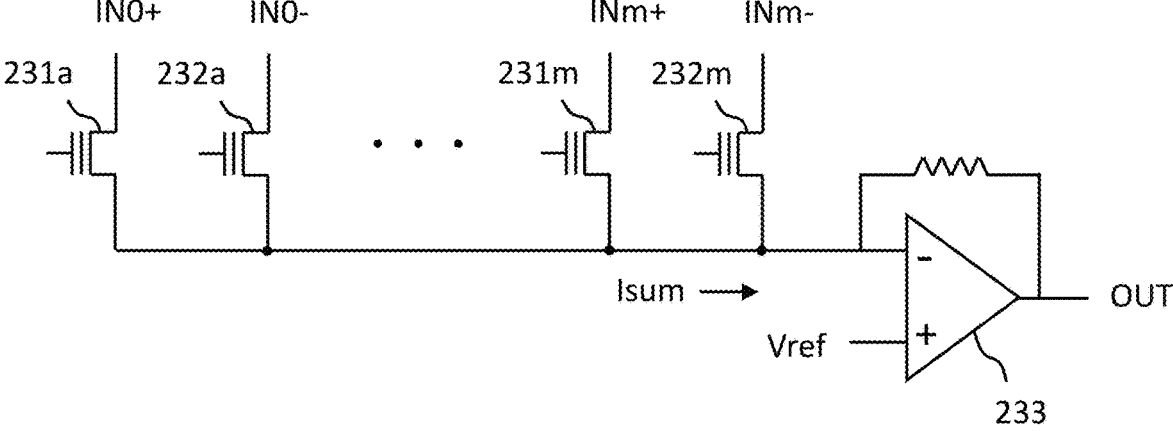
FIGS. 16A-D show embodiments of output circuits for in-memory-computing or for forming an output neuron circuit of a neural network.

FIG. 16A shows an embodiment of an output circuit using a single-input comparator 233. The cells 231a-m and 232a-m are described in the array embodiments shown in FIGS. 15A-C. The input data in divide into two groups, the original input data IN0+ to INm+ and their complementary data IN0− to INm−. The cells 231a-m are connected to input data IN0+ to INm+ and the cells 232a-m are connected to the complementary input data IN0− to INm−, respectively. When the input is higher, the cells 231a-m make the output lower, and the cells 232a-m make the output higher. Therefore, the cells 231a-m represent negative weights and the cells 232a-m represent positive weights, respectively. The summation of the cell current 'Isum' shown by the arrow is fed into the input of the comparator 233 to generate the output. In neural network applications, the output can be used as the input to the next layer.

Figure 16B:
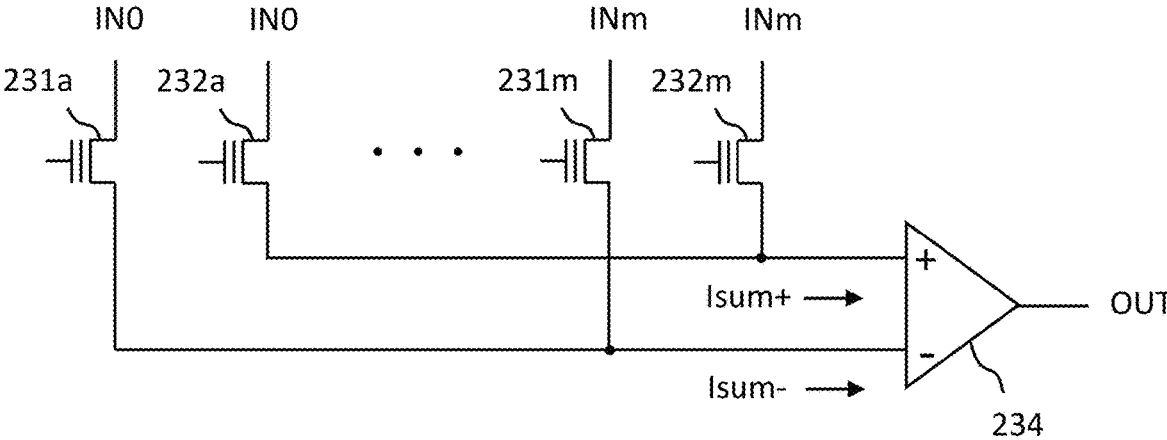

FIG. 16B shows an embodiment of an output circuit using a dual-input comparator 234. In this embodiment, both groups of the cells 231a-m and 232a-m are connected to the input data IN0 to INm. The outputs of the cells 231a-m are connected to the negative input of the comparator 234 and the outputs of the cells 232a-m are connected to the positive input of the comparator 234. When the input is higher, the cells 231a-m make the output lower, and the cells 232a-m make the output higher. Therefore, the cells 231a-m represent negative weights and the cells 232a-m represent positive weights, respectively. The summations of the cell current 'Isum+' and 'Isum−' (shown by the arrows) is fed into the positive and negative inputs of the comparator 234, respectively, to generate the output. In neural network applications, the output can be used as an input to the next layer.

Figure 16C:
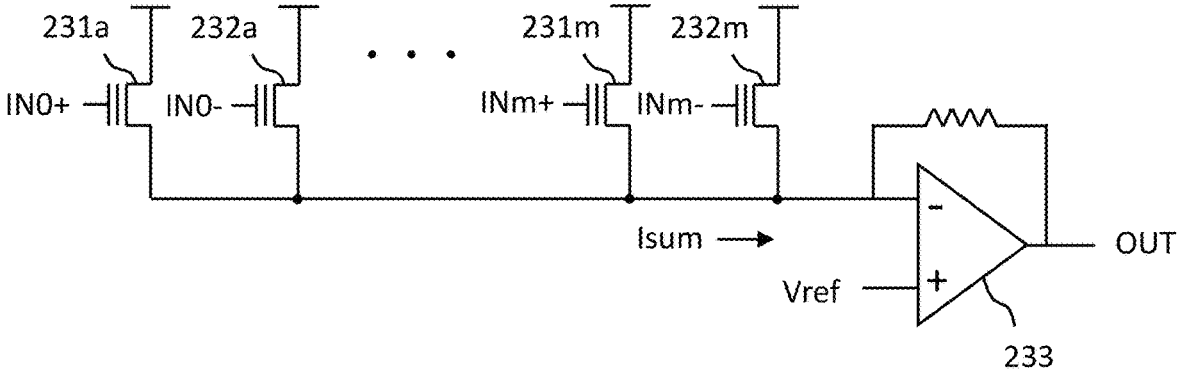

FIG. 16C shows another embodiment of an output circuit using a single-input comparator 233. This embodiment is similar to the embodiment shown in FIG. 16A except that the complementary inputs IN0+ to INm+ and IN0− to INm− are applied to the gates of the cells 231a-m and 232a-m, respectively. The source of the cells 231a-m and 232a-m are connected to a constant voltage, such as VDD. When the input is higher, the cells 231a-m make the output lower, and the cells 232a-m make the output higher. Therefore, the cells 231a-m represent positive weights and the cells 232a-m represent negative weights, respectively. The summation of the cell current 'Isum' (shown by the arrow) is fed into the input of the comparator 233 to generate the output. In neural network applications, the output can be used as an input to the next layer.

Figure 16D:
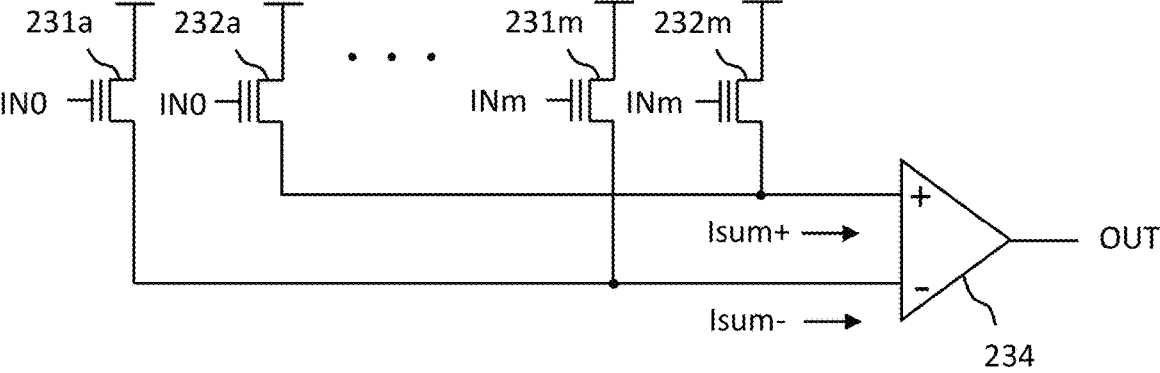

FIG. 16D shows an embodiment of an output circuit using a dual-input comparator 234. This embodiment is similar to the embodiment shown in FIG. 16B except that the complementary inputs IN0+ to INm+ and IN0− to INm− are applied to the gates of the cells 231a-m and 232a-m, respectively. The source of the cells 231a-m and 232a-m are connected to a constant voltage, such as VDD. The outputs of the cells 231a-m are connected to the negative input of the comparator 234 and the outputs of the cells 232a-m are connected to the positive input of the comparator 234. When the input is higher, the cells 231a-m make the output lower, and the cells 232a-m make the output higher. Therefore, the cells 231a-m represent negative weights and the cells 232a-m represent positive weights, respectively. The summations of the cell current 'Isum+' and 'Isum−' (shown by the arrows) is fed into the positive and negative inputs of the comparator 234, respectively, to generate the output. In neural network applications, the output can be used as an input to the next layer.

Figure 17A:
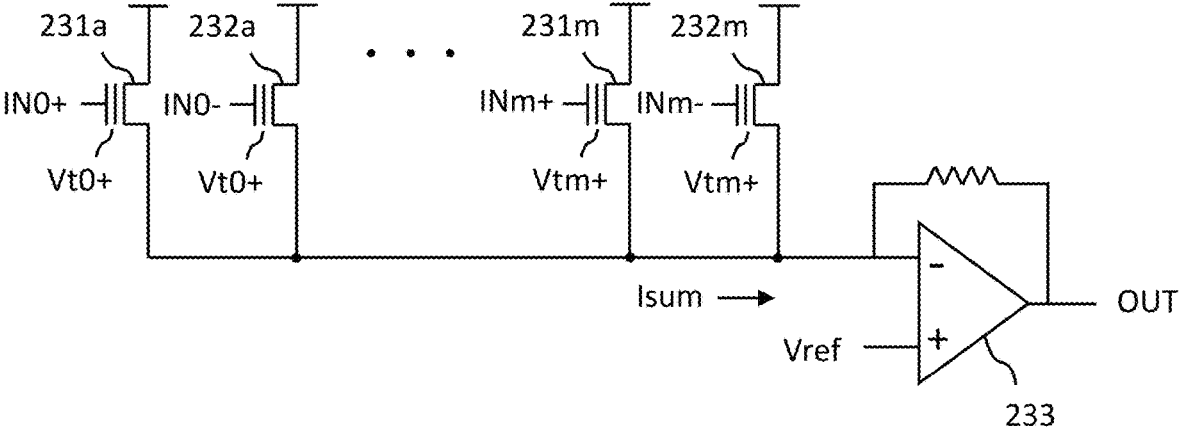
FIGS. 17A-B shows an embodiment of an output circuit that performs an analog matching function for in-memory computing applications.
Figure 17B:
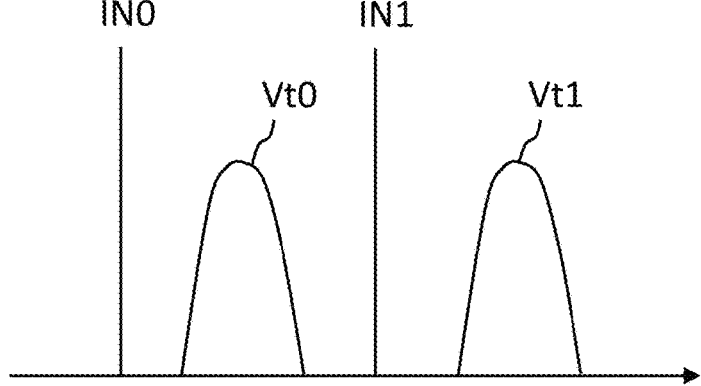

FIGS. 17A-B shows an embodiment of an output circuit that performs an analog matching function for in-memory computing applications, such as content-addressable memory (CAM) applications. This embodiment is similar to the embodiment shown in FIG. 16C except that the cells 231a-m are programmed to threshold voltages Vt0+ to Vtm+ to represent the stored data, and the cells 232a-m are programmed to threshold voltages Vt0− to Vtm− to represent the complementary stored data. During the operation, the gates of the cells 231a-m are supplied with the input data IN0+ to INm+ and the gates of the cells 232a-m are supplied with the complementary input date IN0− to INm− to match the data stored in the cells.

FIG. 17B shows a relationship between threshold voltages and input voltage. In this relationship, Vt0 and Vt1 show threshold voltage distributions of data 0 and 1 stored in the cells, respectively. Also shown are voltages IN0 and IN1 applied to the gates of the cells for data 0 and 1, respectively. It will be assumed that the cells 231a and 232a shown in FIG. 17A store data 0 and the complementary data 1, respectively. The threshold voltages of the cells 231a and 232a will be Vt0 and Vt1, respectively, as shown in FIG. 17B.

If the input data is 0, the gates of the cells 231a and 232a are supplied with IN0 and IN1, respectively. This configuration turns off both the cells 231a and 232a, thus the output of the comparator 233 becomes higher. This indicates that the input data matches the data stored in the cells. Similarly, when the cells store data 1 and the input data is 1, both the cells 231a and 232a will be turned off to pull high the output of the comparator 233.

If the input data is 1, the gates of the cells 231a and 231b are supplied with IN1 and IN0, respectively. This turns on the cell 231a because its gate is supplied with IN1 and its threshold voltage is Vt0. Therefore, the output of the comparator 233 will become lower. This indicates that the input data mismatches the data stored in the cells. Similarly, when the cells stored data 1 and the input data is 0, the cell 231b will be turned on to pull low the output of the comparator 233.

In one embodiment, the summation of the cell current 'Isum' shown by the arrow is fed into the input of the comparator 233 to generate the output. When more input data matches the data stored in the cells, the output of the comparator 233 becomes higher.

Although the embodiment shown in FIG. 17A use the circuit shown in FIG. 16C to implement the analog matching function, it is obvious that the other circuit shown in FIGS. 16A-D can be used with minor modifications. For simplicity, these examples will not be shown in separate drawings. It should also be noted that many other functions for in-memory computing, such as OR, NOR (not-OR), AND, NAND (not-AND), XOR (exclusive-OR), XNOR (exclusive-NOR), adding, and subtracting can be implemented by using the embodiments shown in FIGS. 16A-D and FIGS. 17A-B. For simplicity, these modifications will not be shown and described in detail. However, these modifications and variations shall remain on the scope of the invention.

Figure 18A:
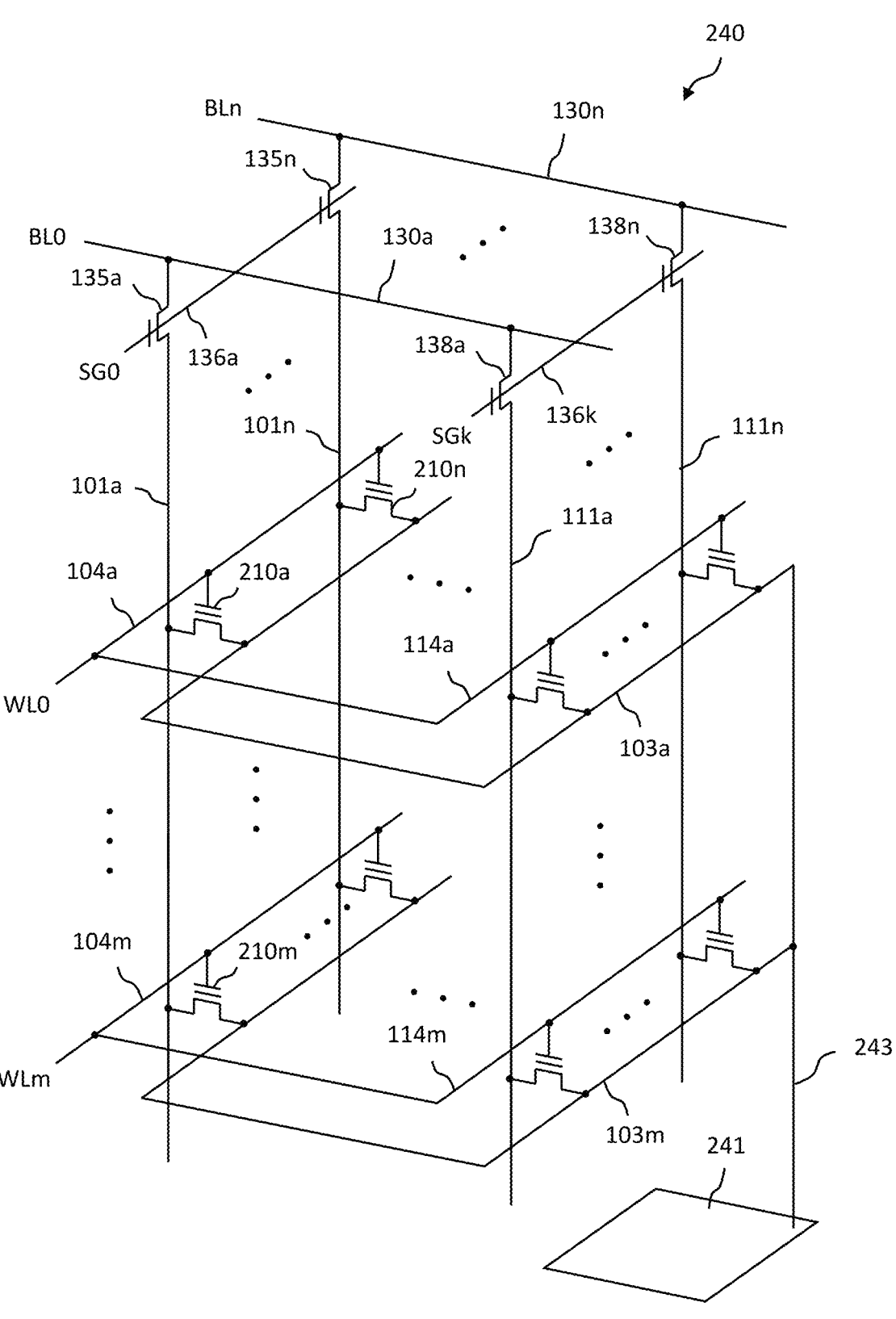
FIG. 18A shows an embodiment of a 3D array for in-memory-computing or neural network applications according to the invention.

FIG. 18A shows an embodiment of a 3D array for in-memory-computing or neural network applications according to the invention. The 3D array structure comprises a basic unit 240. The unit 240 is similar the 3D array shown in FIG. 10B except that it includes an output circuit 241 connected to the source lines 114a-m through a common source line 243. The output circuit 241 comprises a comparator, such as comparators 233 or 234 shown in FIGS. 16A-D. The output circuit 241 performs the function for in-memory computing or the function of the output neuron of neural networks.

The vertical bit lines 101a-n and 111a-n are connected to the horizontal bit lines 130a-n through the select gates 135a-n and 138a-n, respectively. The select gate signals 136a-k are connected to the gates of the select gates 135a-n and 138a-n, respectively. The select gate signals 136a-k select which set of vertical bit lines are to be coupled to the horizontal bit lines 130a-n. The horizontal bit lines 130a-n and the select gates 135a-n and 138a-n are located on the top or at the bottom of the array. Adding the select gates 135a-n and 138a-n enables the multiples word lines in the same layer, such as word lines 104a and 114a, and 104m and 114m to be connected. This greatly reduces the number of the word line decoders. The source lines 103a-m are connected to an output circuit 241. In one embodiment, the output circuit 241 is located under the 3D array to reduce the die size.

Figure 18B:
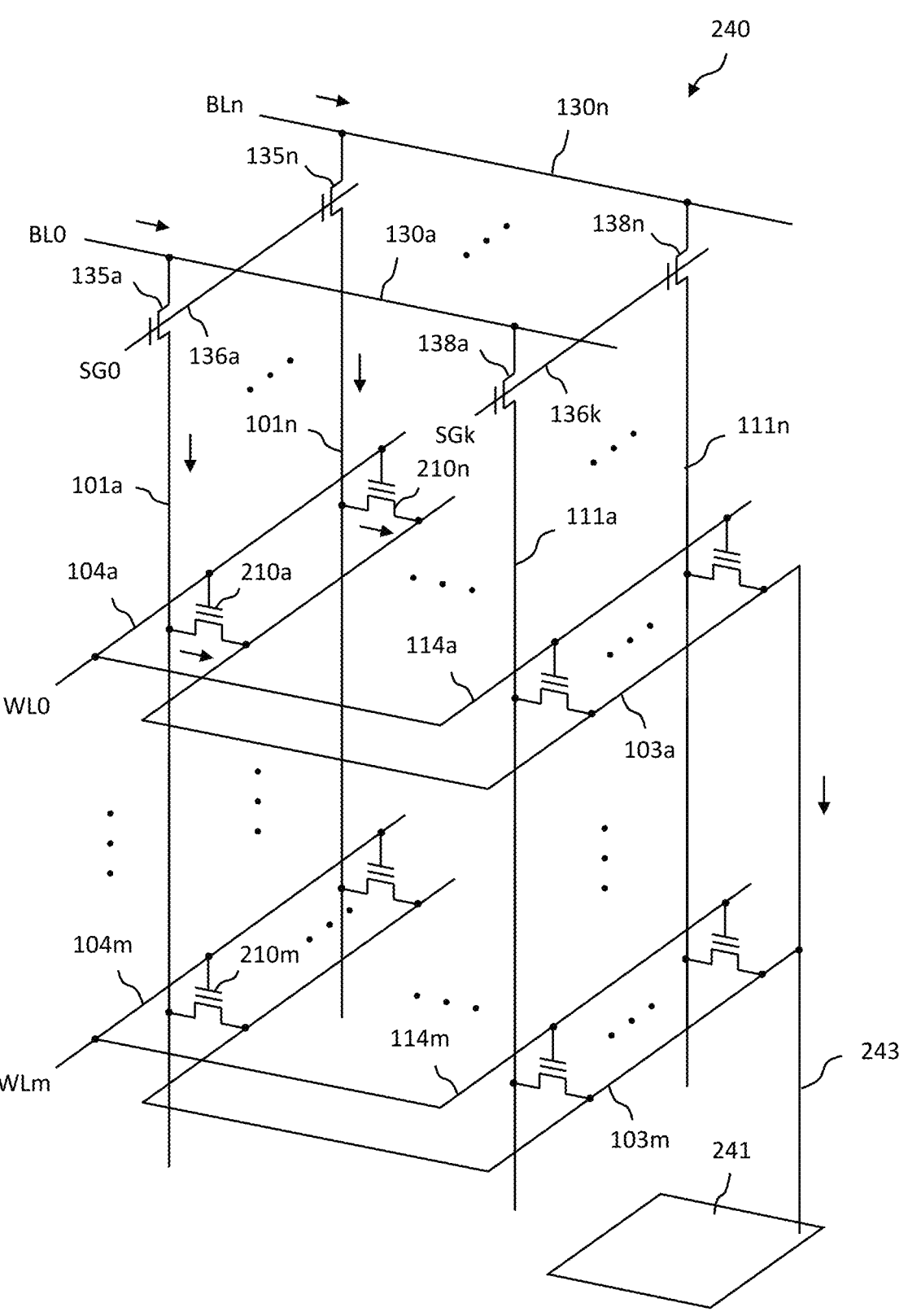
FIG. 18B shows a unit in which signal flow is indicated by arrows.

FIG. 18B shows a unit 240 in which signal flow during operation of the unit 240 is indicated by arrows. In one embodiment, the input data is applied to the bit lines 130a-n.

Assuming the select gate lines 136a is selected, current flows from the bit lines 130a-n through the select gates 135a-n to the vertical bit lines 101a-n. Assuming the word line 104a is selected, current flows through the cells 210a-n to the source line 103a. The current flowing through the cells 210a to 210n depends on the threshold voltage of the cells. When the threshold voltage of the cells 210a-n is higher (or lower), the current flowing through the cells 210a-n is lower (or higher), respectively. Next, the sum of the current flowing through the cells 210a-n is applied to the output circuit 241 through the common source line 243. The output circuit 241 perform in-memory-computing functions or output neuron functions as shown in FIGS. 16A-D and FIGS. 17A-B.

Figure 19A:
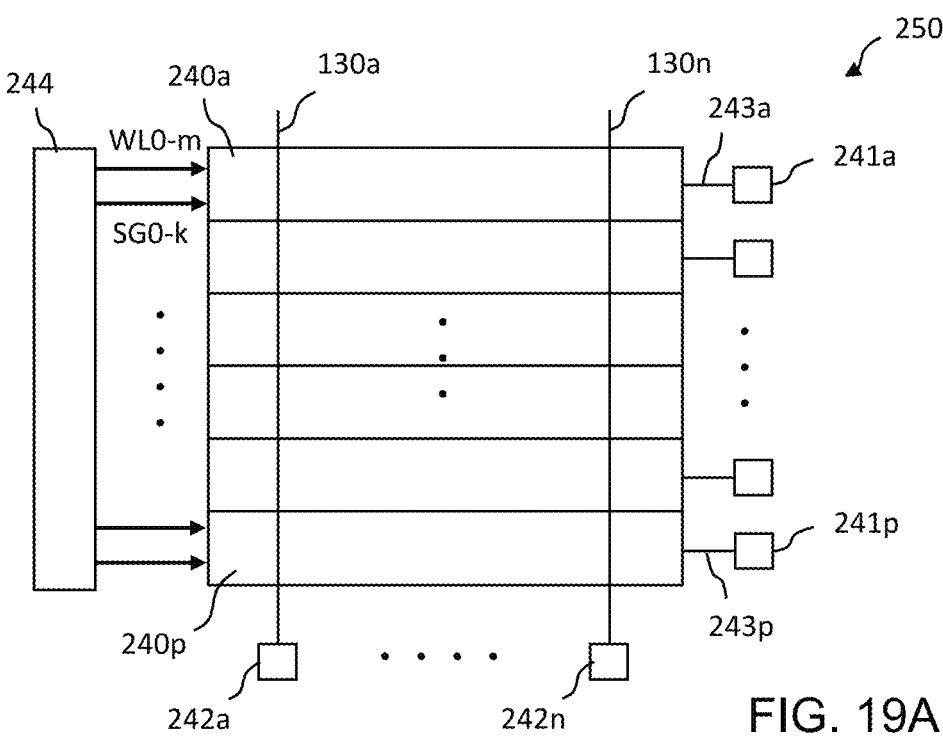
FIG. 19A shows an embodiment of an array architecture according to the invention.

FIG. 19A shows an embodiment of an array architecture 250 according to the invention. The array comprises multiple units 240a-p as shown in FIG. 18A. The source lines 243a-p of the units 240a-p are connected to output circuits 241a-p as shown in FIG. 18A. The units 240a-p are connected to the bit lines 130a-n. The bit lines 130a-n are connected to input circuits 242a-n. The word lines WL0-WLm, such as word lines 104a-m shown in FIG. 18A and the select gate signals SG0-SGk, such as select gates 136a-k shown in FIG. 18A of each unit 240a-p are connected to a word line and select gate decoder circuit 244.

Figure 19B:
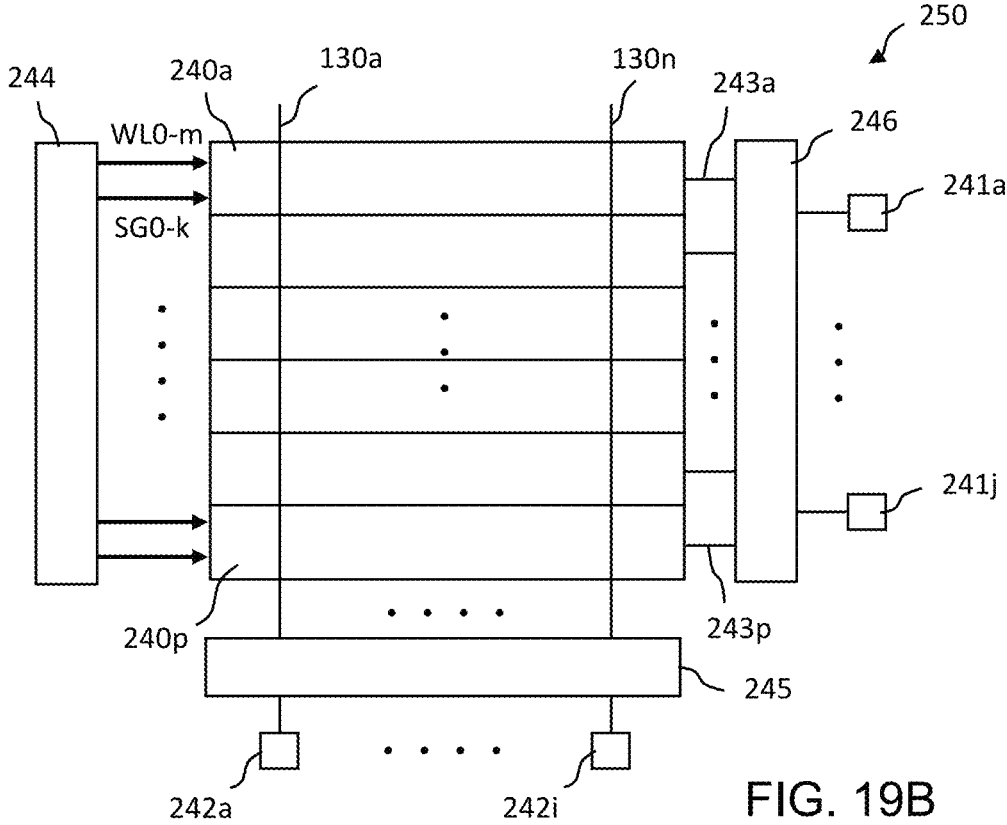
FIG. 19B shows an embodiment of an array architecture according to the invention.

FIG. 19B shows an embodiment of an array architecture 250 according to the invention. This embodiment is similar to the embodiment shown in FIG. 19A except that a bit line decoder 245 and a source line decoder 246 are added. The bit line decoder 245 selects partial bit lines 130a-n to be connected to the input circuits 242a-i. The source line decoder 246 selects partial source lines 243a-p to be connected to the output circuits 241a-j. This configuration reduces the number of the input circuits 242a-j and the output circuits 241a-j to reduce the die size.

According to the invention, the word line and select gate decoder 244, bit line decoder 245, and source line decoder 246 have multiple-select functions. They select any number of the units, bit lines, and source lines in any locations according to required tasks.

During operation, the word line and select gate decoder 244 select multiple units. The word line and select gate decoder 244 select one word line and one select gate in each selected unit. The input circuits 242a-i supply inputs to the selected bit lines 130a-n through the bit line decoder 245 to the selected units 240a-p to generate the outputs. The outputs are sent to the output circuits 241a-j selected by the source line decoder 246. By using this configuration, in-memory-computing can be performed or a neural network with any number of inputs and outputs can be implemented.

Figures 20A, 20B:
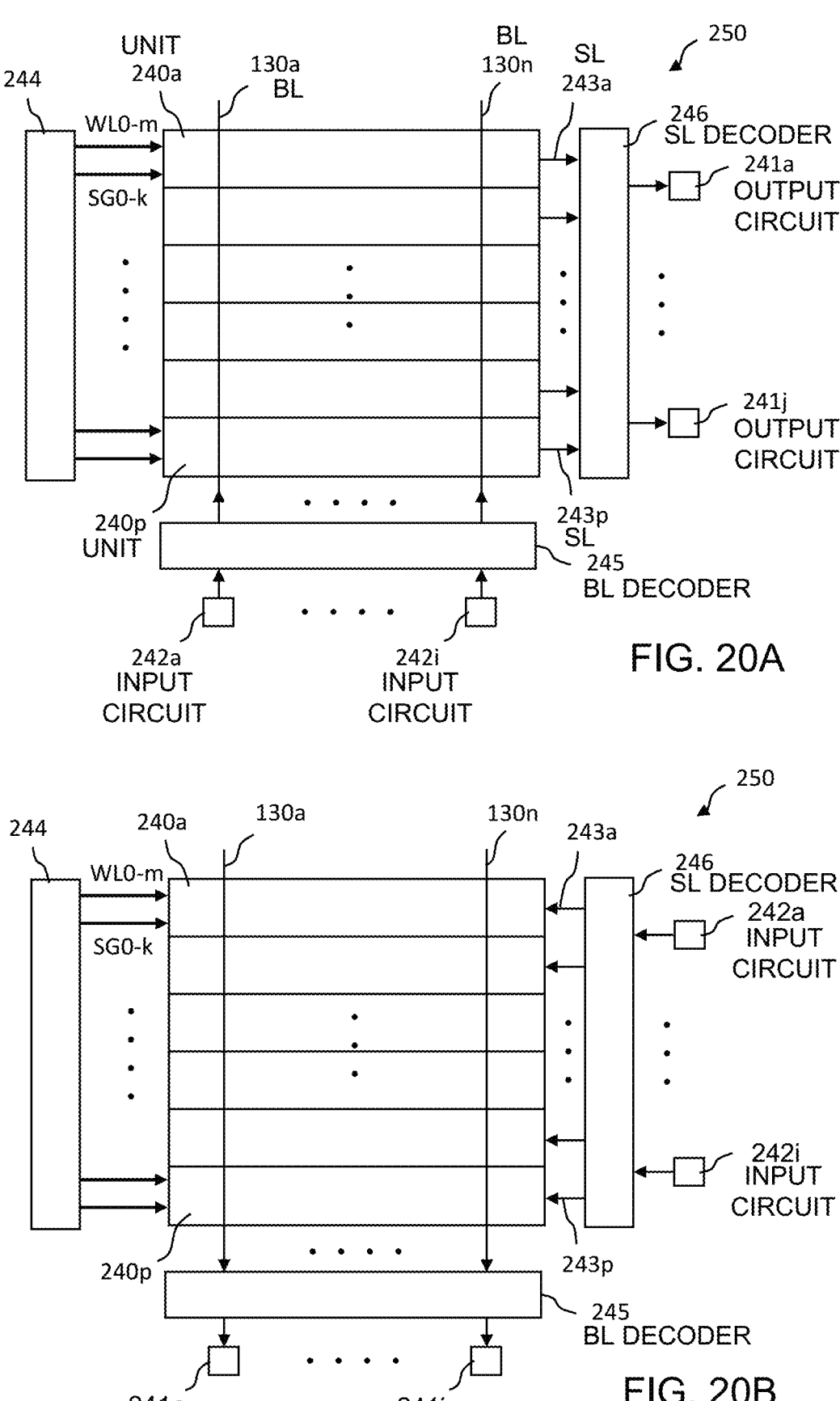
FIG. 20A shows signal flow of an embodiment of an array architecture according to the invention.
FIG. 20B shows an embodiment of an array architecture in which the signal flow is reversed.

FIG. 20A shows signal flow of an embodiment of an array architecture comprising units 240a-p according to the invention. For example, the units 240a-p represent embodiments of the unit 240 shown in FIG. 18B. As shown by the arrows, the signals flow from the input circuits 242a-i through the bit line decoder 245 to the selected bit lines 130a-n to selected units 240a-p. The output signals flow from selected units 240a-p through the source lines 243a-p to the source line decoder 246 to the output circuits 241a-j.

FIG. 20B shows an embodiment of an array architecture in which the signal flow is reversed. In this embodiment, the input circuits 242a-i are connected to the source line decoder 246 and the output circuits 241a-j are connected to the bit line decoder 245. As shown by the arrows, the signals flows from the input circuits 242a-i through the source line decoder 246 to the selected source lines 243a-p to the selected units 240a-p. The output signals flow from the selected units 240a-p through the bit lines 130a-n through the bit line decoder 245 to the output circuits 241a-j.

It should be noted that for neural network applications, signals usually flow in two directions, called 'forward-propagation' and 'back-propagation'. The forward-propagation is used to generate the output based on the current weights of the synapses. The back-propagation is used to calculate the output error of each neuron for adjusting the weights of the synapses during the training operations. For this application, the input circuits 242a-i and the output circuits 241a-j are designed to allow the signals to flow in both directions. Then, the signal flows shown in FIG. 20A and FIG. 20B are used in the forward-propagation and back-propagation operations, respectively.

Figure 20C:
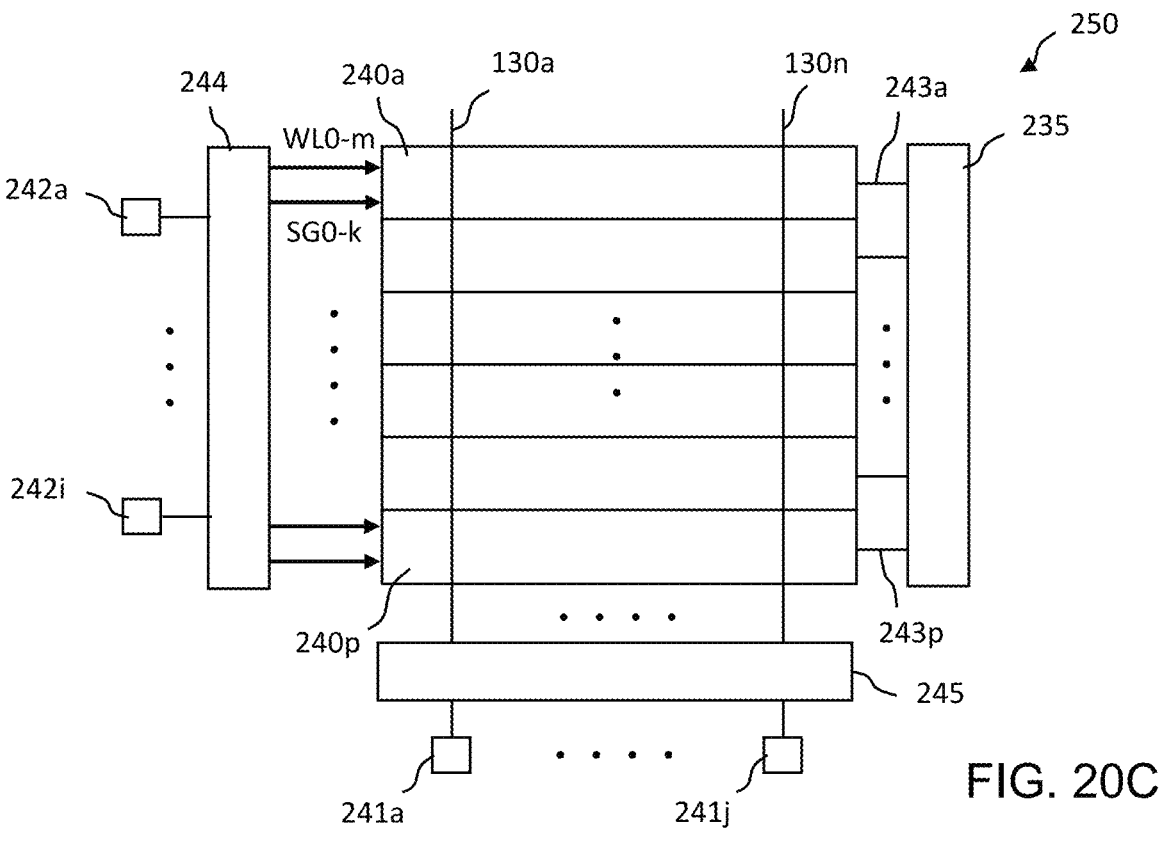
FIG. 20C shows an embodiment of an array architecture according to the invention.

FIG. 20C shows an embodiment of an array architecture 250 according to the invention. This embodiment is similar to the embodiment shown in FIG. 19B except that the input circuits 242a to 242i are connected to the word line and select gate decoder 244. The word line and select gate decoder 244 selects multiple word lines to be connected to the input circuits 242a to 242i. The input neurons 242a to 242i supply inputs to the selected word lines to perform the operations shown in FIG. 15C. The source line driver 235 applies a current to the selected source lines 243a to 243p. The current flows through the selected cells to the bit lines 130a to 130n and the bit line decoder 245 to the output circuits 241a to 241j.

Figure 20D:
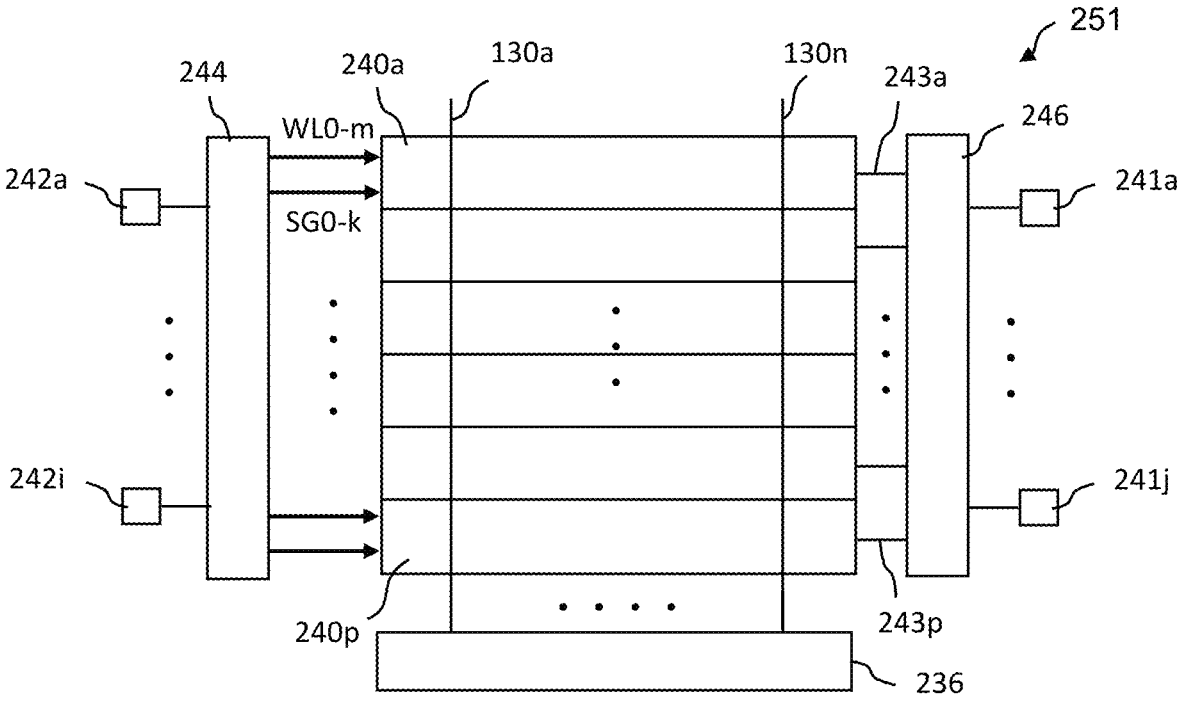
FIG. 20D shows an embodiment of the array architecture according to the invention.

FIG. 20D shows an embodiment of the array architecture 251 according to the invention. This embodiment is similar to the embodiment shown in FIG. 20C except that the output circuits 241a to 241j are connected to the source line decoder 246 instead of the word line and select gate decoder 244. The source line decoder 246 selects multiple source lines 243a to 243p to be connected to the output circuits 241a to 241j. The input neurons 242a to 242i apply inputs to the selected word lines to perform the operations shown in FIG. 15C. The bit line driver 236 applies a current to the selected bit lines 130a to 130n. The current flows through the selected cells to the source lines 243a to 243p and the source line decoder 246 to the output circuits 241a to 241j.

Figure 21A:
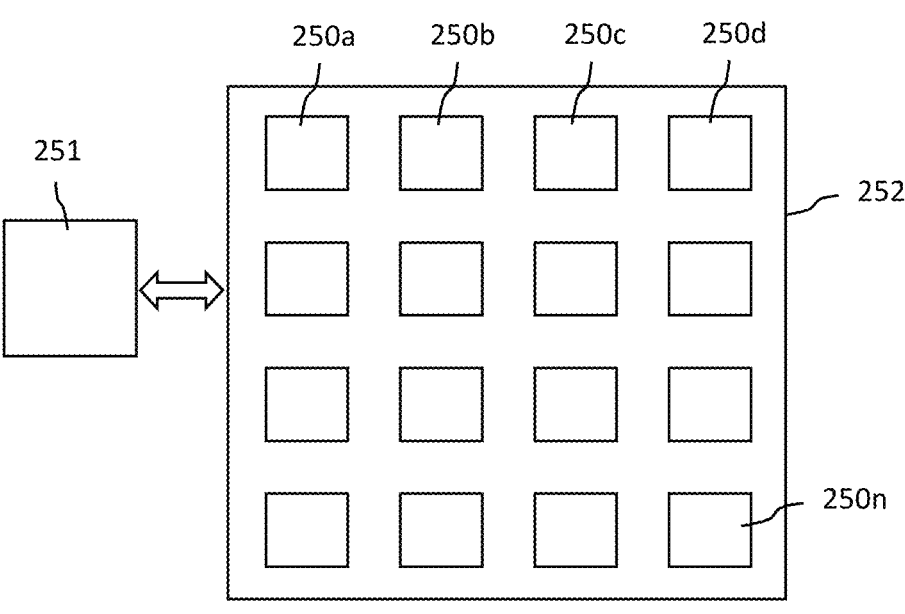
FIGS. 21A-C show embodiments of architectures of a neural network chip or an in-memory-computing chip according to the invention.
Figure 21B:
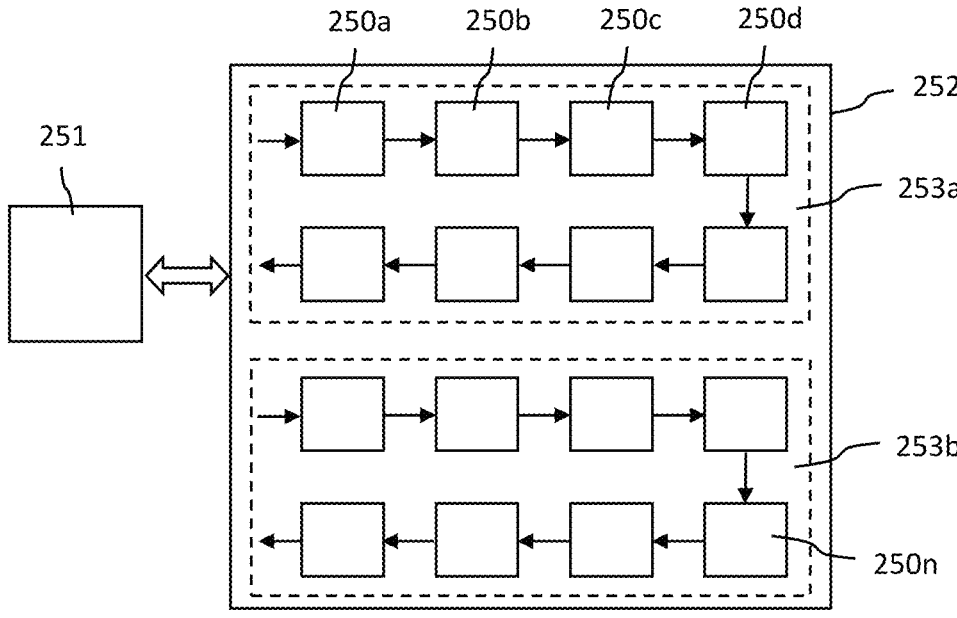
Figure 21C:
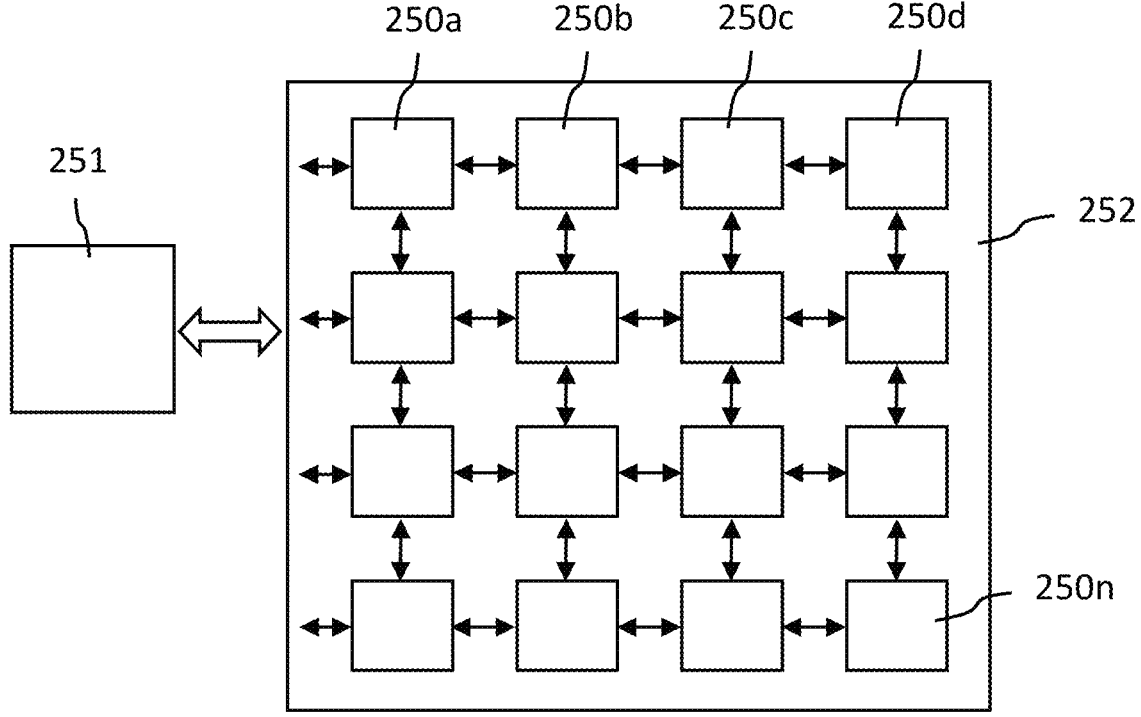

FIGS. 21A-C show embodiments of architectures of a neural network chip or an in-memory-computing chip according to the invention.

FIG. 21A shows an embodiment of an architecture for an in-memory-computing chip. In one embodiment, the chip comprises a logic unit 251 and a computing unit 252. The logic unit 251 comprises the input/output (I/O), data registers, control logic, decoders, voltage generator, center processing unit (CPU), arithmetic-logic unit (ALU), program memory, and any other units that control the basic operations of the chip.

The computing unit 252 comprises multiple arrays 250a-n, such as the one shown in FIG. 19A or FIG. 19B. The logic unit 251 feeds the data into the computing unit 252 to perform in-memory computing operations and then returns the output data to the logic unit 251. The multiple arrays 250a-n allows large quantity of data to be computed in parallel to enhance the performance of the chip.

FIG. 21B shows an embodiment of an architecture for a neural network chip. The chip comprises a logic unit 251 and a computing unit 252 like the one shown in FIG. 21A. The computing unit 252 comprises multiple arrays 250a-n, such as the one shown in FIG. 19A or FIG. 19B. The multiple arrays 250a-n are connected to form multi-layer neural networks, such as 253a and 253b. This architecture allows large quantity of the data to be processed in parallel to enhance the performance of the chip.

FIG. 21C shows an embodiment of an architecture for a neural network chip. This embodiment is similar to the embodiment shown in FIG. 21B except that the multiple arrays 250a-n are connected using bi-directional input/output, as shown by the arrows. The conventional bi-directional input/output buffers are used between the adjacent arrays 250a-n to implement this architecture. The direction of the input/output of each array 250a-n is freely configured by the control of the logic unit 251. This allows the arrays 250a-n to form multi-layer neural networks with any number of the layers and any direction of signal flow. This greatly increases the flexibility of the configuration of neural networks.

Figure 22:
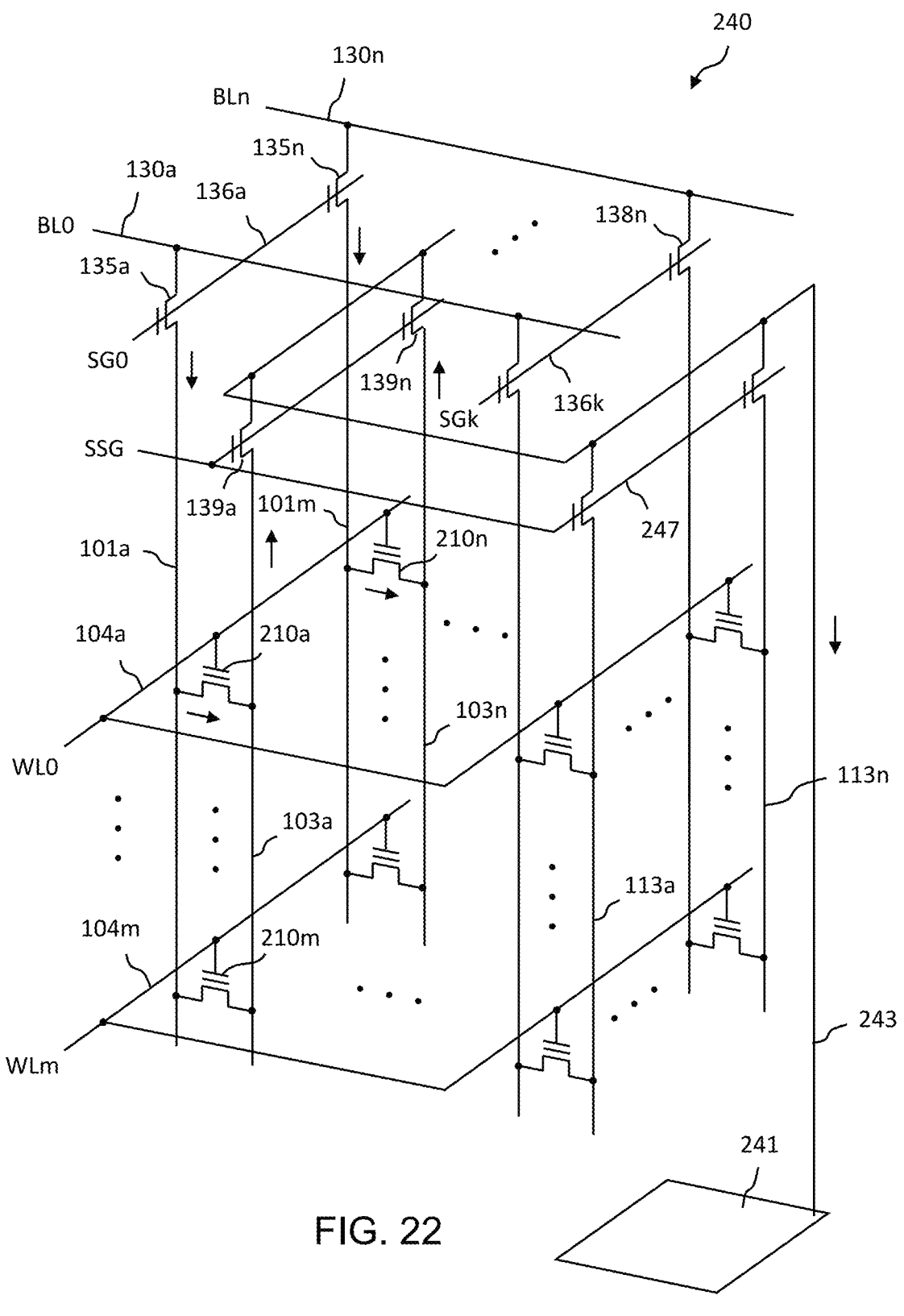
FIG. 22 shows an embodiment of a 3D array unit for in-memory-computing or neural network applications according to the invention.

FIG. 22 shows an embodiment of a 3D array unit 240 for in-memory-computing or neural network applications according to the invention. This array unit 240 is similar to the embodiment shown in FIG. 18A except that the source lines 103a-m and 113a-m are formed in a vertical direction instead of a horizontal direction. This array structure with parallel bit lines 101a-m and source lines 103a-m is also known as a 'AND' array.

The arrows show the signal flows of this embodiment during operation. In one embodiment, the input data are applied to the bit lines 130a-n. Assuming the select gate line 136a is selected, the current flows from the bit lines 130a-n through the select gates 135a-n to the vertical bit lines 101a-n. Assuming the word line 104a is selected, the current flows through the cells 210a-n to the source lines 103a-m. The source line select gate signal 247 is selected to turn on the source line select gates 139a-n to pass the current from the source lines 103a-m to the common source line 243. The common source line 243 is connected to the output circuit 241 to perform the in-memory-computing function or the output neuron functions as shown in FIGS. 16A-D and FIGS. 17A-B.

The current flowing through the cells 210a to 210n depends on the threshold voltage of the cells. When the threshold voltage of the cells 210a-n is higher (or lower), the current flowing through the cells 210a-n is lower (or higher), respectively. Then, the sum of the current flowing through the cells 210a-n is applied to the output circuit 241 through the common source line 243. The output circuit 241 performs the in-memory-computing functions or the output neuron functions shown in FIGS. 16A-D and FIGS. 17A-B.

Figure 23:
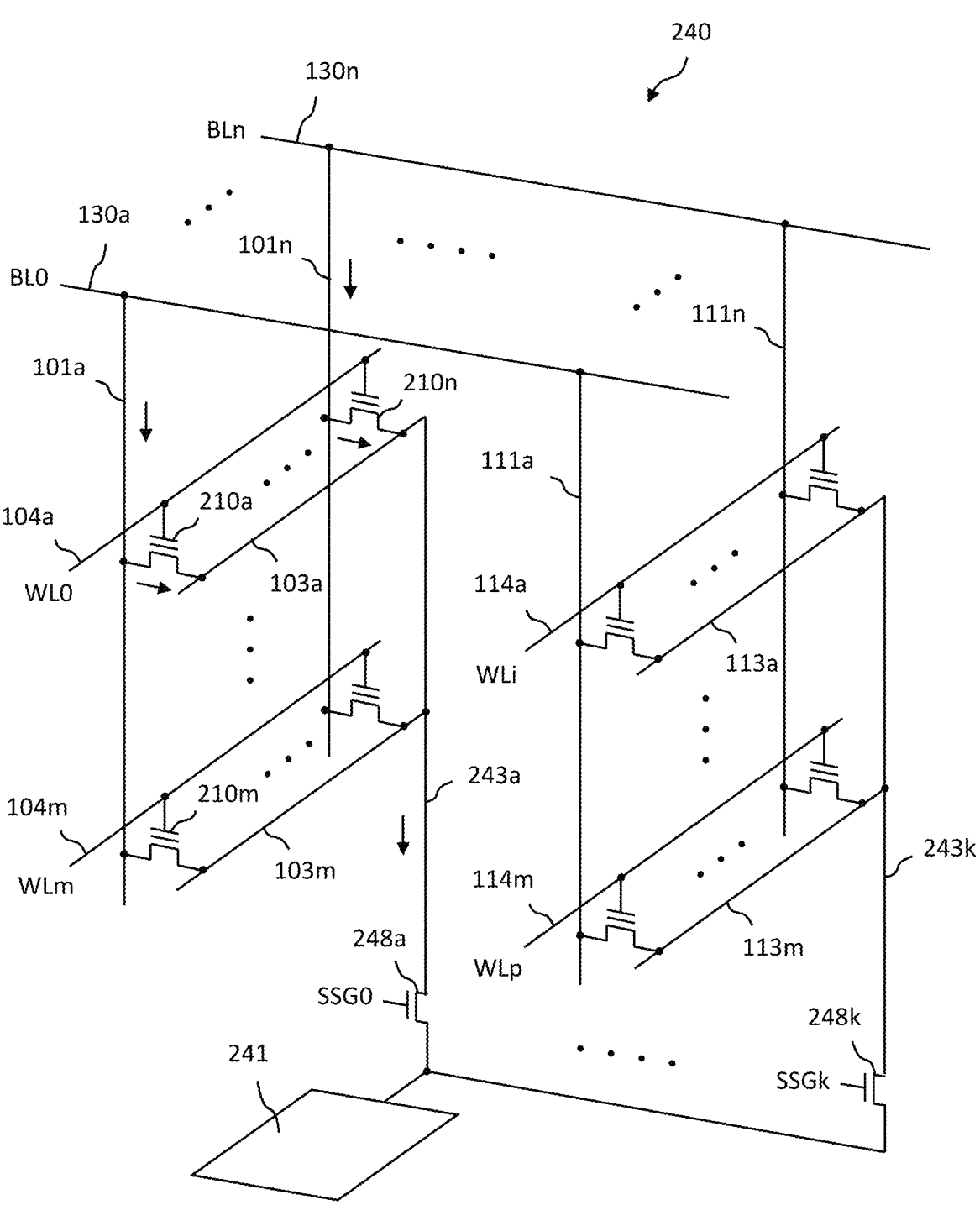
FIG. 23 shows an embodiment of a 3D array unit for in-memory-computing or neural networks according to the invention.

FIG. 23 shows an embodiment of a 3D array unit 240 for in-memory-computing or neural networks according to the invention. In this embodiment, the array structure shown in FIG. 10A is used. The word lines in the same level are not connected. For example, the word lines 104a-m and the word lines 114a-m are connected to word line different decoders.

The arrows show the signal flow of this embodiment during the operation. In one embodiment, the input data is applied to the bit lines 130a-n. Assuming the word line 104a is selected, the current flows through from the bit lines 130a-m through the vertical bit lines 101a-n and the cells 210a-n to the source lines 103a. The source line 103a are connected to the output circuit 241 through the common source line 243a and the source line select gate 248a to perform the in-memory-computing functions or the output neuron functions as shown in FIGS. 16A-D and FIGS. 17A-B.

Figure 24A:
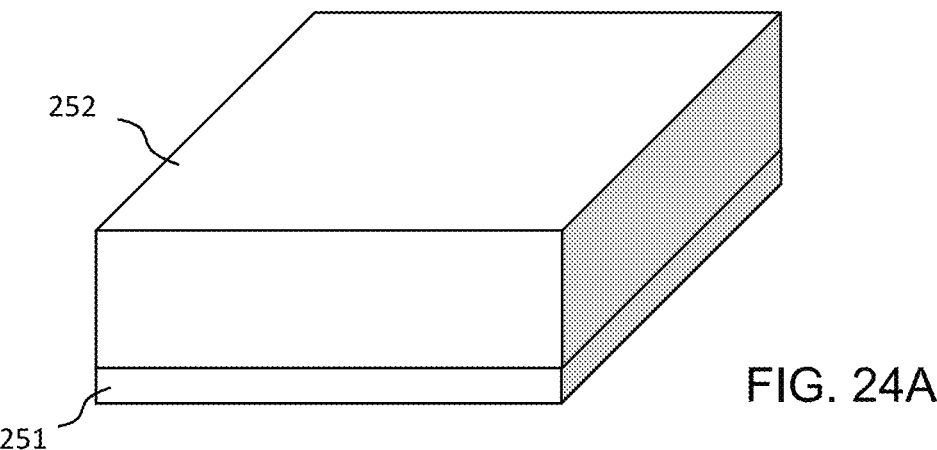
FIGS. 24A-C shows embodiments of a structure of a neural network chip according to the invention.
Figure 24B:
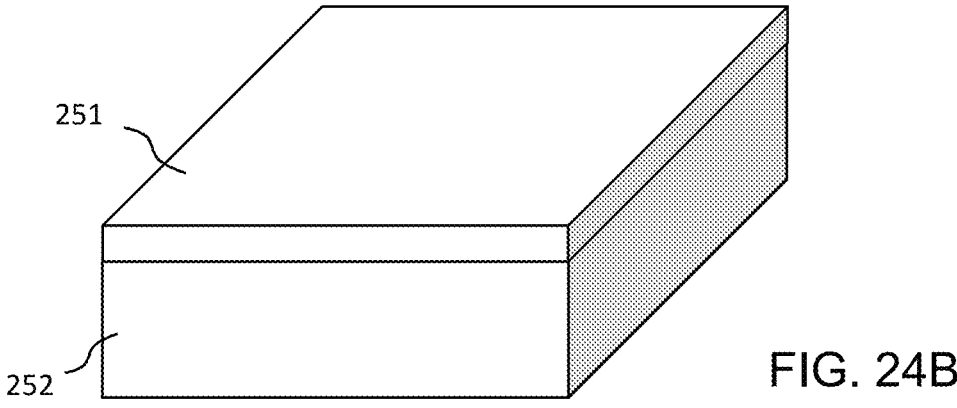
Figure 24C:
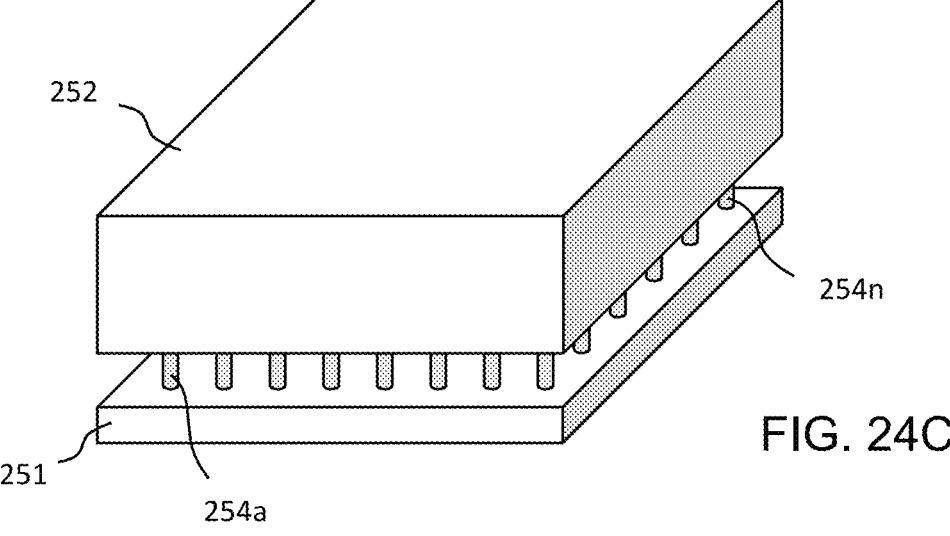

FIGS. 24A-C shows embodiments of a structure of a neural network chip according to the invention. In the embodiment shown in FIG. 24A, a computing unit 252 is located on top of a logic unit 251. This configuration reduces the die size to reduce the manufacturing cost and the footprint of the chip. The computing unit 252 and the logic unit 251 are formed in the same wafer, which is also known as a 'monolithic integrated chip (IC)'.

The structure shown in FIG. 24A can be formed by using any suitable 3D integration technologies. For example, in one embodiment, the structure is formed by forming the logic unit 251 on top of the substrate of a wafer, and then forming the computing unit 252 on top of the logic unit 251. In another embodiment shown in FIG. 24B, the logic unit 251 is located on top of the computing unit 252. For this embodiment, the computing unit 252 is formed on top of the substrate of the wafer first, and then the logic unit 251 is formed on top of the computing unit 252.

In another embodiment shown in FIG. 24C, the neural network chip structure is formed by using wafer-to-wafer bonding. Two wafers comprise the computing unit 252 and the logic unit 251 are placed on top of substrate wafers, respectively. The two wafers are then bonded face-to-face to connect the computing unit 252 and the logic unit 251 by using any suitable 3D wafer integration technologies, such as through-silicon via (TSV), micro-bump, and many others, as shown by indicators 254a to 254n.

Figure 25A:
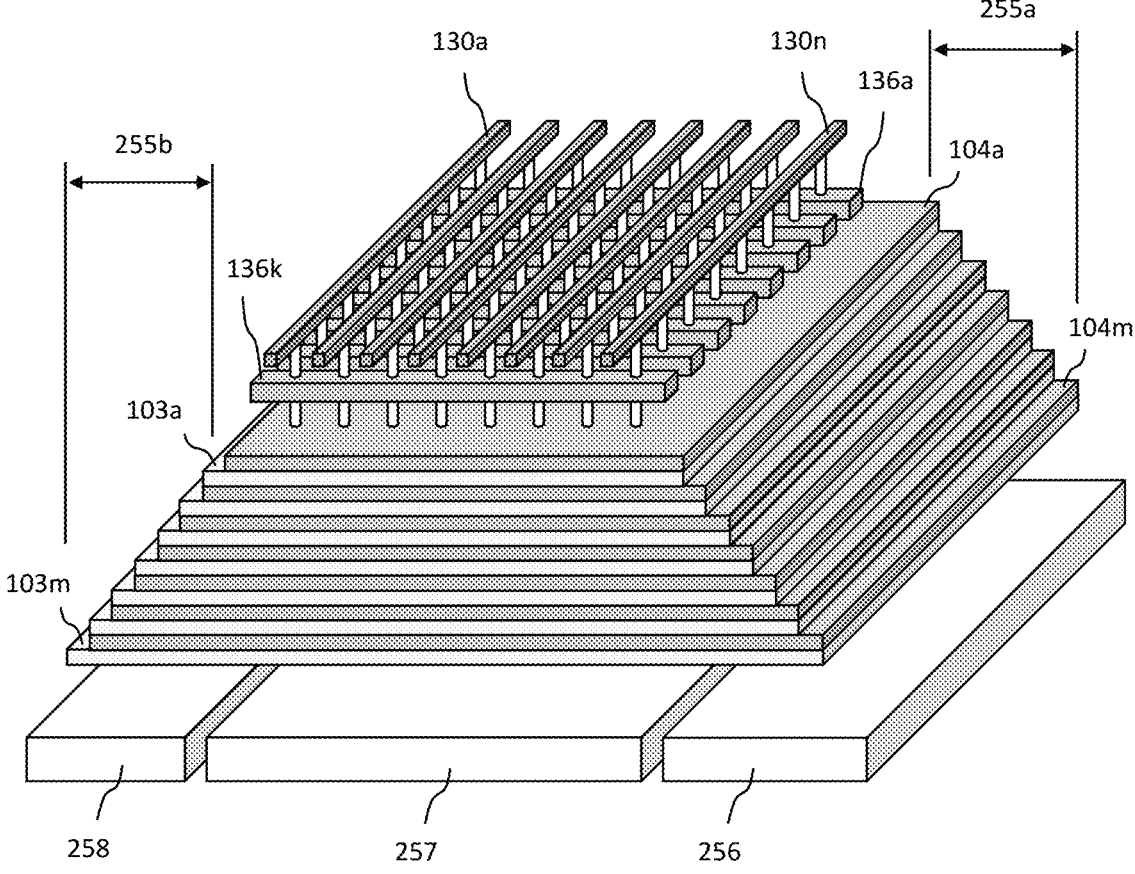
FIG. 25A shows an embodiment of a 3D array structure unit that implements the unit shown in FIG. 18B.

FIG. 25A shows an embodiment of a 3D array structure unit that implements the unit 240 shown in FIG. 18B. The 3D array structure comprises horizontal bit lines 130a to 130n and select gates lines 136a to 136k for the select gates 135a to 135k shown in FIG. 18B. Also shown are horizontal word line layers 104a to 104m and horizontal source line layers are 103a to 103m. A staircase structure 255a for the word line layers 104a to 104m and a staircase structure 255b for the source line layers 103a to 103m are formed at the edges of the array as shown.

The staircase structures 255a and 255b are formed by using a conventional pull-back etching process used in producing 3D NAND flash memory, or by using the process disclosed in U.S. patent application Ser. No. 18/492,625 entitled "3D Array Structures and Processes" and filed on Oct. 23, 2023 by the same inventor of this invention. The staircase structures 255a and 255b allow the word line layers 104a to 104m and the source line layers 103a to 103m to be connected to the word line circuits 256 and the source line circuits 258, respectively.

In one embodiment, the word line circuits 256, bit line circuits 257, and source line circuits 258 are located under the 3D array as shown to reduce the die size. In another embodiment, the word line circuits 256, bit line circuits 257, and source line circuits 258 are located on the edges of the array. Depending on the array architecture, the word line circuits 256 comprise the word line and select gate decoder 244 and input circuits 242a to 242i as shown in FIGS. 19A-20D. The bit line circuits 257 comprise a bit line decoder 245, output circuits 241a to 241j, and bit line drive circuit 236 as shown in FIGS. 19A-20D. The source line circuits 258 comprise the source line decoder 246 and output circuits 241a to 241j as shown in FIGS. 19A-20D.

Figure 25B:
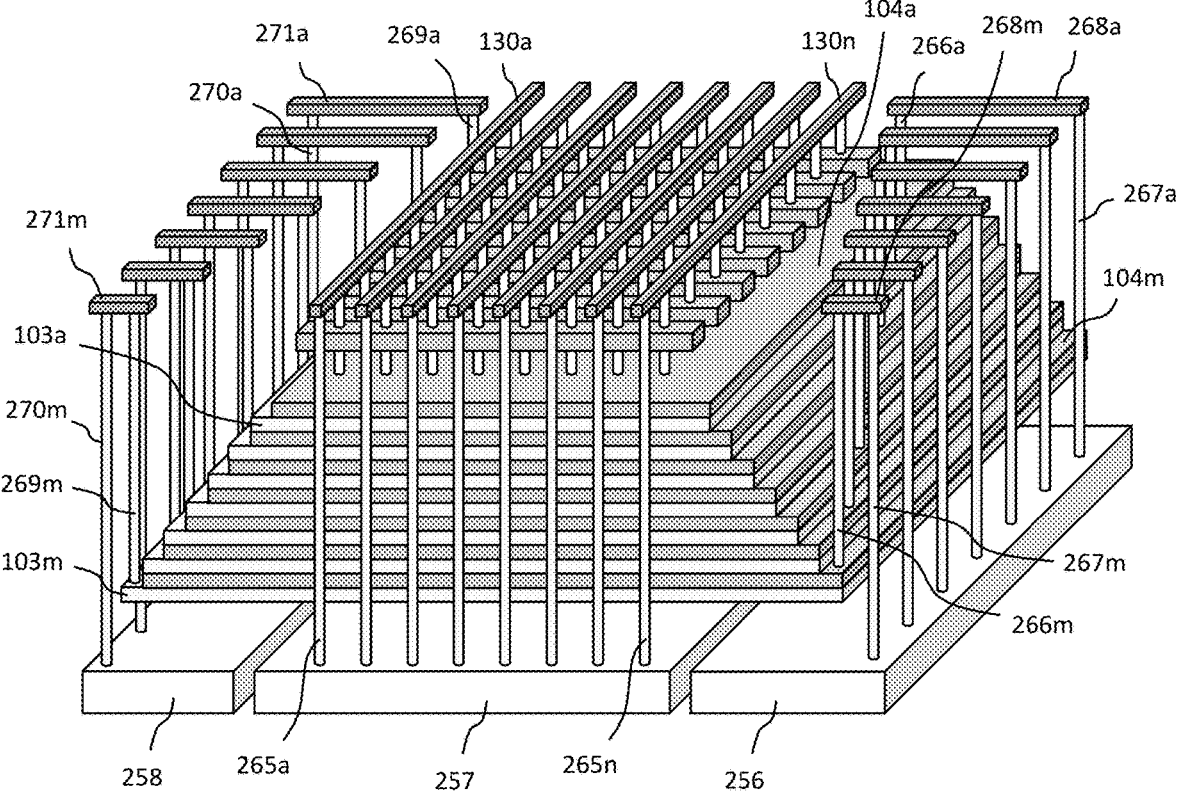
FIG. 25B shows an embodiment of connections to the bit lines, word line layers, and source line layers of the 3D array structure unit shown in FIG. 25A.

FIG. 25B shows an embodiment of connections to the bit lines 130a to 130n, word line layers 104a to 104m, and source line layers 103a to 103m of the 3D array structure unit shown in FIG. 25A. In this embodiment, the bit lines 130a to 130n are connected to the bit line circuits 257 by using contacts 265a to 265n. The contacts 265a to 265n are formed by using a high-aspect deep trench process to etch through a thick insulating layer, such as an oxide layer to form contact holes, and then filling the contact holes with metal, such as tungsten (W), titanium (Ti), and titanium nitride (TiN).

The word lines layers 104a to 104m are connected to the word line circuits 256 by using contacts, such as contacts 266a to 266m and contacts 267a to 267m and the metal lines 268a to 268m. The source line layers 103a to 103m are connected to the source line circuits 258 by using the contacts, such as contacts 269a to 269m and contacts 270a to 270m and the metal lines 271a to 271m. In one embodiment, the contacts 266a to 266m, 267a to 267m, 269a to 269m, and 270a to 270m are formed by using the same processes and materials used to form the previously described contacts 265a to 265n.

Figure 25C:
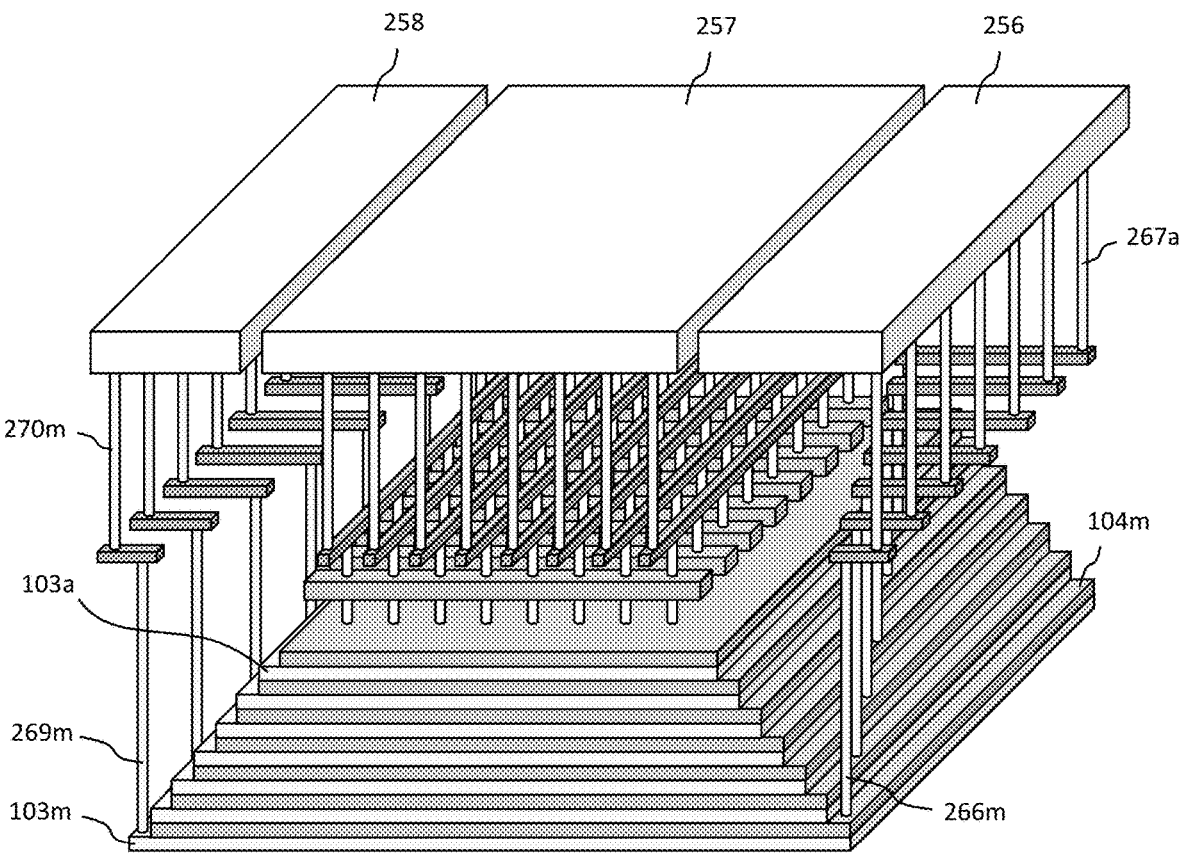
FIG. 25C shows an embodiment of connections to the bit lines, word line layers, and source line layers of the 3D array structure unit shown in FIG. 25A.

FIG. 25C shows another embodiment of connections to the bit lines 130a to 130n, word line layers 104a to 104m, and source line layers 103a to 103m of the 3D array structure unit shown in FIG. 25A. This embodiment is similar to the embodiment shown in FIG. 24B except that the word line circuits 256, bit line circuits 257, and source line circuits 258 are located on top of the 3D array.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A 3D memory array architecture, comprising:
   a plurality of memory units arranged as a stack, each memory unit comprising a memory cell array including one or more rows of memory cells, and wherein each memory cell is configured to store data that controls a cell current for that memory cell;
   row source lines connected to the rows of memory cells, respectively, wherein each row source line is connected to memory cells of a corresponding row, and wherein the row source lines are coupled to a common source line for each memory unit;
   a word line and select-gate decoder configured to activate selected memory cells in the memory cell arrays using word lines and select-gate lines;
   bit lines connected to the memory cell arrays, wherein, in each memory cell array, each bit line is connected to one memory cell in each of the one or more rows of memory cells within that memory cell array;
   a bit line decoder connected between external bit line circuits and the bit lines of the memory units, wherein the bit line decoder is configured to selectively couple bit line signals between the external bit line circuits and a selected set of the bit lines, and wherein the selective coupling is performed such that a total number of external bit line circuits can be less than a total number of bit lines;
   a source line decoder connected between the common source lines of the memory units and external source line circuits, wherein the source line decoder is configured to selectively couple common source line signals between a selected set of the common source lines and the external source line circuits, and wherein the selective coupling is performed such that a total number of external source line circuits can be less than a total number of common source lines;
   wherein the 3D memory array architecture has a configurable direction such that, in a first direction, signals flow from the external bit line circuits through the bit line decoder, the memory cell arrays, and the source line decoder to the external source line circuits, and in a second direction, signals flow from the external source line circuits through the source line decoder, the memory cell arrays, and the bit line decoder to the external bit line circuits; and wherein, during operation, the word line and select-gate decoder, the bit line decoder, and the source line decoder have multiple-select functions that select any number of memory units, bit lines, and source lines in any locations according to a selected task.

2. The 3D memory array architecture of claim 1, wherein the memory cells comprise one of floating body cells, flash memory cells, resistive random-access memory cells, ferroelectric random-access memory cells, magneto-resistive random-access memory cells, phase-change memory cells, and mem-transistor cells.

3. The 3D memory array architecture of claim 1, wherein the bit lines are grouped into bit line pairs and each input signal is converted into complementary input signals that are supplied to a corresponding bit line pair.

4. The 3D memory array architecture of claim 1, wherein the external bit line circuits function as input circuits in the first direction and function as output circuits in the second direction, and wherein the external source line circuits function as output circuits in the first direction and function as input circuits in the second direction.

5. The 3D memory array architecture of claim 1, wherein the 3D memory array architecture implements a neural network and wherein the memory cells are configured to implement synapses in the neural network.

6. The 3D memory array architecture of claim 5, wherein for each memory cell representing a synapse, an associated threshold voltage represents a synapse weight.

7. The 3D memory array architecture of claim 1, wherein the 3D memory array architecture is configured to perform in-memory computing functions by combining cell currents from selected memory cells to perform a summation function.

8. The 3D memory array architecture of claim 1, wherein the word line and select-gate decoder, the bit line decoder, and the source line decoder have multiple-select functions that select any number of memory units, bit lines, and source lines in any locations according to a desired task.

9. The 3D memory array architecture of claim 1, wherein, during operation, the word line and select-gate decoder selects multiple memory units and, for each selected memory unit, selects a word line and a select-gate line.

10. The 3D memory array architecture of claim 1, wherein each memory unit comprises a plurality of row source lines coupled to the common source line for the memory unit.

11. The 3D memory array architecture of claim 1, wherein, in the first direction, the bit line decoder selectively couples input signals from the external circuits to a selected set of the bit lines and the source line decoder selectively couples output signals from the selected set of the common source lines to the external source line circuits.

12. The 3D memory array architecture of claim 1, wherein the first direction corresponds to forward-propagation of the neural network and the second direction corresponds to back-propagation for training the neural network.

13. The 3D memory array architecture of claim 1, wherein the source line decoder is configured to selectively couple the selected set of the common source lines to the external source line circuits such that a total number of external source line circuits is less than a total number of common source lines.

14. The 3D memory array architecture of claim 1, wherein the bit line decoder is configured to selectively couple the selected set of the bit lines to the external bit line circuits such that a total number of external bit line circuits is less than a total number of bit lines.

15. A 3D memory array architecture, comprising:

a plurality of memory units arranged as a stack, each memory unit comprising a memory cell array including one or more rows of memory cells, and wherein each memory cell is configured to store data that controls a cell current for that memory cell;

row source lines connected to the rows of memory cells, respectively, wherein each row source line is connected to memory cells of a corresponding row, and wherein the row source lines are coupled to a common source line for each memory unit;

word lines connected to the rows of memory cells, respectively, wherein each word line is connected to all memory cells of a corresponding row of memory cells;

bit lines connected to the memory units, wherein, in each memory cell array, each bit line is connected to one memory cell in each of the one or more rows of memory cells within that memory cell array;

a word line and select-gate decoder configured to activate selected memory cells using the word lines and select-gate lines;

a bit line decoder connected between external bit line circuits and the bit lines of the memory units, wherein the bit line decoder is configured to selectively couple bit line signals between the external bit line circuits and a selected set of the bit lines, and wherein the selective coupling is performed such that a total number of external bit line circuits can be less than a total number of bit lines; and wherein, during operation, input signals applied to the word lines cause cell currents to flow through selected memory cells, and wherein, for a selected bit line, selected cell currents combine to form a bit line cell current that flows on the selected bit line and is coupled by the bit line decoder to the external bit line circuits;

wherein, during operation, the word line and select-gate decoder and the bit line decoder are configured to perform multiple-select operations that select any number of memory units, word lines, and bit lines in any locations according to a desired task.

16. The 3D memory array architecture of claim 15, wherein the memory cells comprise one of floating body cells, flash memory cells, resistive random-access memory cells, ferroelectric random-access memory cells, magneto-resistive random-access memory cells, phase-change memory cells, and mem-transistor cells.

17. The 3D memory array architecture of claim 15, wherein the word lines are grouped into word line pairs and each input signal is converted into complementary input signals (WL0+ and WL0−) that are supplied to a corresponding word line pair.

18. The 3D memory array architecture of claim 15, wherein the bit lines are connected to output circuits of the 3D cell structure and the word lines are connected to input circuits of the 3D cell structure.

19. The 3D memory array architecture of claim 15, wherein the 3D cell structure forms a neural network and wherein the memory cells are configured to act as synapses in the neural network, and wherein for each memory cell representing a synapse, an associated threshold voltage represents a synapse weight.

20. The 3D memory array architecture of claim 15, wherein the 3D memory array architecture is configured to perform in-memory computing functions by combining cell currents from selected memory cells to perform a summation function.

* * * * *